(12) United States Patent
Kondiles et al.

(10) Patent No.: US 11,182,385 B2
(45) Date of Patent: Nov. 23, 2021

(54) SORTING DATA FOR STORAGE IN A COMPUTING ENTITY

(71) Applicant: Ocient Inc., Chicago, IL (US)

(72) Inventors: George Kondiles, Chicago, IL (US); Jason Arnold, Chicago, IL (US)

(73) Assignee: Ocient Inc., Chicago, IL (US)

( * ) Notice: Subject to any disclaimer, the term of this patent is extended or adjusted under 35 U.S.C. 154(b) by 390 days.

(21) Appl. No.: 16/267,089

(22) Filed: Feb. 4, 2019

(65) Prior Publication Data

US 2020/0117424 A1  Apr. 16, 2020

Related U.S. Application Data

(60) Provisional application No. 62/745,787, filed on Oct. 15, 2018.

(51) Int. Cl.
*G06F 16/901* (2019.01)
*G06F 16/27* (2019.01)
(Continued)

(52) U.S. Cl.
CPC ...... *G06F 16/24542* (2019.01); *G06F 3/0604* (2013.01); *G06F 3/068* (2013.01); *G06F 3/0647* (2013.01); *G06F 7/24* (2013.01); *G06F 9/4406* (2013.01); *G06F 9/5016* (2013.01); *G06F 9/5027* (2013.01); *G06F 9/5061* (2013.01); *G06F 11/1004* (2013.01); *G06F 11/1044* (2013.01); *G06F 11/1076* (2013.01); *G06F 12/0893* (2013.01); *G06F 12/109* (2013.01); *G06F 16/1727* (2019.01);
(Continued)

(58) Field of Classification Search
None
See application file for complete search history.

(56) References Cited

U.S. PATENT DOCUMENTS 5,548,770 A   8/1996  Bridges
6,230,200 B1  5/2001  Forecast
(Continued)

OTHER PUBLICATIONS

A new high performance fabric for HPC, Michael Feldman, May 2016, Intersect360 Research.
(Continued)

*Primary Examiner* — Scott A. Waldron
(74) *Attorney, Agent, or Firm* — Garlick & Markison; Timothy D. Taylor

(57) ABSTRACT

A method includes receiving, by a first computing entity of a database system, data that is organized in rows and columns. The method further includes determining, by the first computing entity, one or more key columns from the columns based on a desired sort criteria for the data. The method further includes sorting, by the first computing entity, other columns of the columns based on the one or more key columns to produce sorted other columns. The method further includes sending, by the first computing entity, the one or more key columns to a second computing entity of the database system for storage in a first storage location associated with the second computing entity. The method further includes sending, by the first computing entity, the sorted other columns to the second computing entity for storage in a second storage location associated with the second computing entity.

22 Claims, 41 Drawing Sheets

(51) Int. Cl.

| | |
|---|---|
| *G06F 16/2453* | (2019.01) |
| *G06F 16/22* | (2019.01) |
| *G06F 16/2455* | (2019.01) |
| *G06F 9/4401* | (2018.01) |
| *G06F 9/50* | (2006.01) |
| *H04L 29/08* | (2006.01) |
| *G06F 3/06* | (2006.01) |
| *G06F 12/0893* | (2016.01) |
| *G06F 16/17* | (2019.01) |
| *G06F 11/10* | (2006.01) |
| *G06F 12/109* | (2016.01) |
| *G06F 16/23* | (2019.01) |
| *G06F 16/242* | (2019.01) |
| *H03M 7/30* | (2006.01) |
| *G06F 16/2457* | (2019.01) |
| *G06F 16/2458* | (2019.01) |
| *G06F 7/24* | (2006.01) |

(52) U.S. Cl.
CPC .......... *G06F 16/22* (2019.01); *G06F 16/2246* (2019.01); *G06F 16/2282* (2019.01); *G06F 16/2365* (2019.01); *G06F 16/244* (2019.01); *G06F 16/2445* (2019.01); *G06F 16/2453* (2019.01); *G06F 16/2458* (2019.01); *G06F 16/24553* (2019.01); *G06F 16/24573* (2019.01); *G06F 16/278* (2019.01); *G06F 16/901* (2019.01); *G06F 16/9017* (2019.01); *H03M 7/30* (2013.01); *H04L 67/10* (2013.01); *G06F 3/067* (2013.01); *G06F 2211/1011* (2013.01); *G06F 2212/608* (2013.01)

(56) References Cited

U.S. PATENT DOCUMENTS

| | | | |
|---|---|---|---|
| 6,633,772 | B2 | 10/2003 | Ford |
| 7,499,907 | B2 | 3/2009 | Brown |
| 7,908,242 | B1 | 3/2011 | Achanta |
| 2001/0051949 | A1 | 12/2001 | Carey |
| 2002/0032676 | A1 | 3/2002 | Reiner |
| 2004/0162853 | A1 | 8/2004 | Brodersen |
| 2007/0143261 | A1* | 6/2007 | Uppala .......... G06F 16/245 |
| 2008/0133456 | A1 | 6/2008 | Richards |
| 2009/0063893 | A1 | 3/2009 | Bagepalli |
| 2009/0183167 | A1 | 7/2009 | Kupferschmidt |
| 2010/0082577 | A1 | 4/2010 | Mirchandani |
| 2010/0241646 | A1 | 9/2010 | Friedman |
| 2010/0274983 | A1 | 10/2010 | Murphy |
| 2010/0312756 | A1 | 12/2010 | Zhang |
| 2011/0219169 | A1 | 9/2011 | Zhang |
| 2012/0109888 | A1 | 5/2012 | Zhang |
| 2012/0151118 | A1 | 6/2012 | Flynn |
| 2012/0185866 | A1 | 7/2012 | Couvee |
| 2012/0254252 | A1 | 10/2012 | Jin |
| 2012/0311246 | A1 | 12/2012 | Mcwilliams |
| 2013/0332484 | A1 | 12/2013 | Gajic |
| 2014/0047095 | A1 | 2/2014 | Breternitz |
| 2014/0136510 | A1 | 5/2014 | Parkkinen |
| 2014/0188841 | A1 | 7/2014 | Sun |
| 2015/0205607 | A1 | 7/2015 | Lindholm |
| 2015/0244804 | A1 | 8/2015 | Warfield |
| 2015/0248366 | A1 | 9/2015 | Bergsten |
| 2015/0293966 | A1 | 10/2015 | Cai |
| 2015/0310045 | A1 | 10/2015 | Konik |
| 2016/0034547 | A1 | 2/2016 | Lerios |

OTHER PUBLICATIONS

Alechina, N. (2006-2007). B-Trees. School of Computer Science, University of Nottingham, http://www.cs.nott.ac.uk/~psznza/G5BADS06/lecture13-print.pdf. 41 pages.

Amazon DynamoDB: ten things you really should know, Nov. 13, 2015, Chandan Patra, http://cloudacademy. .com/blog/amazon-dynamodb-ten-thing.

An Inside Look at Google BigQuery, by Kazunori Sato, Solutions Architect, Cloud Solutions team, Google Inc., 2012.

Big Table, a NoSQL massively parallel table, Paul Krzyzanowski, Nov. 2011, https://www.cs.rutgers.edu/pxk/417/notes/contentlbigtable. html.

Distributed Systems, Fall2012, Mohsen Taheriyan, http://www-scf.usc.edu/-csci57212011Spring/presentations/Taheriyan.pptx.

International Searching Authority; International Search Report and Written Opinion; International Application No. PCT/US2017/054773; dated Feb. 13, 2018; 17 pgs.

International Searching Authority; International Search Report and Written Opinion; International Application No. PCT/US2017/054784; dated Dec. 28, 2017; 10 pgs.

International Searching Authority; International Search Report and Written Opinion; International Application No. PCT/US2017/066145; dated Mar. 5, 2018; 13 pgs.

International Searching Authority; International Search Report and Written Opinion; International Application No. PCT/US2017/066169; dated Mar. 6, 2018; 15 pgs.

International Searching Authority; International Search Report and Written Opinion; International Application No. PCT/US2018/025729; dated Jun. 27, 2018; 9 pgs.

International Searching Authority; International Search Report and Written Opinion; International Application No. PCT/US2018/034859; dated Oct. 30, 2018; 8 pgs.

MapReduce: Simplied Data Processing on Large Clusters, OSDI 2004, Jeffrey Dean and Sanjay Ghemawat, Google, inc.

Rodero-Merino, L.; Storage of Structured Data: Big Table and HBase, New Trends In Distributed Systems, MSc Software and Systems, Distributed Systems Laboratory; Oct. 17, 2012; 24 pages.

Step 2: Examine the data model and implementation details, 2016, Amazon Web Services, Inc., http://docs.aws.amazon.com/amazondynamodb/latestldeveloperguide!Ti . . . .

\* cited by examiner database system 10 computing device 18 computing device 18 computing device 18 node 37 node 37 node 37

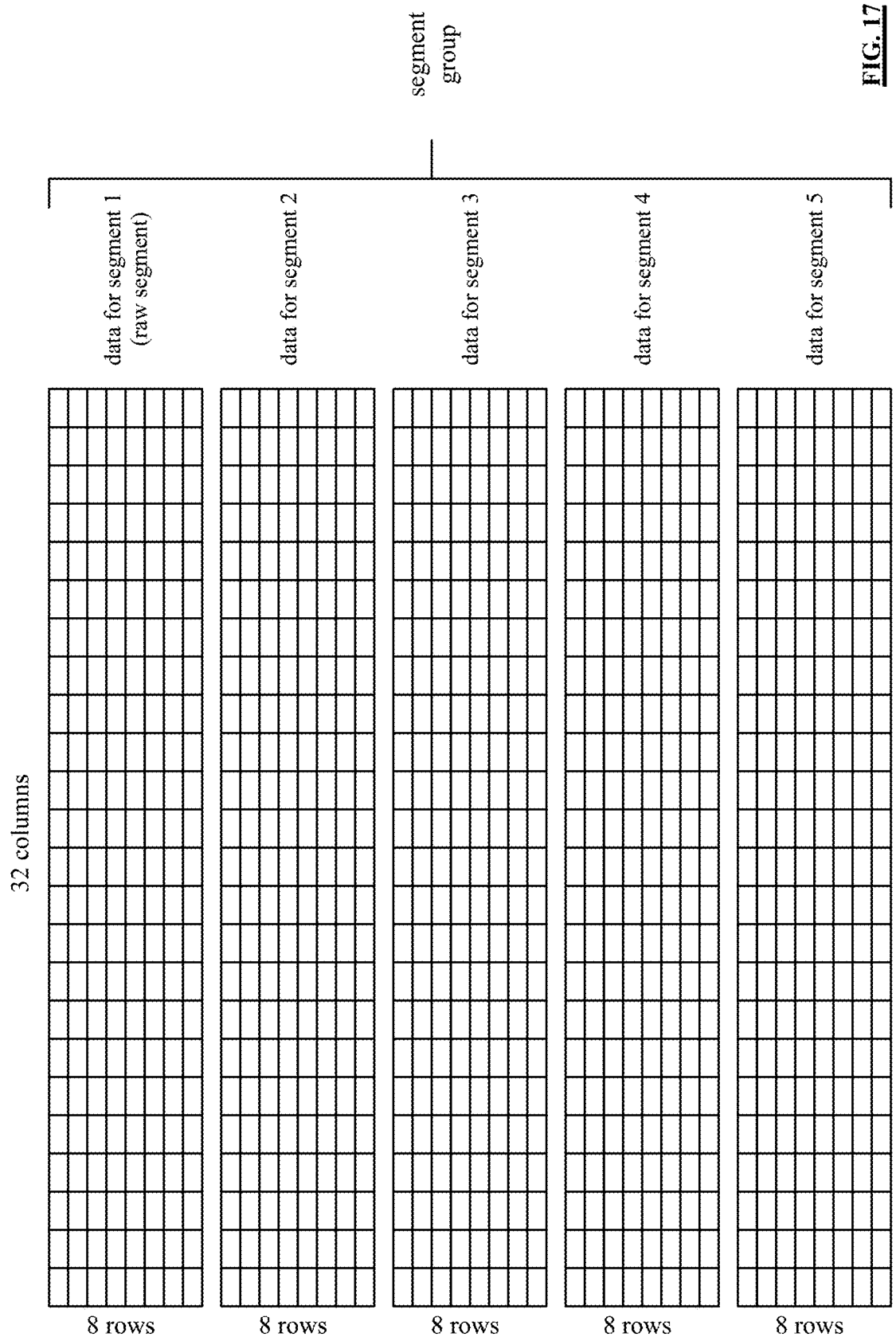

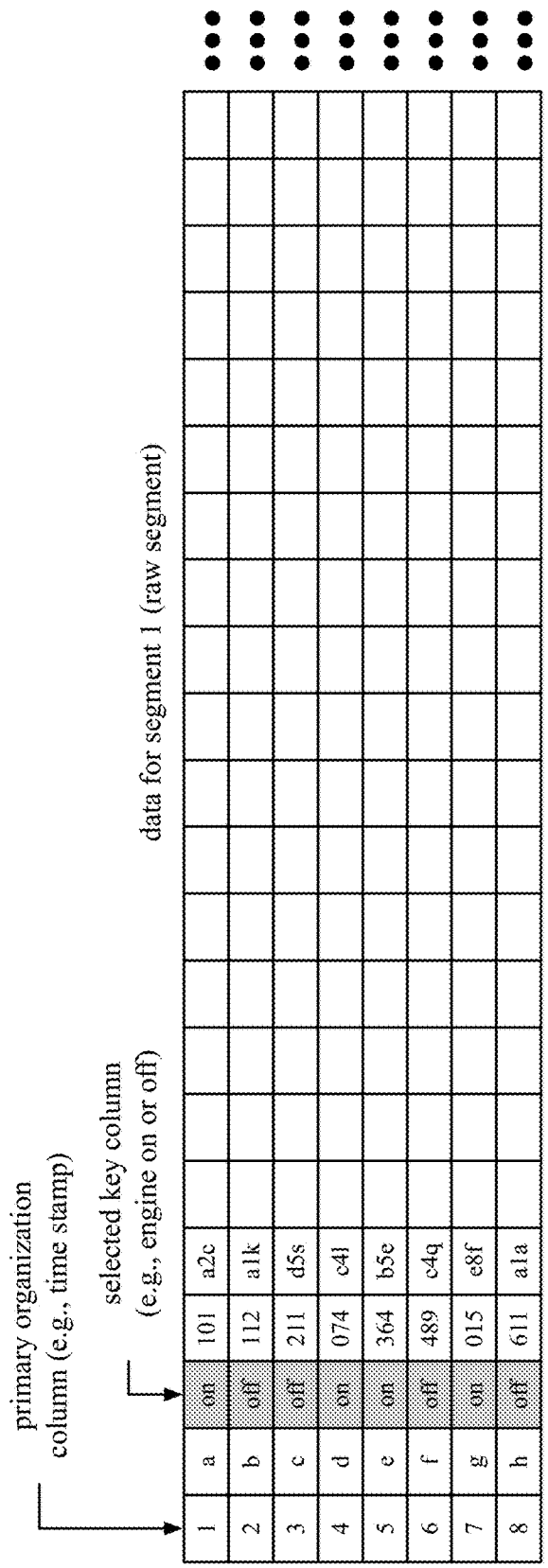

FIG. 21

FIG. 30 data 162 data 162 data 162 segment-row-column-block row-block column

| segment | idx | 0 | 1 | 2 |
|---|---|---|---|---|
| segment 1 | 0 | 1b1-00 | 1b1-01 | 1b1-02 |
| | 1 | 1d1-00 | 1d1-01 | 1d1-02 |
| | 2 | 1a1-00 | 1a1-01 | 1a1-02 |
| | 3 | 1c1-00 | 1c1-01 | 1c1-02 |
| segment 2 | 4 | 2f1-00 | 2f1-01 | 2f1-02 |
| | 5 | 2g1-00 | 2g1-01 | 2g1-02 |
| | 6 | 2e1-00 | 2e1-01 | 2e1-02 |
| | 7 | 2h1-00 | 2h1-01 | 2h1-02 |
| segment 3 | 8 | 3l1-00 | 3l1-01 | 3l1-02 |
| | 9 | 3k1-00 | 3k1-01 | 3k1-02 |
| | 10 | 3j1-00 | 3j1-01 | 3j1-02 |
| | 11 | 3i1-00 | 3i1-01 | 3i1-02 |
| segment 4 (parity) | 12 | P00(b-f-l) | P01(b-f-l) | P02(b-f-l) |
| | 13 | P00(d-g-j) | P01(d-g-j) | P02(d-g-j) |
| | 14 | P00(a-e-j) | P01(a-e-j) | P02(a-e-j) |
| | 15 | P00(c-h-i) | P01(c-h-i) | P02(c-h-i) |

FIG. 41 segment-row-column-block row-block column

| segment | idx | 0 | 1 | 2 |
|---|---|---|---|---|
| segment 1 | 12 | P00(b-f-l) | P01(b-f-l) | P02(b-f-l) |
| | 1 | 1d1-00 | 1d1-01 | 1d1-02 |
| | 2 | 1a1-00 | 1a1-01 | 1a1-02 |
| | 3 | 1c1-00 | 1c1-01 | 1c1-02 |
| segment 2 | 4 | 2f1-00 | 2f1-01 | 2f1-02 |
| | 13 | P00(d-g-j) | P01(d-g-j) | P02(d-g-j) |
| | 6 | 2e1-00 | 2e1-01 | 2e1-02 |
| | 7 | 2h1-00 | 2h1-01 | 2h1-02 |
| segment 3 | 8 | 3l1-00 | 3l1-01 | 3l1-02 |
| | 9 | 3k1-00 | 3k1-01 | 3k1-02 |
| | 14 | P00(a-e-j) | P01(a-e-j) | P02(a-e-j) |
| | 11 | 3i1-00 | 3i1-01 | 3i1-02 |
| segment 4 | 0 | 1b1-00 | 1b1-01 | 1b1-02 |
| | 5 | 2g1-00 | 2g1-01 | 2g1-02 |
| | 10 | 3j1-00 | 3j1-01 | 3j1-02 |
| | 15 | P00(c-h-i) | P01(c-h-i) | P02(c-h-i) |

FIG. 42

ID
SORTING DATA FOR STORAGE IN A COMPUTING ENTITY

CROSS-REFERENCE TO RELATED APPLICATIONS

The present U.S. Utility Patent Application claims priority pursuant to 35 U.S.C. § 119(e) to U.S. Provisional Application No. 62/745,787, entitled "DATABASE SYSTEM AND OPERATION," filed Oct. 15, 2018, which is hereby incorporated herein by reference in its entirety and made part of the present U.S. Utility Patent Application for all purposes.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to computer networking and more particularly to database system and operation.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function.

Of the many applications a computer can perform, a database system is one of the largest and most complex applications. In general, a database system stores a large amount of data in a particular way for subsequent processing. In some situations, the hardware of the computer is a limiting factor regarding the speed at which a database system can process a particular function. In some other instances, the way in which the data is stored is a limiting factor regarding the speed of execution. In yet some other instances, restricted co-process options are a limiting factor regarding the speed of execution.

BRIEF DESCRIPTION OF THE SEVERAL VIEWS OF THE DRAWING(S)

FIGS. 15-25 are schematic block diagrams of an example of processing a table or data set for storage in the database system in accordance with the present invention;

FIG. 30 is a schematic block diagram of an example of identifying a key column in accordance with the present invention;

FIG. 41 is a schematic block diagram of an example of creating parity data from sorting data blocks in accordance with the present invention;

FIG. 42 is a schematic block diagram of an example of reorganizing sorted data blocks and the parity data in accordance with the present invention;

DETAILED DESCRIPTION OF THE INVENTION

Figure 1:
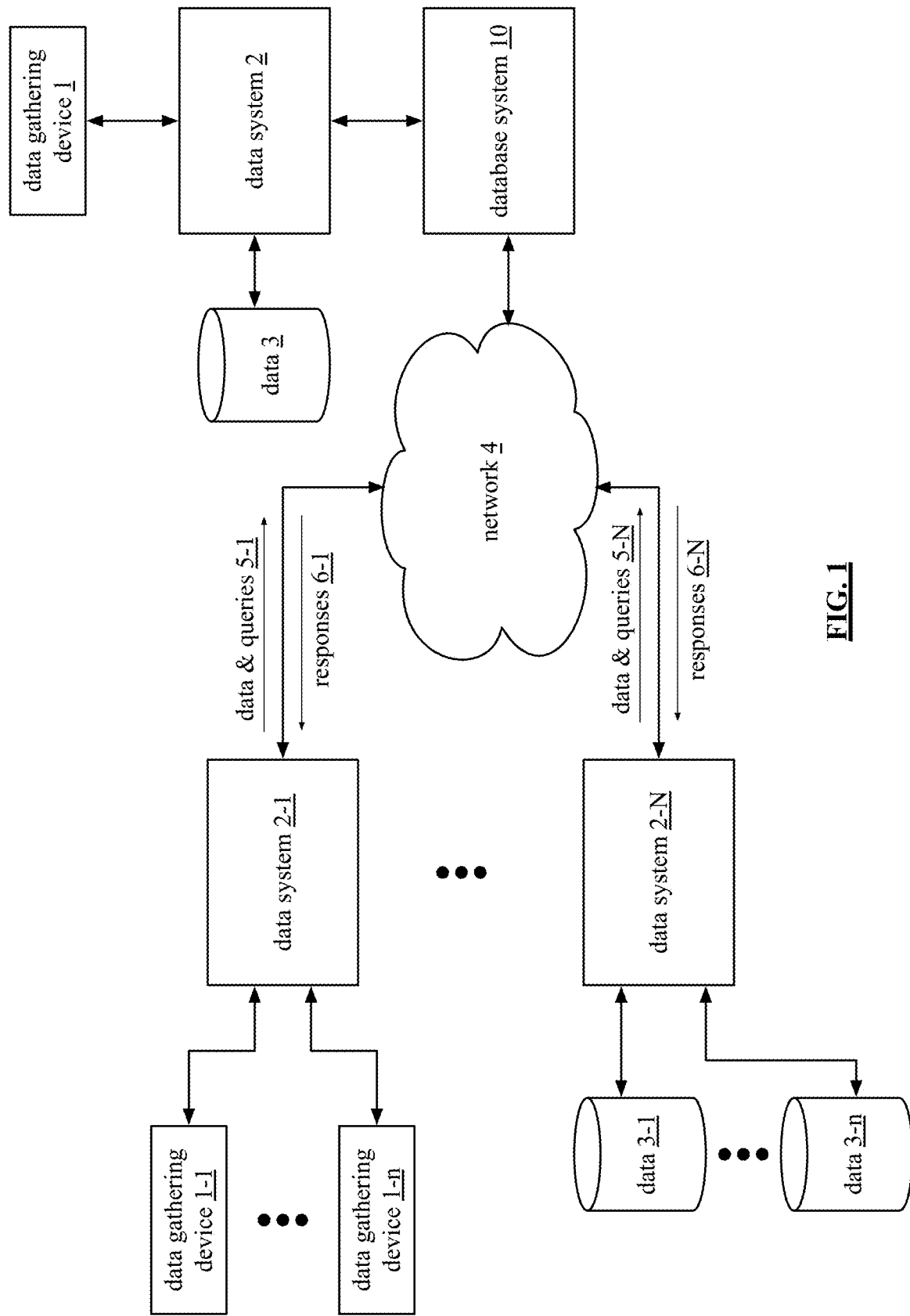
FIG. 1 is a schematic block diagram of an embodiment of a large scale data processing network that includes a database system in accordance with the present invention.

FIG. 1 is a schematic block diagram of an embodiment of a large-scale data processing network that includes data gathering device 1, data gathering devices 1-1 through 1-n, data system 2, data systems 2-1 through 2-N, data 3, data 3-1 through 3-n, a network 4, and a database system 10. The data systems 2-1 through 2-N provide, via the network 4, data and queries 5-1 through 5-N data to the database system 10. Alternatively, or in addition to, the data system 2 provides further data and queries directly to the database system 10. In response to the data and queries, the database system 10 issues, via the network 4, responses 6-1 through 6-N to the data systems 2-1 through 2-N. Alternatively, or in addition to, the database system 10 provides further responses directly to the data system 2. The data gathering devices 1, 1-1 through 1-n may be implemented utilizing sensors, monitors, handheld computing devices, etc. and/or a plurality of storage devices including hard drives, cloud storage, etc. The data gathering devices 1-1 through 1-n may provide real-time data to the data system 2-1 and/or any other data system and the data 3-1 through 3-n may provide stored data to the data system 2-N and/or any other data system.

Figure 1A:
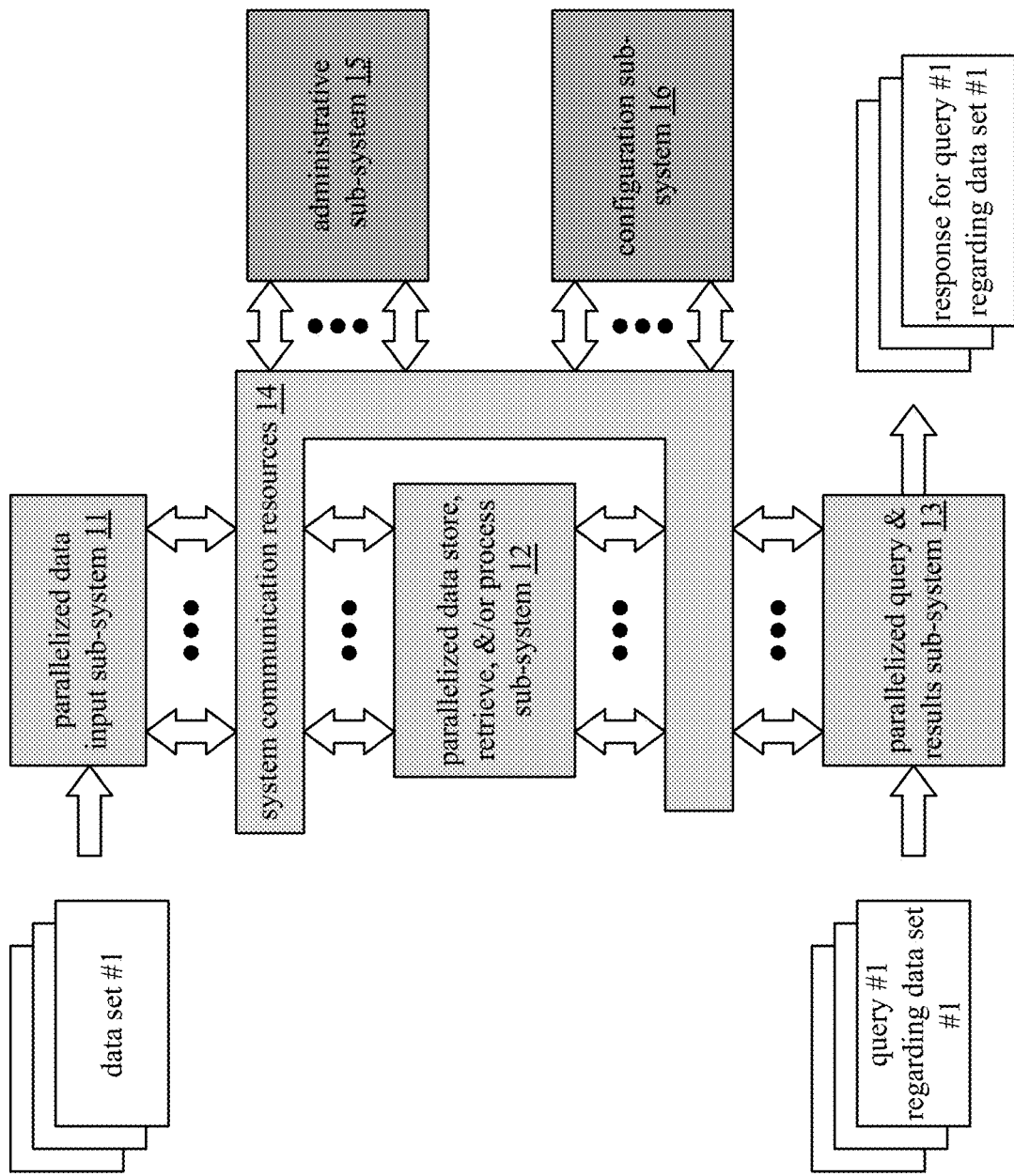
FIG. 1A is a schematic block diagram of an embodiment of a database system in accordance with the present invention.

FIG. 1A is a schematic block diagram of an embodiment of a database system 10 that includes data processing 7 and system administration 8. The data processing 7 includes a parallelized data input sub-system 11, a parallelized data store, retrieve, and/or process sub-system 12, a parallelized query and response sub-system 13, and system communication resources 14. The system administration 8 includes an administrative sub-system 15 and a configuration sub-system 16. The system communication resources 14 include one or more of wide area network (WAN) connections, local area network (LAN) connections, wireless connections, wireline connections, etc. to couple the sub-systems 11, 12, 13, 15, and 16 together. Each of the sub-systems 11, 12, 13, 15, and 16 include a plurality of computing devices; an example of which is discussed with reference to one or more of FIGS. 7-9.

In an example of operation, the parallelized data input sub-system 11 receives tables of data from a data source. For example, a data set no. 1 is received when the data source includes one or more computers. As another example, the data source is a plurality of machines. As yet another example, the data source is a plurality of data mining algorithms operating on one or more computers. The data source organizes its data into a table that includes rows and columns. The columns represent fields of data for the rows. Each row corresponds to a record of data. For example, a table include payroll information for a company's employees. Each row is an employee's payroll record. The columns include data fields for employee name, address, department, annual salary, tax deduction information, direct deposit information, etc.

The parallelized data input sub-system 11 processes a table to determine how to store it. For example, the parallelized data input sub-system 11 divides the data into a plurality of data partitions. For each data partition, the parallelized data input sub-system 11 determines a number of data segments based on a desired encoding scheme. As a specific example, when a 4 of 5 encoding scheme is used (meaning any 4 of 5 encoded data elements can be used to recover the data), the parallelized data input sub-system 11 divides a data partition into 5 segments. The parallelized data input sub-system 11 then divides a data segment into data slabs. Using one or more of the columns as a key, or keys, the parallelized data input sub-system 11 sorts the data slabs. The sorted data slabs are sent, via the system communication resources 14, to the parallelized data store, retrieve, and/or process sub-system 12 for storage.

The parallelized query and response sub-system 13 receives queries regarding tables and processes the queries prior to sending them to the parallelized data store, retrieve, and/or process sub-system 12 for processing. For example, the parallelized query and response sub-system 13 receives a specific query no. 1 regarding the data set no. 1 (e.g., a specific table). The query is in a standard query format such as Open Database Connectivity (ODBC), Java Database Connectivity (JDBC), and/or SPARK. The query is assigned to a node within the sub-system 13 for subsequent processing. The assigned node identifies the relevant table, determines where and how it is stored, and determines available nodes within the parallelized data store, retrieve, and/or process sub-system 12 for processing the query.

In addition, the assigned node parses the query to create an abstract syntax tree. As a specific example, the assigned node converts an SQL (Standard Query Language) statement into a database instruction set. The assigned node then validates the abstract syntax tree. If not valid, the assigned node generates a SQL exception, determines an appropriate correction, and repeats. When the abstract syntax tree is validated, the assigned node then creates an annotated abstract syntax tree. The annotated abstract syntax tree includes the verified abstract syntax tree plus annotations regarding column names, data type(s), data aggregation or not, correlation or not, sub-query or not, and so on.

The assigned node then creates an initial query plan from the annotated abstract syntax tree. The assigned node optimizes the initial query plan using a cost analysis function (e.g., processing time, processing resources, etc.). Once the query plan is optimized, it is sent, via the system communication resources 14, to the parallelized data store, retrieve, and/or process sub-system 12 for processing.

Within the parallelized data store, retrieve, and/or process sub-system 12, a computing device is designated as a primary device for the query plan and receives it. The primary device processes the query plan to identify nodes within the parallelized data store, retrieve, and/or process sub-system 12 for processing the query plan. The primary device then sends appropriate portions of the query plan to the identified nodes for execution. The primary device receives responses from the identified nodes and processes them in accordance with the query plan. The primary device provides the resulting response to the assigned node of the parallelized query and response sub-system 13. The assigned node determines whether further processing is needed on the resulting response (e.g., joining, filtering, etc.). If not, the assigned node outputs the resulting response as the response to the query (e.g., a response for query no. 1 regarding data set no. 1). If, however, further processing is determined, the assigned node further processes the resulting response to produce the response to the query.

Figure 2:
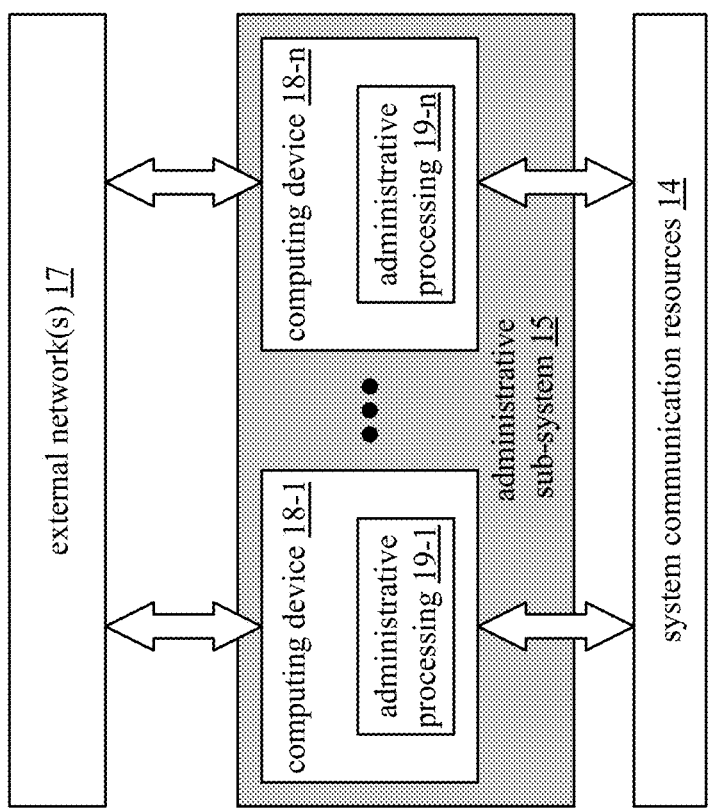
FIG. 2 is a schematic block diagram of an embodiment of an administrative sub-system in accordance with the present invention.

FIG. 2 is a schematic block diagram of an embodiment of the administrative sub-system 15 of FIG. 1A that includes one or more computing devices 18-1 through 18-n. Each of the computing devices executes an administrative processing function utilizing a corresponding administrative processing of administrative processing 19-1 through 19-n (which includes a plurality of administrative operations) that coordinates system level operations of the database system. Each computing device is coupled to an external network 17, or networks, and to the system communication resources 14 of FIG. 1A.

As will be described in greater detail with reference to one or more subsequent figures, a computing device includes a plurality of nodes and each node includes a plurality of processing core resources. Each processing core resource is capable of executing at least a portion of an administrative operation independently. This supports lock free and parallel execution of one or more administrative operations.

Figure 3:
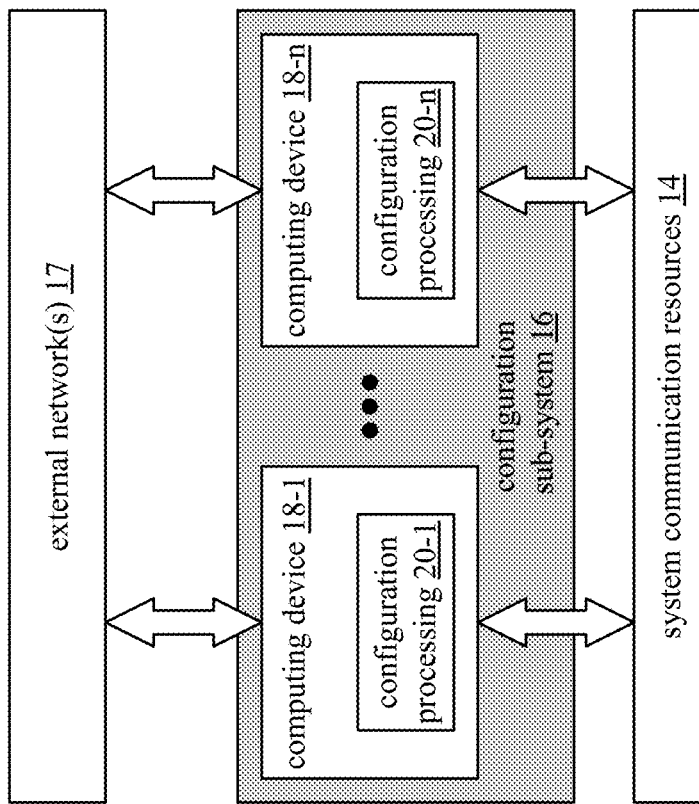
FIG. 3 is a schematic block diagram of an embodiment of a configuration sub-system in accordance with the present invention.

FIG. 3 is a schematic block diagram of an embodiment of the configuration sub-system 16 of FIG. 1A that includes one or more computing devices 18-1 through 18-n. Each of the computing devices executes a configuration processing function utilizing a corresponding configuration processing of configuration processing 20-1 through 20-n (which includes a plurality of configuration operations) that coordinates system level configurations of the database system. Each computing device is coupled to the external network 17 of FIG. 2, or networks, and to the system communication resources 14 of FIG. 1A.

As will be described in greater detail with reference to one or more subsequent figures, a computing device includes a plurality of nodes and each node includes a plurality of processing core resources. Each processing core resource is capable of executing at least a portion of a configuration operation independently. This supports lock free and parallel execution of one or more configuration operations.

Figure 4:
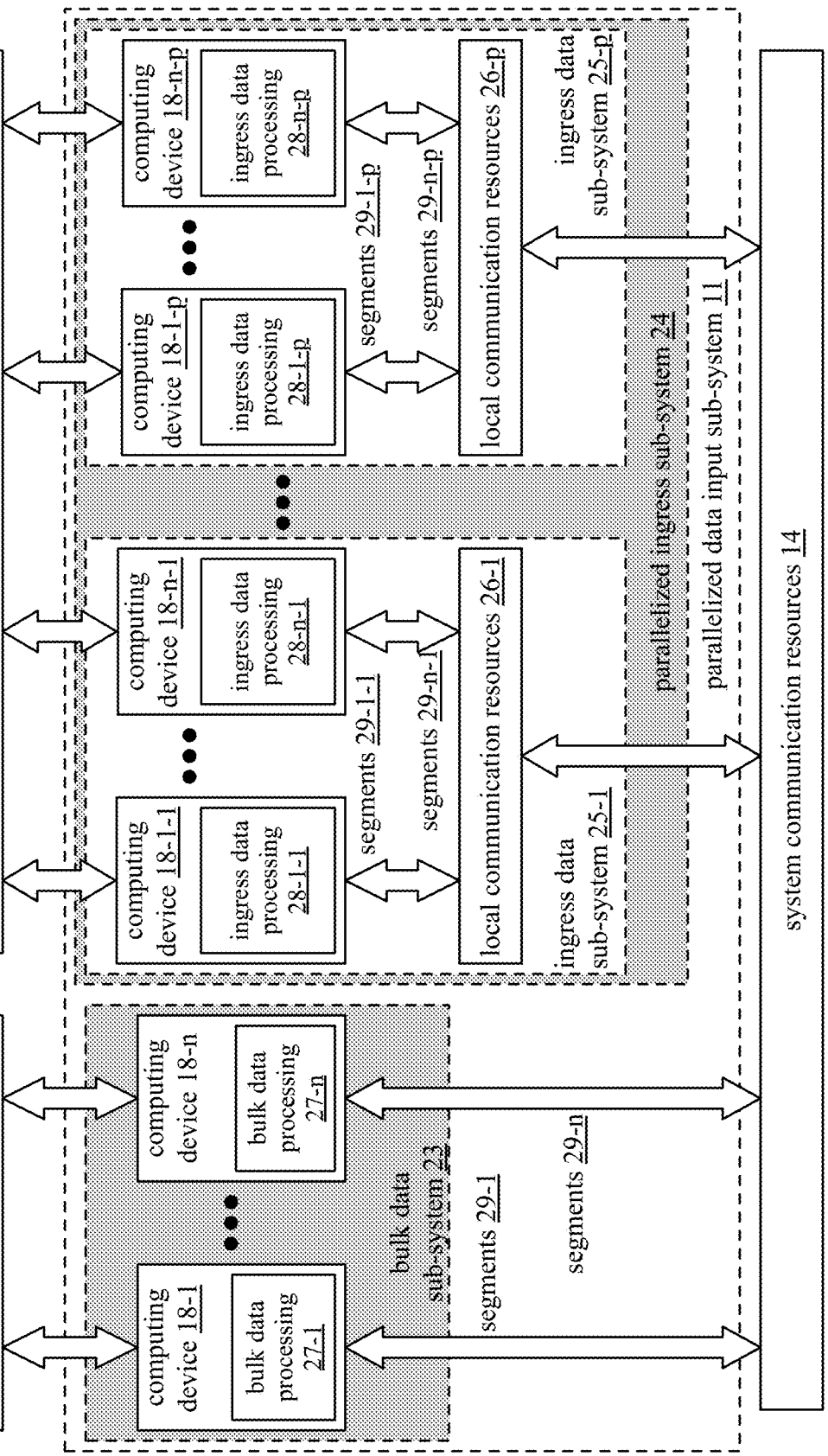
FIG. 4 is a schematic block diagram of an embodiment of a parallelized data input sub-system in accordance with the present invention.

FIG. 4 is a schematic block diagram of an embodiment of the parallelized data input sub-system 11 of FIG. 1A that includes a bulk data sub-system 23 and a parallelized ingress sub-system 24. The bulk data sub-system 23 includes a plurality of computing devices 18-1 through 18-n. The computing devices of the bulk data sub-system 23 execute a bulk data processing function to retrieve a table from a network storage system 21 (e.g., a server, a cloud storage service, etc.).

The parallelized ingress sub-system 24 includes a plurality of ingress data sub-systems 25-1 through 25-p that each include a local communication resource of local communication resources 26-1 through 26-p and a plurality of computing devices 18-1 through 18-n. Each of the computing devices of the parallelized ingress sub-system 24 execute an ingress data processing function utilizing an ingress data processing of ingress data processing 28-1 through 28-n of each ingress data sub-system 25-1 through 25-p that enables the computing device to stream data of a table (e.g., a data set 30-2 as segments 29-1-1 through 29-1-n and through 29-1-p through 29-n-p) into the database system 10 of FIG. 1A via a wide area network 22 (e.g., cellular network, Internet, telephone network, etc.). The streaming may further be via corresponding local communication resources 26-1 through 26-p and via the system communication resources 14 of FIG. 1A. With the plurality of ingress data sub-systems 25-1 through 25-p, data from a plurality of tables can be streamed into the database system 10 at one time (e.g., simultaneously utilizing two or more of the ingress data sub-systems 25-1 through 25-p in a parallel fashion).

Each of the bulk data processing function and the ingress data processing function generally function as described with reference to FIG. 1 for processing a table for storage. The bulk data processing function is geared towards retrieving data of a table in a bulk fashion (e.g., a data set 30-1 as the table is stored and retrieved, via the system communication resources 14 of FIG. 1A, from storage as segments 29-1 through 29-n). The ingress data processing function, however, is geared towards receiving streaming data from one or more data sources. For example, the ingress data processing function is geared towards receiving data from a plurality of machines in a factory in a periodic or continual manner as the machines create the data.

As will be described in greater detail with reference to one or more subsequent figures, a computing device includes a plurality of nodes and each node includes a plurality of processing core resources. Each processing core resource is capable of executing at least a portion of the bulk data processing function or the ingress data processing function. In an embodiment, a plurality of processing core resources of one or more nodes executes the bulk data processing function or the ingress data processing function to produce the storage format for the data of a table.

Figure 5:
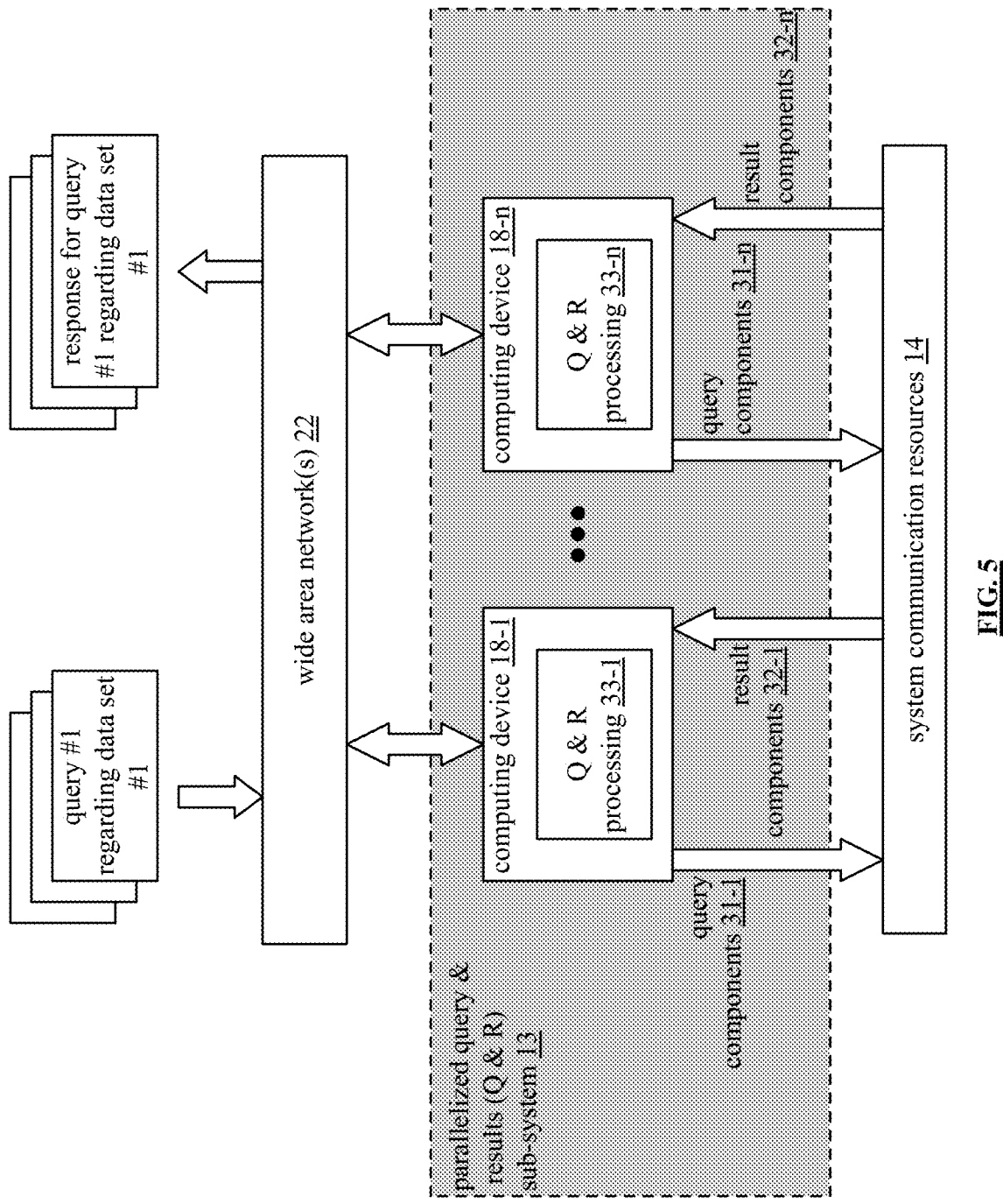
FIG. 5 is a schematic block diagram of an embodiment of a parallelized query and response (Q&R) sub-system in accordance with the present invention.

FIG. 5 is a schematic block diagram of an embodiment of a parallelized query and results sub-system 13 that includes a plurality of computing devices 18-1 through 18-n. Each of the computing devices executes a query (Q) & response (R) function utilizing a corresponding Q & R processing of Q & R processing 33-1 through 33-n. The computing devices are coupled to the wide area network 22 of FIG. 4 to receive queries (e.g., query no. 1 regarding data set no. 1) regarding tables and to provide responses to the queries (e.g., response for query no. 1 regarding the data set no. 1). For example, the plurality of computing devices 18-1 through 18-n receives a query, via the wide area network 22, issues, via the system communication resources 14 of FIG. 1A, query components 31-1 through 31-n to the parallelized data store, retrieve, &/or process sub-system 12 of FIG. 1A, receives, via the system communication resources 14, results components 32-1 through 32-*n*, and issues, via the wide area network 22, a response to the query.

The Q & R function enables the computing devices to processing queries and create responses as discussed with reference to FIG. 1. As will be described in greater detail with reference to one or more subsequent figures, a computing device includes a plurality of nodes and each node includes a plurality of processing core resources. Each processing core resource is capable of executing at least a portion of the Q & R function. In an embodiment, a plurality of processing core resources of one or more nodes executes the Q & R function to produce a response to a query.

Figure 6:
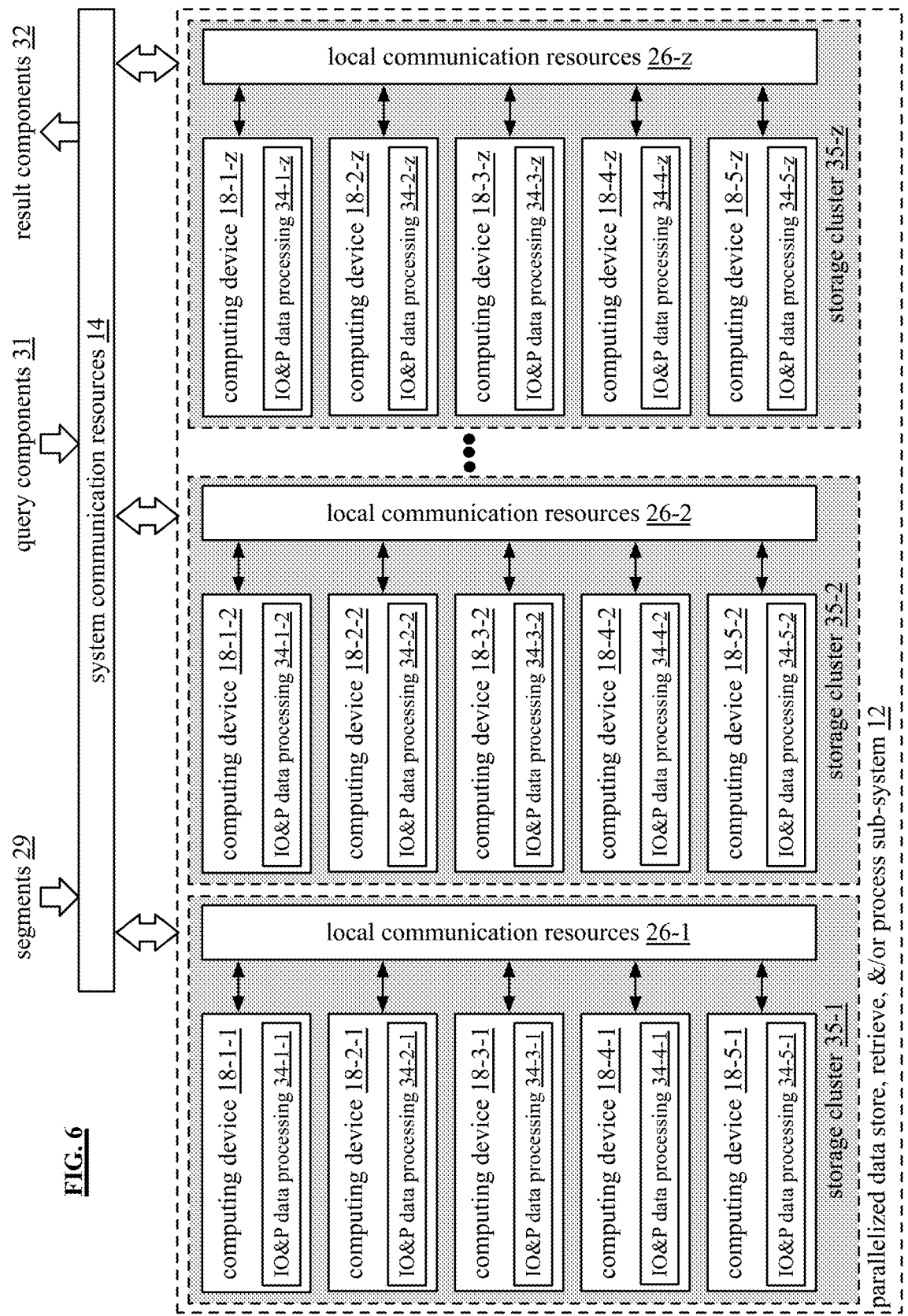
FIG. 6 is a schematic block diagram of an embodiment of a parallelized data store, retrieve, and/or process (IO& P) sub-system in accordance with the present invention.

FIG. 6 is a schematic block diagram of an embodiment of a parallelized data store, retrieve, and/or process sub-system 12 that includes a plurality of storage clusters 35-1 through 35-*z*. Each storage cluster includes a corresponding local communication resource of a plurality of local communication resources 26-1 through 26-*z* and includes a plurality of computing devices 18-1 through 18-5 and each computing device executes an input, output, and processing (IO &P) function utilizing a corresponding IO &P function of IO &P functions 34-1 through 34-5 to produce at least a portion of a resulting response. Each local communication resource may be implemented with a local communication resource of the local communication resources 26-1 through 26*p* of FIG. 4. The number of computing devices in a cluster corresponds to the number of segments in which a data partitioned is divided. For example, if a data partition is divided into five segments, a storage cluster includes five computing devices. Each computing device then stores one of the segments. As an example of operation, segments 29 are received, via the system communication resources 14 of FIG. 1A and via the local communication resources 26-1, for storage by computing device 18-4-1. Subsequent to storage, query components 31 (e.g., a query) are received, via the system communication resources 14 and the local communication resources 26-1, by the computing device 18-4-1 for processing by the IO & P data processing 34-4-1 to produce result components 32 (e.g., query response). The computing device 18-4-1 facilitates sending, via the local communication resources 26-1 and the system communication resources 14, the result components 32 to a result receiving entity.

As will be described in greater detail with reference to one or more subsequent figures, a computing device includes a plurality of nodes and each node includes a plurality of processing core resources. Each processing core resource is capable of executing at least a portion of the IO & P function. In an embodiment, a plurality of processing core resources of one or more nodes executes the IO & P function to produce at least a portion of the resulting response as discussed in FIG. 1.

Figure 7:
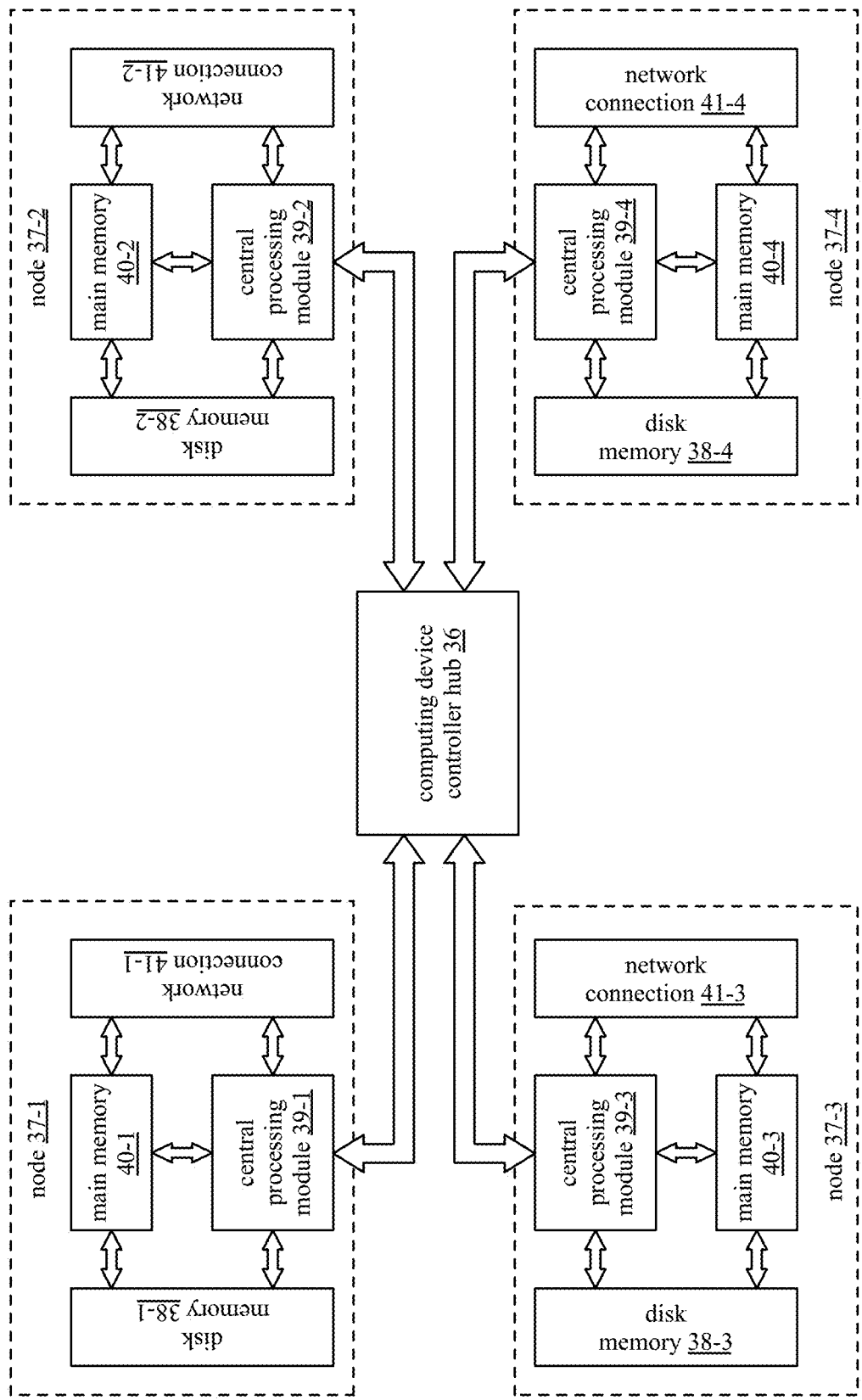
FIG. 7 is a schematic block diagram of an embodiment of a computing device in accordance with the present invention.

FIG. 7 is a schematic block diagram of an embodiment of a computing device 18 that includes a plurality of nodes 37-1 through 37-4 coupled to a computing device controller hub 36. The computing device controller hub 36 includes one or more of a chipset, a quick path interconnect (QPI), and an ultra path interconnection (UPI). Each node 37-1 through 37-4 includes a central processing module of central processing modules 40-1 through 40-4, a main memory of main memories 39-1 through 39-4, a disk memory of disk memories 38-1 through 38-4, and a network connection of network connections 41-1 through 41-4. In an alternate configuration, the nodes share a network connection, which is coupled to the computing device controller hub 36 or to one of the nodes as illustrated in subsequent figures.

In an embodiment, each node is capable of operating independently of the other nodes. This allows for large scale parallel operation of a query request, which significantly reduces processing time for such queries. In another embodiment, one or more node function as co-processors to share processing requirements of a particular function, or functions.

Figure 8:
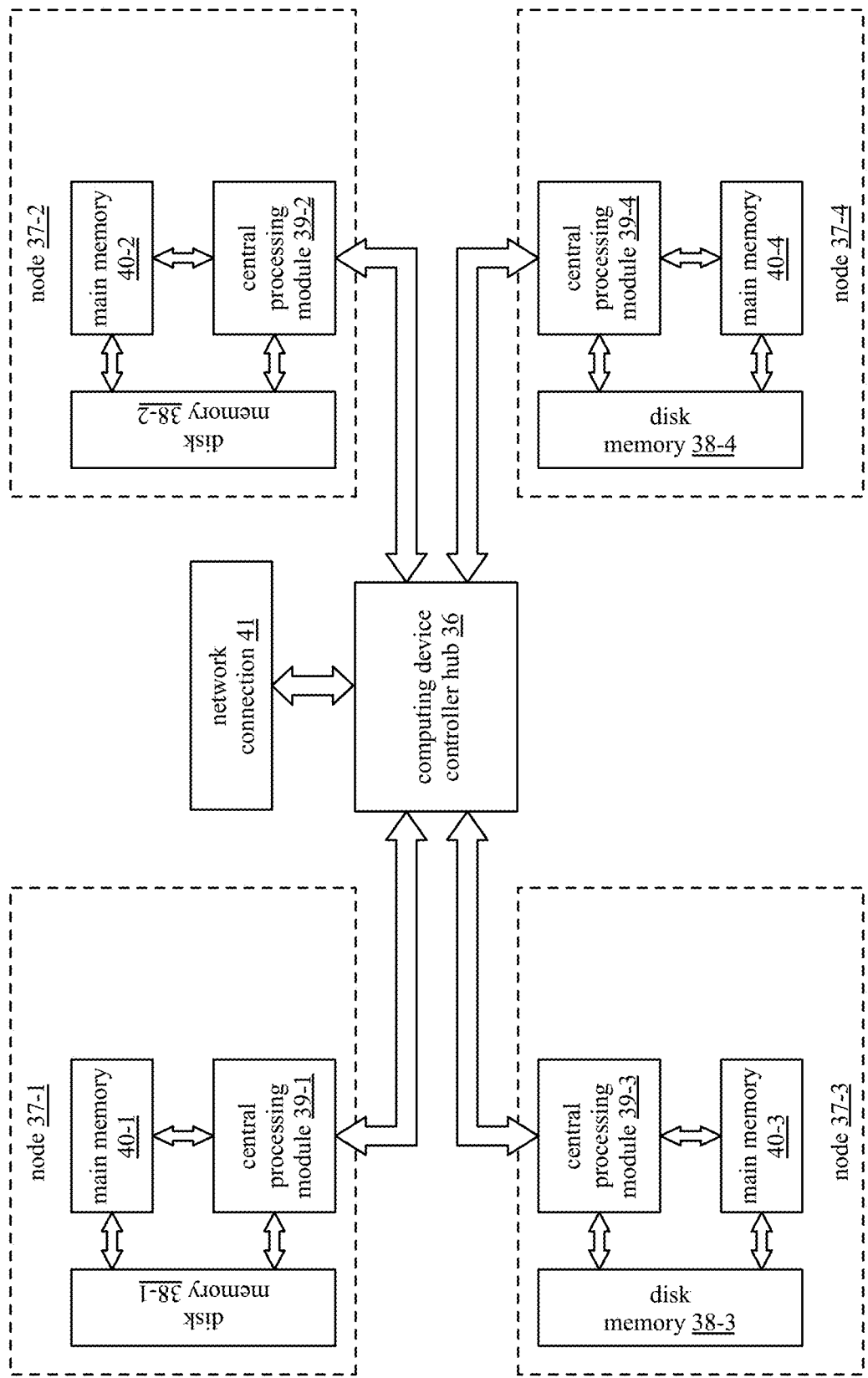
FIG. 8 is a schematic block diagram of another embodiment of a computing device in accordance with the present invention.

FIG. 8 is a schematic block diagram of another embodiment of a computing device is similar to the computing device of FIG. 7 with an exception that it includes a single network connection 41, which is coupled to the computing device controller hub 36. As such, each node coordinates with the computing device controller hub to transmit or receive data via the network connection.

Figure 9:
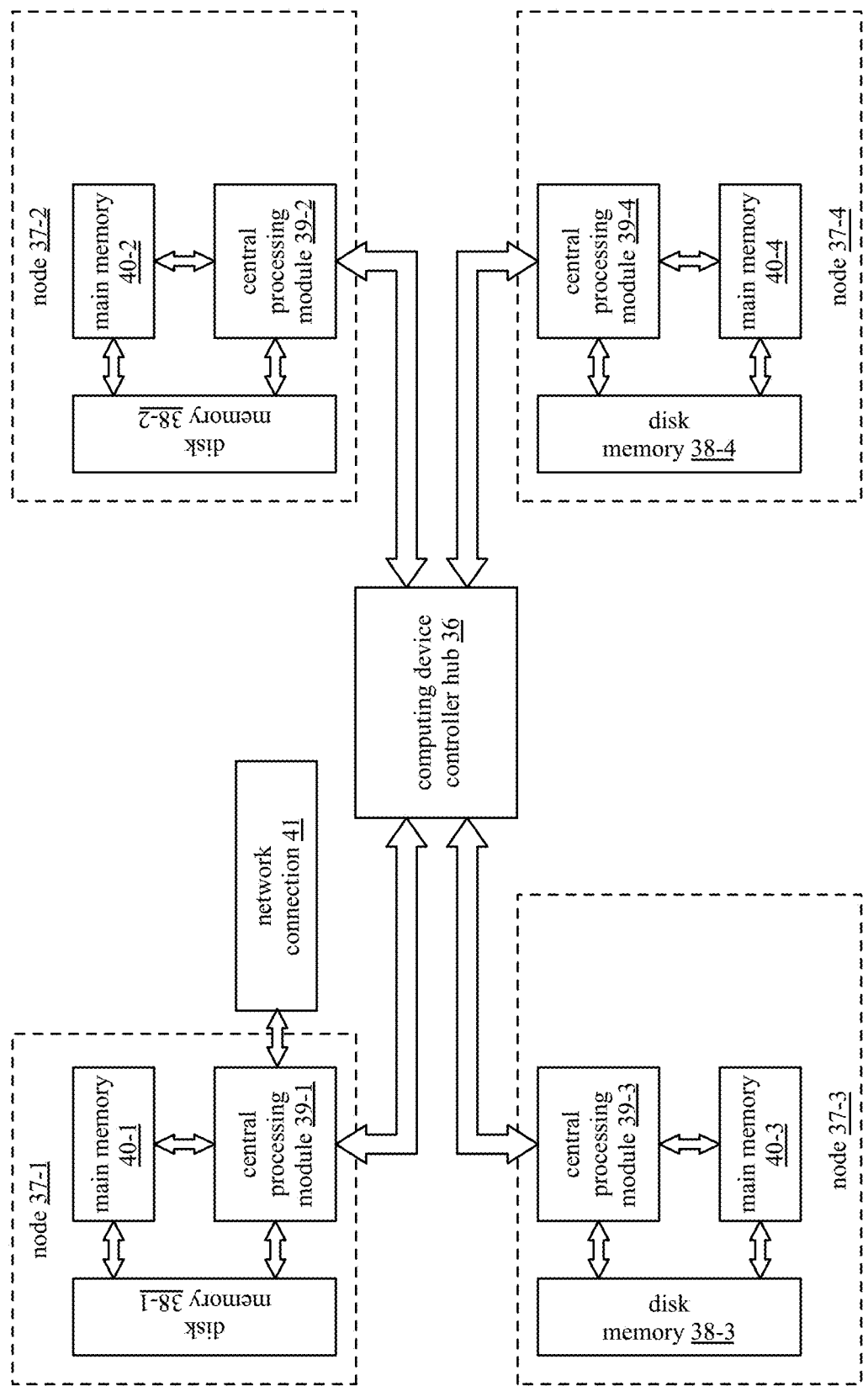
FIG. 9 is a schematic block diagram of another embodiment of a computing device in accordance with the present invention.

FIG. 9 is a schematic block diagram of another embodiment of a computing device is similar to the computing device of FIG. 7 with an exception that it includes a single network connection 41, which is coupled to a central processing module of a node (e.g., to central processing module 40-1 of node 37-1). As such, each node coordinates with the central processing module via the computing device controller hub 36 to transmit or receive data via the network connection.

Figure 10:
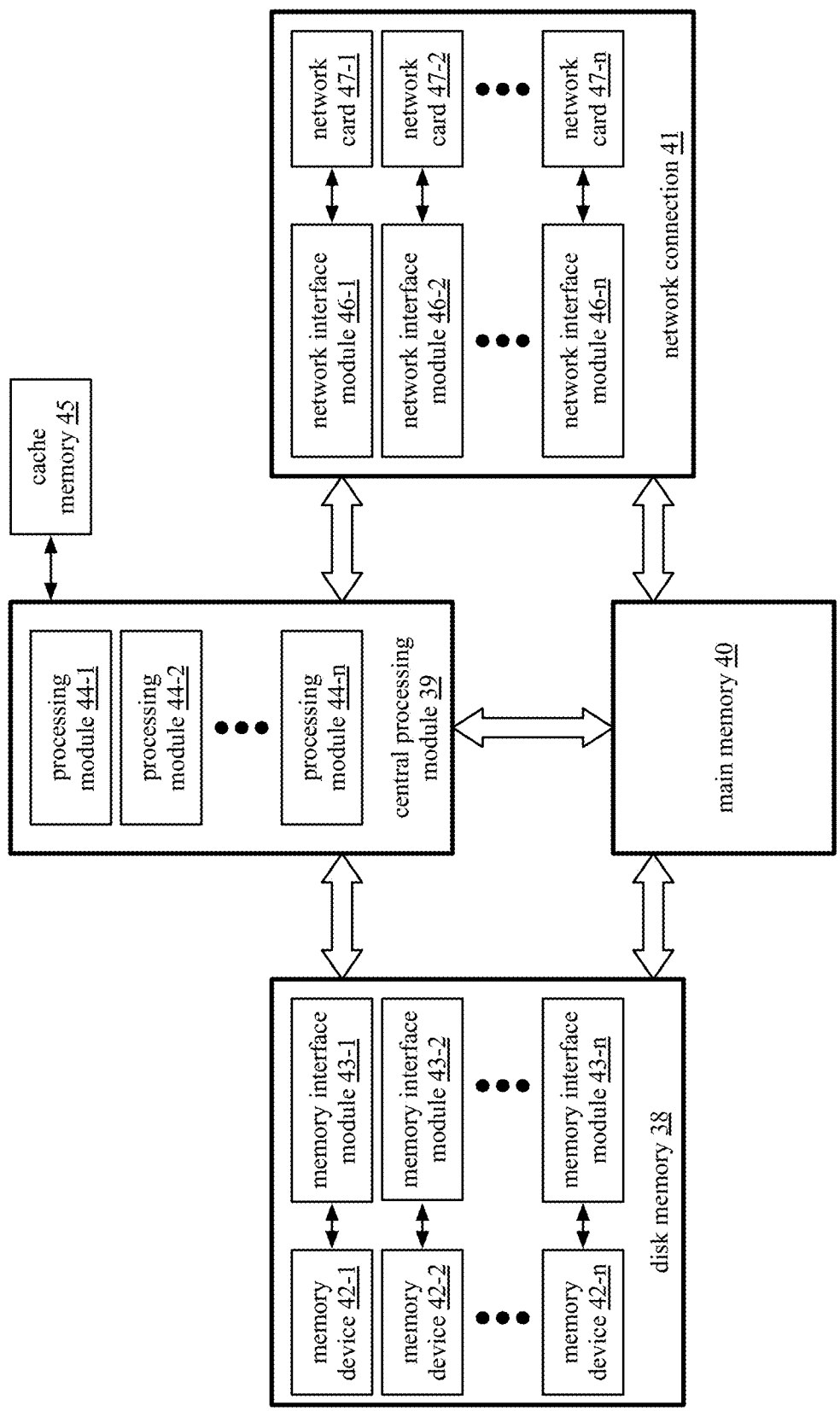
FIG. 10 is a schematic block diagram of an embodiment of a node of a computing device in accordance with the present invention.

FIG. 10 is a schematic block diagram of an embodiment of a node 37 of computing device 18. The node 37 includes the central processing module 39, the main memory 40, the disk memory 38, and the network connection 41. The main memory 40 includes read only memory (RAM) and/or other form of volatile memory for storage of data and/or operational instructions of applications and/or of the operating system. The central processing module 39 includes a plurality of processing modules 44-1 through 44-*n* and an associated one or more cache memory 45. A processing module is as defined at the end of the detailed description.

The disk memory 38 includes a plurality of memory interface modules 43-1 through 43-*n* and a plurality of memory devices 42-1 through 42-*n*. The memory devices 42-1 through 42-*n* include, but are not limited to, solid state memory, disk drive memory, cloud storage memory, and other non-volatile memory. For each type of memory device, a different memory interface module 43-1 through 43-*n* is used. For example, solid state memory uses a standard, or serial, ATA (SATA), variation, or extension thereof, as its memory interface. As another example, disk drive memory devices use a small computer system interface (SCSI), variation, or extension thereof, as its memory interface.

In an embodiment, the disk memory 38 includes a plurality of solid state memory devices and corresponding memory interface modules. In another embodiment, the disk memory 38 includes a plurality of solid state memory devices, a plurality of disk memories, and corresponding memory interface modules.

The network connection 41 includes a plurality of network interface modules 46-1 through 46-*n* and a plurality of network cards 47-1 through 47-*n*. A network card includes a wireless LAN (WLAN) device (e.g., an IEEE 802.11n or another protocol), a LAN device (e.g., Ethernet), a cellular device (e.g., CDMA), etc. The corresponding network interface modules 46-1 through 46-*n* include a software driver for the corresponding network card and a physical connection that couples the network card to the central processing module 39 or other component(s) of the node.

The connections between the central processing module 39, the main memory 40, the disk memory 38, and the network connection 41 may be implemented in a variety of ways. For example, the connections are made through a node controller (e.g., a local version of the computing device controller hub 36). As another example, the connections are made through the computing device controller hub 36.

Figure 11:
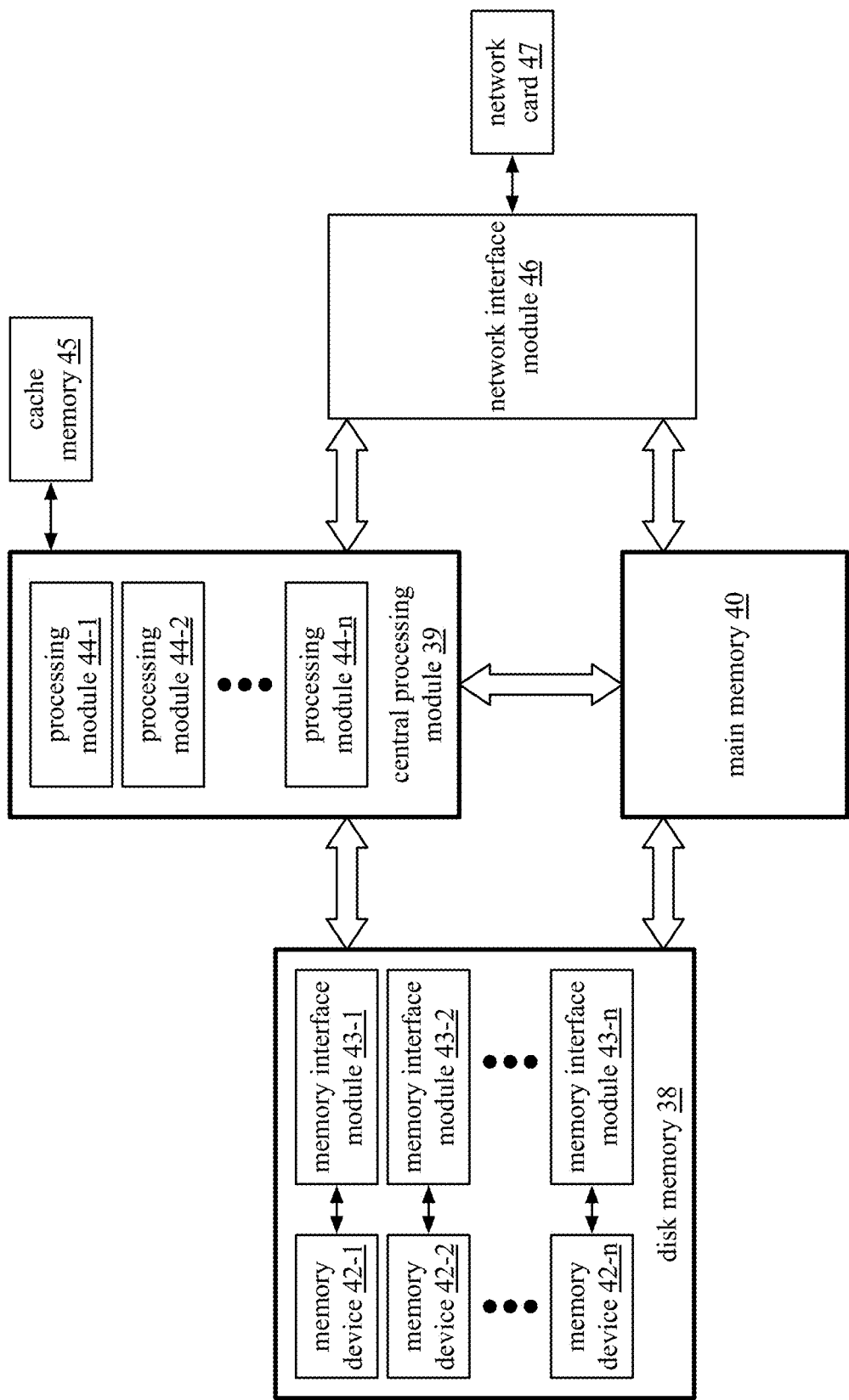
FIG. 11 is a schematic block diagram of an embodiment of a node of a computing device in accordance with the present invention.

FIG. 11 is a schematic block diagram of an embodiment of a node 37 of a computing device 18 that is similar to the node of FIG. 10, with a difference in the network connection. In this embodiment, the node 37 includes a single network interface module 46 and a corresponding network card 47 configuration.

Figure 12:
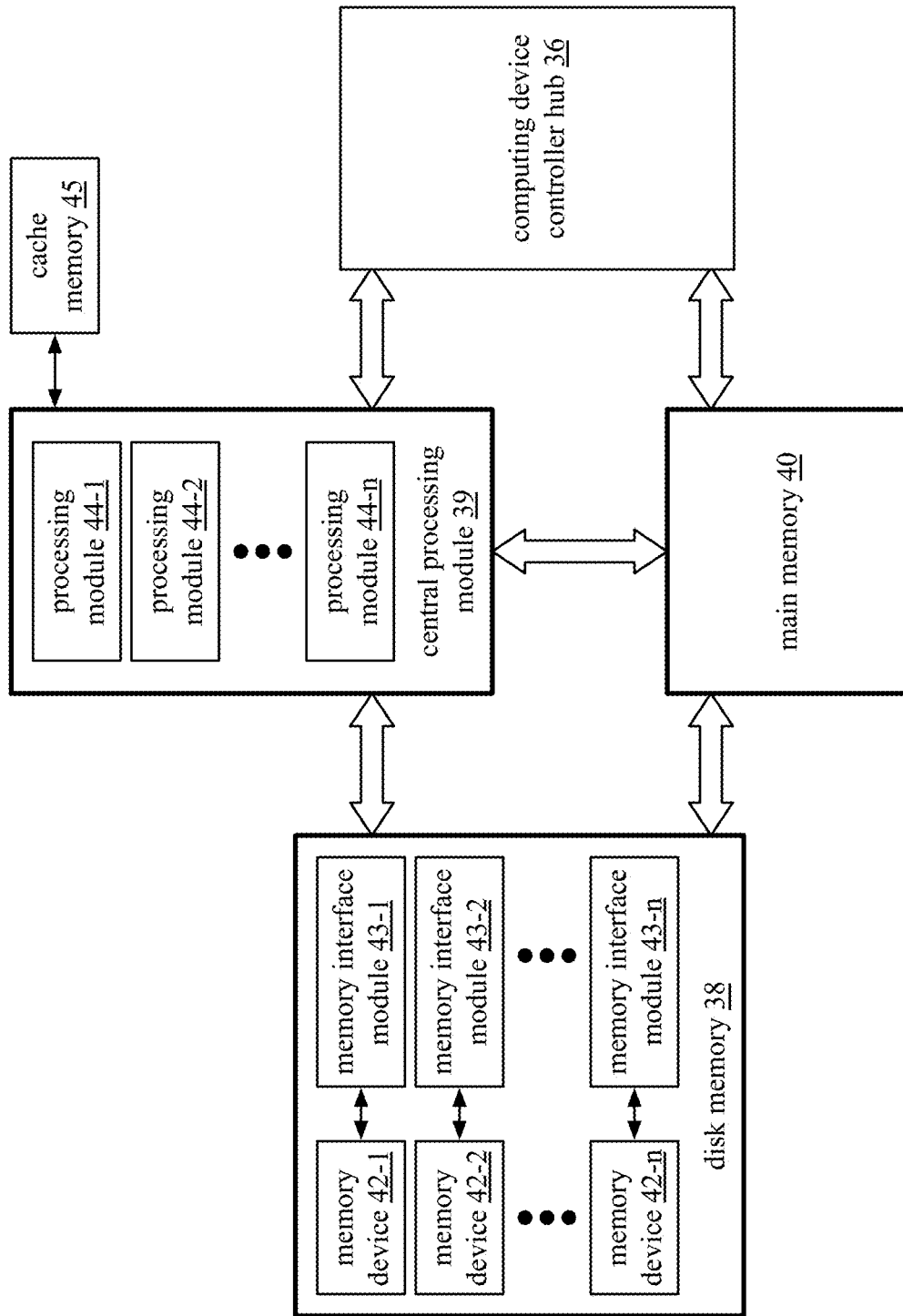
FIG. 12 is a schematic block diagram of an embodiment of a node of a computing device in accordance with the present invention.

FIG. 12 is a schematic block diagram of an embodiment of a node 37 of a computing device 18 that is similar to the node of FIG. 10, with a difference in the network connection. In this embodiment, the node 37 connects to a network connection via the computing device controller hub 36.

Figure 13:
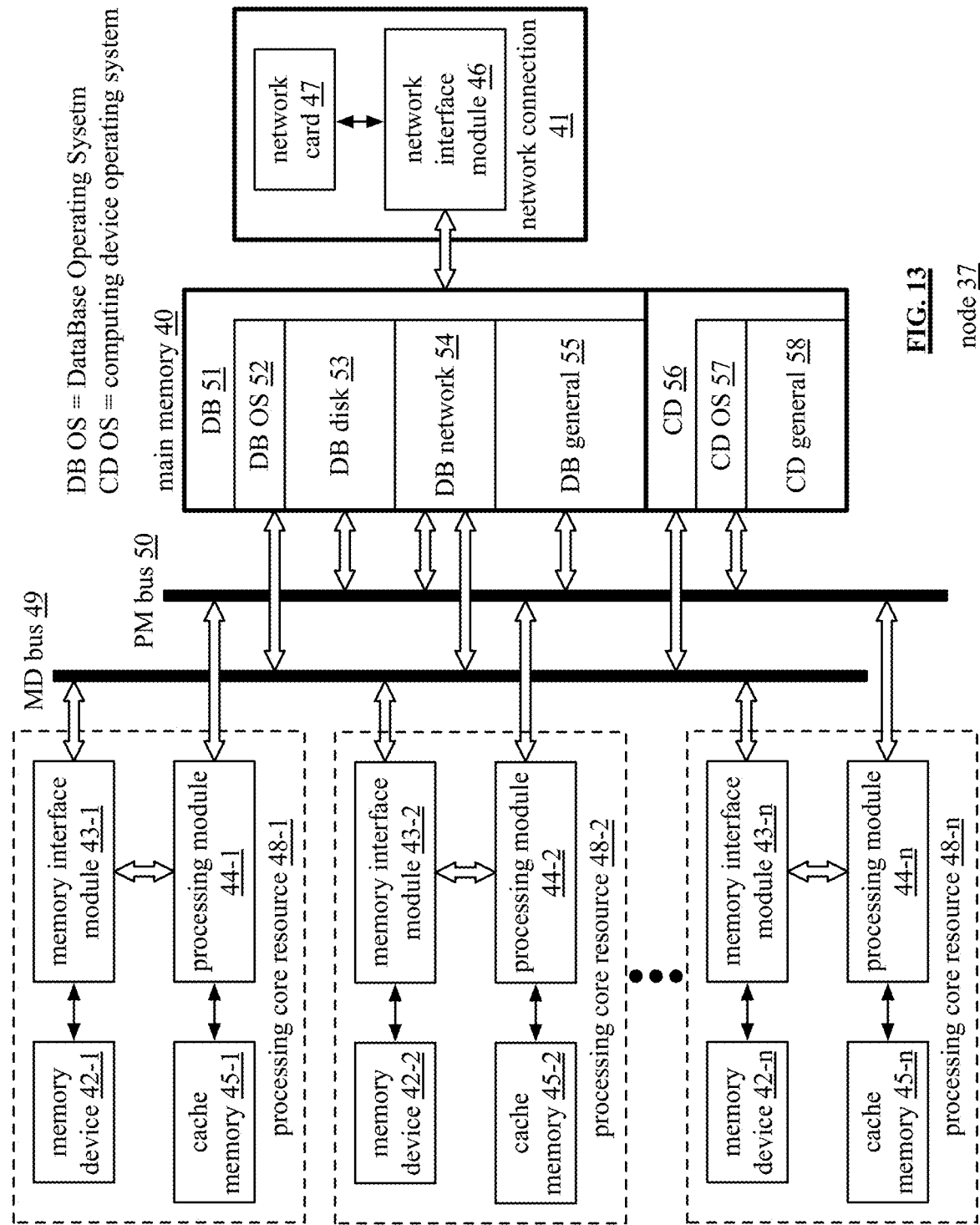
FIG. 13 is a schematic block diagram of an embodiment of a node of a computing device in accordance with the present invention.

FIG. 13 is a schematic block diagram of another embodiment of a node 37 of computing device 18 that includes processing core resources 48-1 through 48-n, a memory device (MD) bus 49, a processing module (PM) bus 50, a main memory 40 and a network connection 41. The network connection 41 includes the network card 47 and the network interface module 46 of FIG. 10. Each processing core resource includes a corresponding processing module of processing modules 44-1 through 44-n, a corresponding memory interface module of memory interface modules 43-1 through 43-n, a corresponding memory device of memory devices 42-1 through 42-n, and a corresponding cache memory of cache memories 45-1 through 45-n. In this configuration, each processing core resource can operate independently of the other processing core resources. This further supports increased parallel operation of database functions to further reduce execution time.

The main memory 40 is divided into a computing device (CD) 56 section and a database (DB) 51 section. The database section includes a database operating system (OS) area 52, a disk area 53, a network area 54, and a general area 55. The computing device section includes a computing device operating system (OS) area 57 and a general area 58. Note that each section could include more or less allocated areas for various tasks being executed by the database system.

In general, the database OS 52 allocates main memory for database operations. Once allocated, the computing device OS 57 cannot access that portion of the main memory 40. This supports lock free and independent parallel execution of one or more operations.

Figure 14:
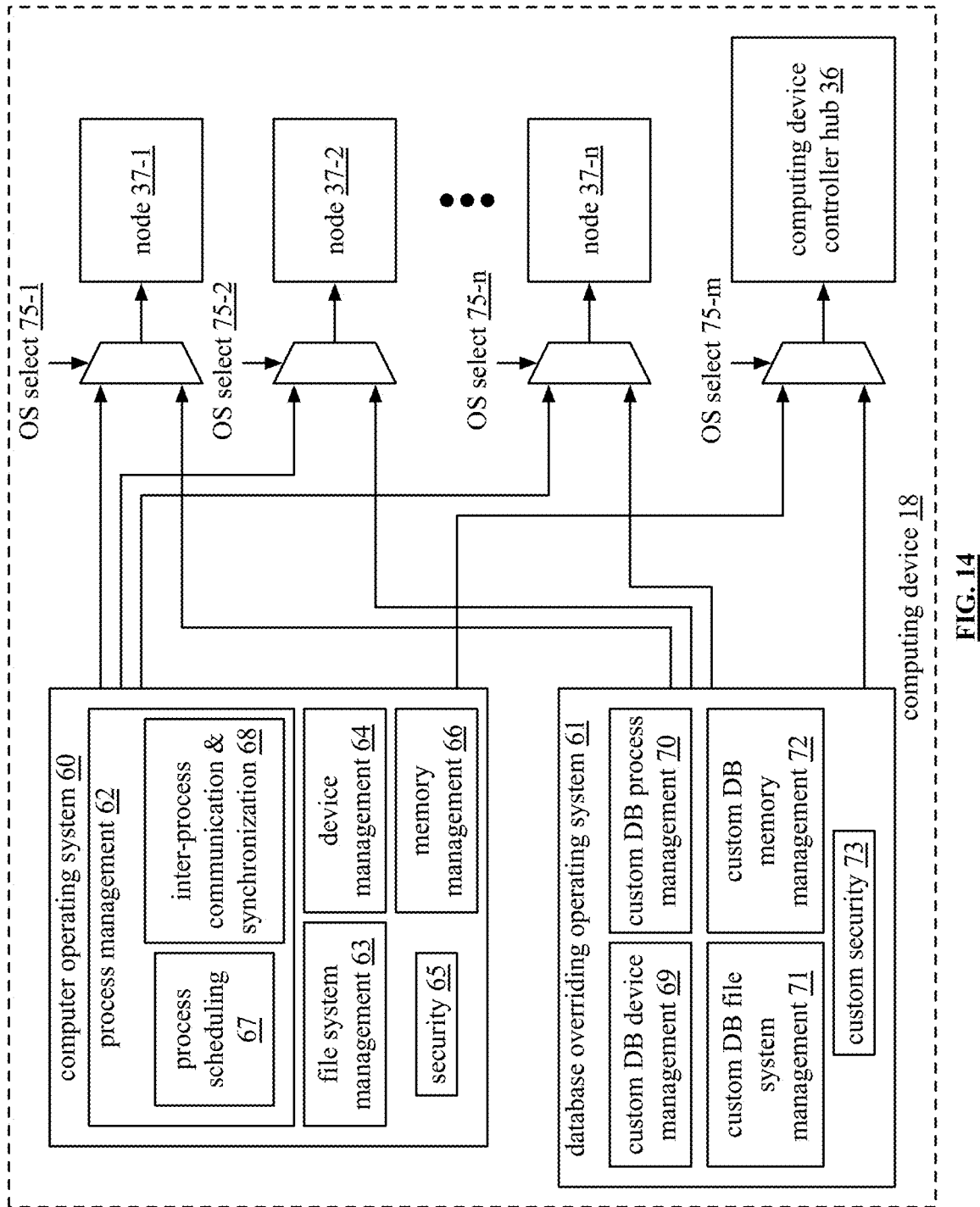
FIG. 14 is a schematic block diagram of an embodiment of operating systems of a computing device in accordance with the present invention.

FIG. 14 is a schematic block diagram of an embodiment of operating systems of a computing device 18. The computing device 18 includes a computer operating system 60 and a database overriding operating system (DB OS) 61. The computer OS 60 includes process management 62, file system management 63, device management 64, memory management 66, and security 65. The processing management 62 generally includes process scheduling 67 and inter-process communication and synchronization 68. In general, the computer OS 60 is a conventional operating system used by a variety of types of computing devices. For example, the computer operating system is a personal computer operating system, a server operating system, a tablet operating system, a cell phone operating system, etc.

The database overriding operating system (DB OS) 61 includes custom DB device management 69, custom DB process management 70 (e.g., process scheduling and/or inter-process communication & synchronization), custom DB file system management 71, custom DB memory management 72, and/or custom security 73. In general, the database overriding OS 61 provides hardware components of a node for more direct access to memory, more direct access to a network connection, improved independency, improved data storage, improved data retrieval, and/or improved data processing than the computing device OS.

In an example of operation, the database overriding OS 61 controls which operating system, or portions thereof, operate with each node and/or computing device controller hub of a computing device (e.g., via OS select 75-1 through 75-n when communicating with nodes 37-1 through 37-n and via OS select 75-m when communicating with the computing device controller hub 36). For example, device management of a node is supported by the computer operating system, while process management, memory management, and file system management are supported by the database overriding operating system. To override the computer OS, the database overriding OS provides instructions to the computer OS regarding which management tasks will be controlled by the database overriding OS. The database overriding OS also provides notification to the computer OS as to which sections of the main memory it is reserving exclusively for one or more database functions, operations, and/or tasks. One or more examples of the database overriding operating system are provided in subsequent figures.

Figure 15:
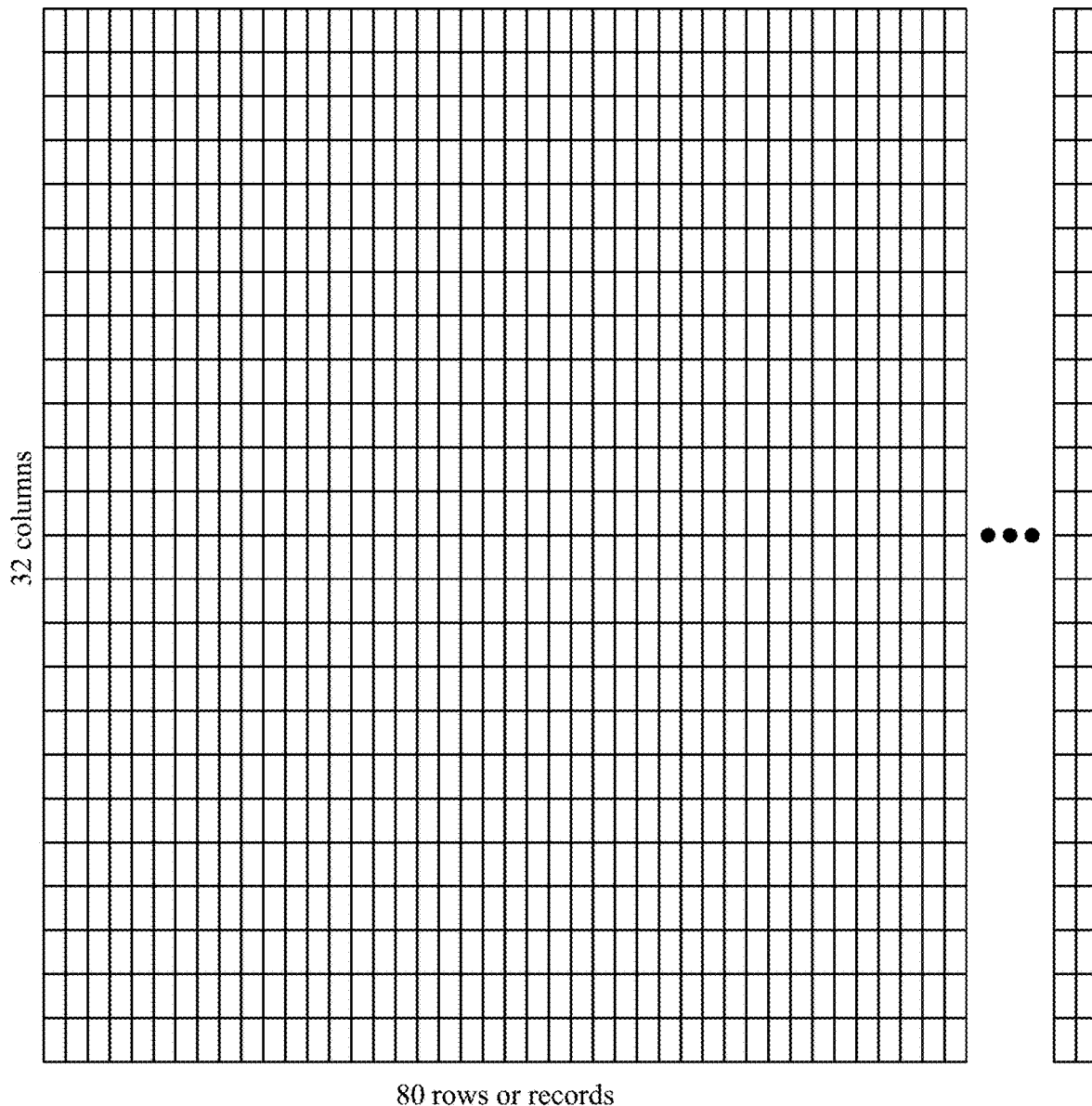

FIGS. 15-25 are schematic block diagrams of an example of processing a table or data set for storage in the database system. FIG. 15 illustrates an example of a data set or table that includes 32 columns and 80 rows, or records, that is received by the parallelized data input-subsystem. This is a very small table, but is sufficient for illustrating one or more concepts regarding one or more aspects of a database system. The table is representative of a variety of data ranging from insurance data, to financial data, to employee data, to medical data, and so on.

Figure 16:
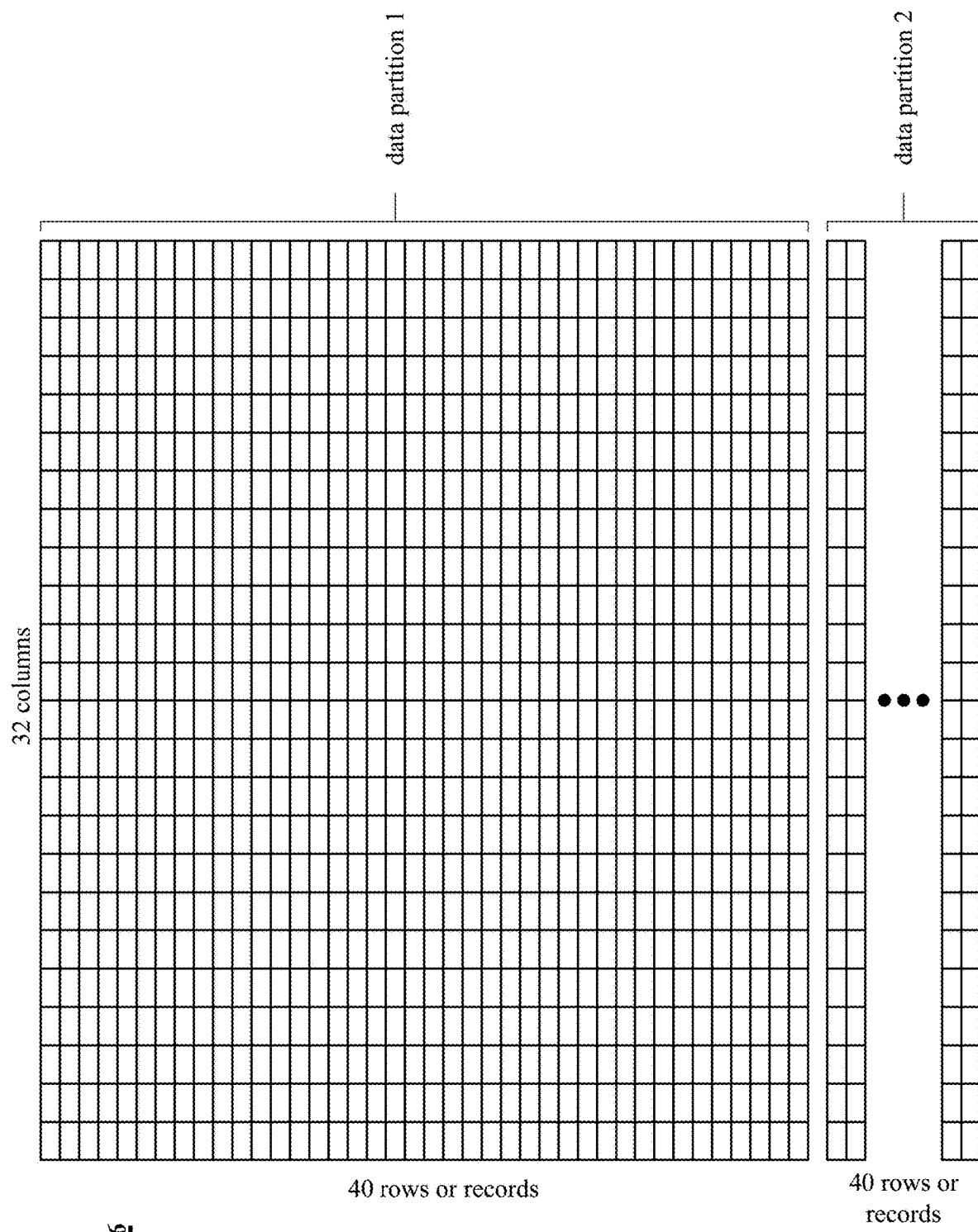

FIG. 16 illustrates an example of the parallelized data input-subsystem dividing the data set into two partitions. Each of the data partitions includes 40 rows, or records, of the data set. In another example, the parallelized data input-subsystem divides the data set into more than two partitions. In yet another example, the parallelized data input-subsystem divides the data set into many partitions and at least two of the partitions have a different number of rows.

FIG. 17 illustrates an example of the parallelized data input-subsystem dividing a data partition into a plurality of segments to form a segment group. The number of segments in a segment group is a function of the data redundancy encoding. In this example, the data redundancy encoding is single parity encoding from four data pieces; thus, five segments are created. In another example, the data redundancy encoding is a two parity encoding from four data pieces; thus, six segments are created. In yet another example, the data redundancy encoding is single parity encoding from seven data pieces; thus, eight segments are created.

FIG. 18 illustrates an example of data for segment 1 of the segments of FIG. 17. The segment is in a raw form since it has not yet been key column sorted. As shown, segment 1 includes 8 rows and 32 columns. The third column is selected as the key column and the other columns stored various pieces of information for a given row (i.e., a record).

As an example, the table is regarding a fleet of vehicles. Each row represents data regarding a unique vehicle. The first column stores a vehicle ID, the second column stores make and model information of the vehicle. The third column stores data as to whether the vehicle is on or off. The remaining columns store data regarding the operation of the vehicle such as mileage, gas level, oil level, maintenance information, routes taken, etc.

With the third column selected as the key column, the other columns of the segment are to be sorted based on the key column. Prior to sorted, the columns are separated to form data slabs. As such, one column is separated out to form one data slab.

FIG. 19 illustrates an example of the parallelized data input-subsystem dividing segment 1 of FIG. 18 into a plurality of data slabs. A data slab is a column of segment 1. In this figure, the data of the data slabs has not been sorted. Once the columns have been separated into data slabs, each data slab is sorted based on the key column. Note that more than one key column may be selected and used to sort the data slabs based on two or more other columns.

FIG. 20 illustrates an example of the parallelized data input-subsystem sorting the each of the data slabs based on the key column. In this example, the data slabs are sorted based on the third column which includes data of "on" or "off". The rows of a data slab are rearranged based on the key column to produce a sorted data slab. Each segment of the segment group is divided into similar data slabs and sorted by the same key column to produce sorted data slabs.

Figure 21:
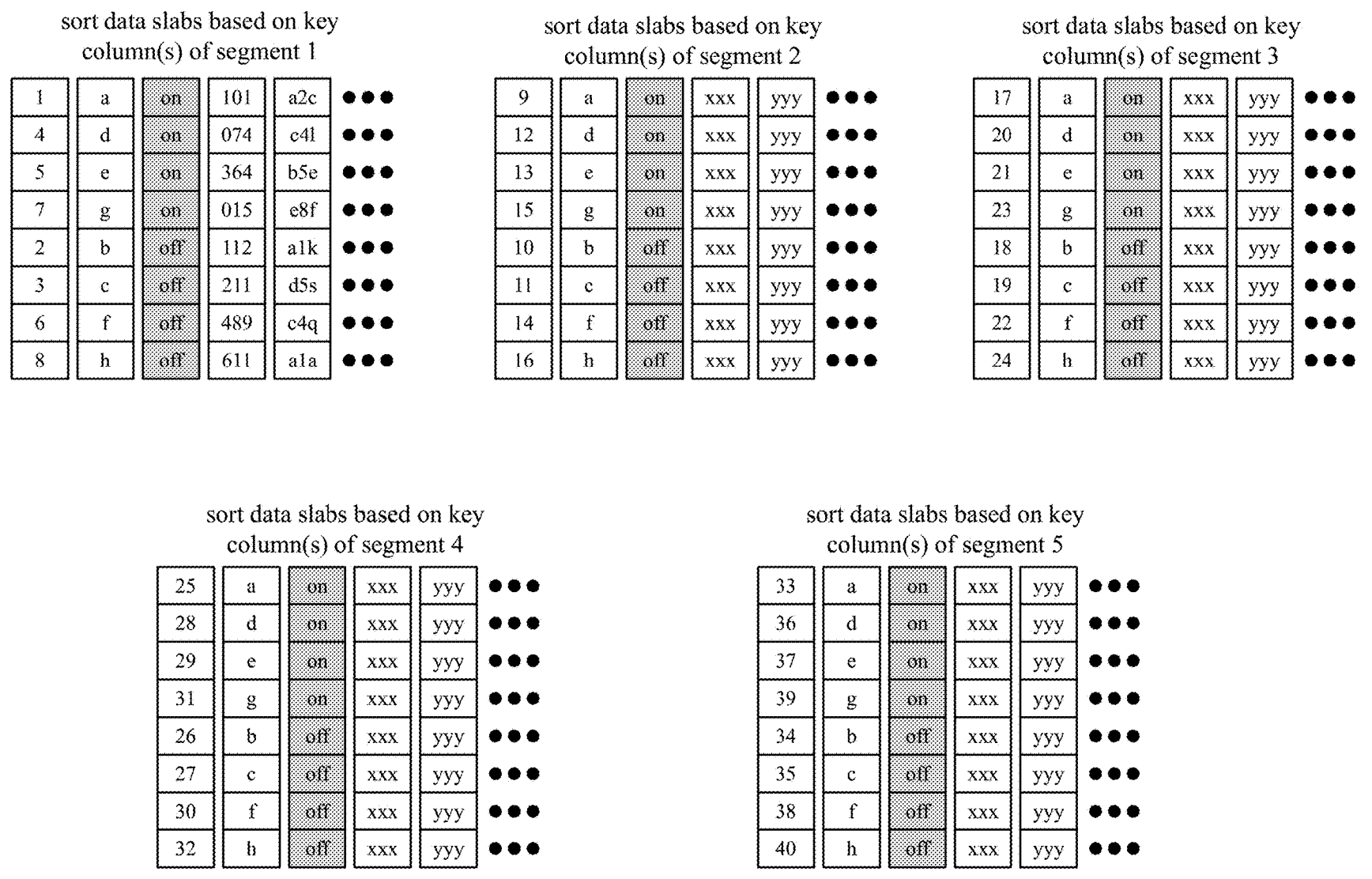

FIG. 21 illustrates an example of each segment of the segment group sorted into sorted data slabs. The similarity of data from segment to segment is for the convenience of illustration. Note that each segment has its own data, which may or may not be similar to the data in the other sections.

Figure 22:
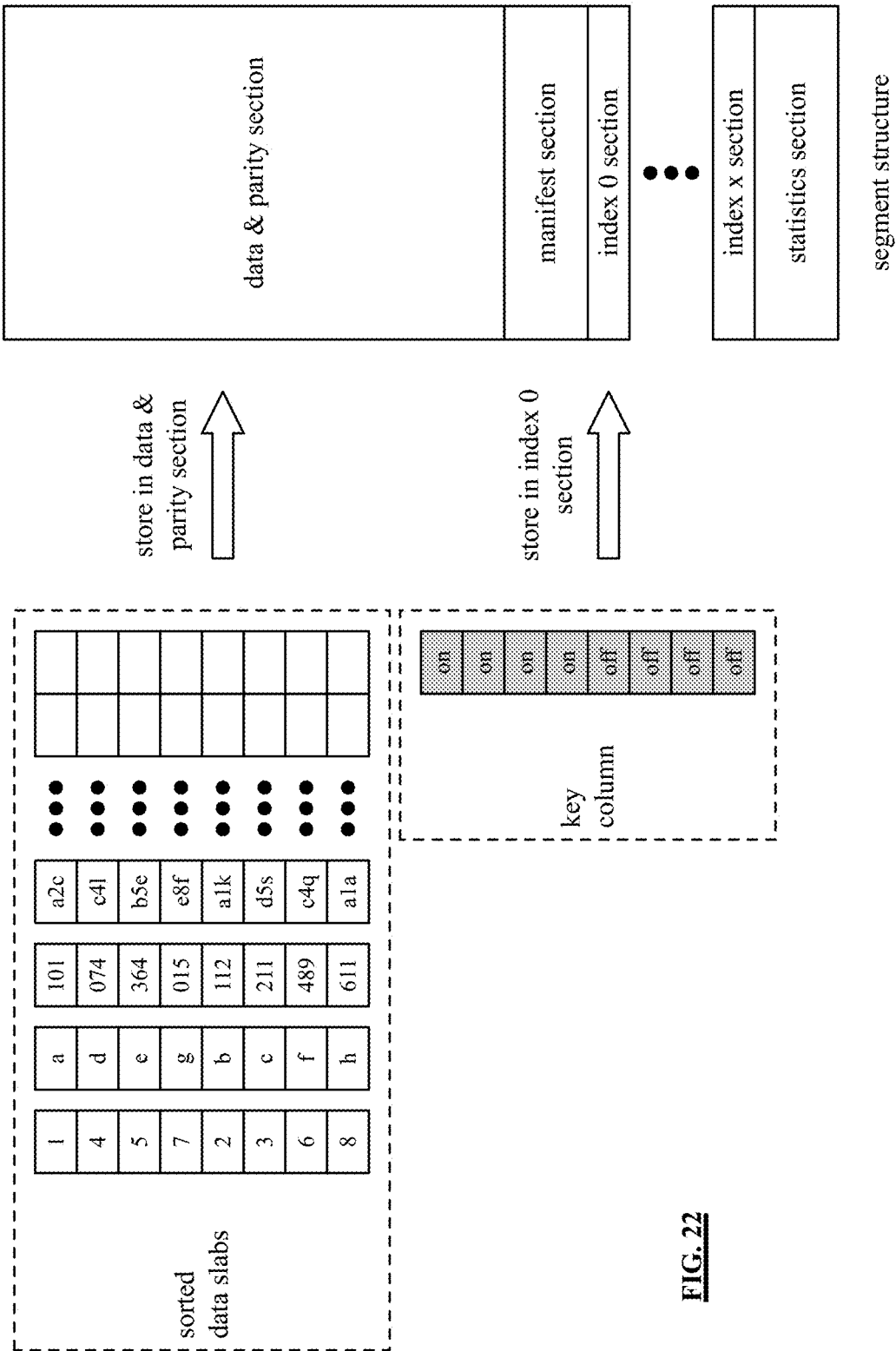

FIG. 22 illustrates an example of a segment structure for a segment of the segment group. The segment structure for a segment includes the data & parity section, a manifest section, one or more index sections, and a statistics section. The segment structure represents a storage mapping of the data (e.g., data slabs and parity data) of a segment and associated data (e.g., metadata, statistics, key column(s), etc.) regarding the data of the segment. The sorted data slabs of FIG. 16 of the segment are stored in the data & parity section of the segment structure. The sorted data slabs are stored in the data & parity section in a compressed format or as raw data (i.e., non-compressed format). Note that a segment structure has a particular data size (e.g., 32 Giga-Bytes) and data is stored within in coding block sizes (e.g., 4 Kilo-Bytes).

Before the sorted data slabs are stored in the data & parity section, or concurrently with storing in the data & parity section, the sorted data slabs of a segment are redundancy encoded. The redundancy encoding may be done in a variety of ways. For example, the redundancy encoding is in accordance with RAID 5, RAID 6, or RAID 10. As another example, the redundancy encoding is a form of forward error encoding (e.g., Reed Solomon, Trellis, etc.).

The manifest section stores metadata regarding the sorted data slabs. The metadata includes one or more of, but is not limited to, descriptive metadata, structural metadata, and/or administrative metadata. Descriptive metadata includes one or more of, but is not limited to, information regarding data such as name, an abstract, keywords, author, etc. Structural metadata includes one or more of, but is not limited to, structural features of the data such as page size, page ordering, formatting, compression information, redundancy encoding information, logical addressing information, physical addressing information, physical to logical addressing information, etc. Administrative metadata includes one or more of, but is not limited to, information that aids in managing data such as file type, access privileges, rights management, preservation of the data, etc.

The key column is stored in an index section. For example, a first key column is stored in index #0. If a second key column exists, it is stored in index #1. As such, for each key column, it is stored in its own index section. Alternatively, one or more key columns are stored in a single index section.

The statistics section stores statistical information regarding the segment and/or the segment group. The statistical information includes one or more of, but is not limited, to number of rows (e.g., data values) in one or more of the sorted data slabs, average length of one or more of the sorted data slabs, average row size (e.g., average size of a data value), etc. The statistical information includes information regarding raw data slabs, raw parity data, and/or compressed data slabs and parity data.

Figure 23:
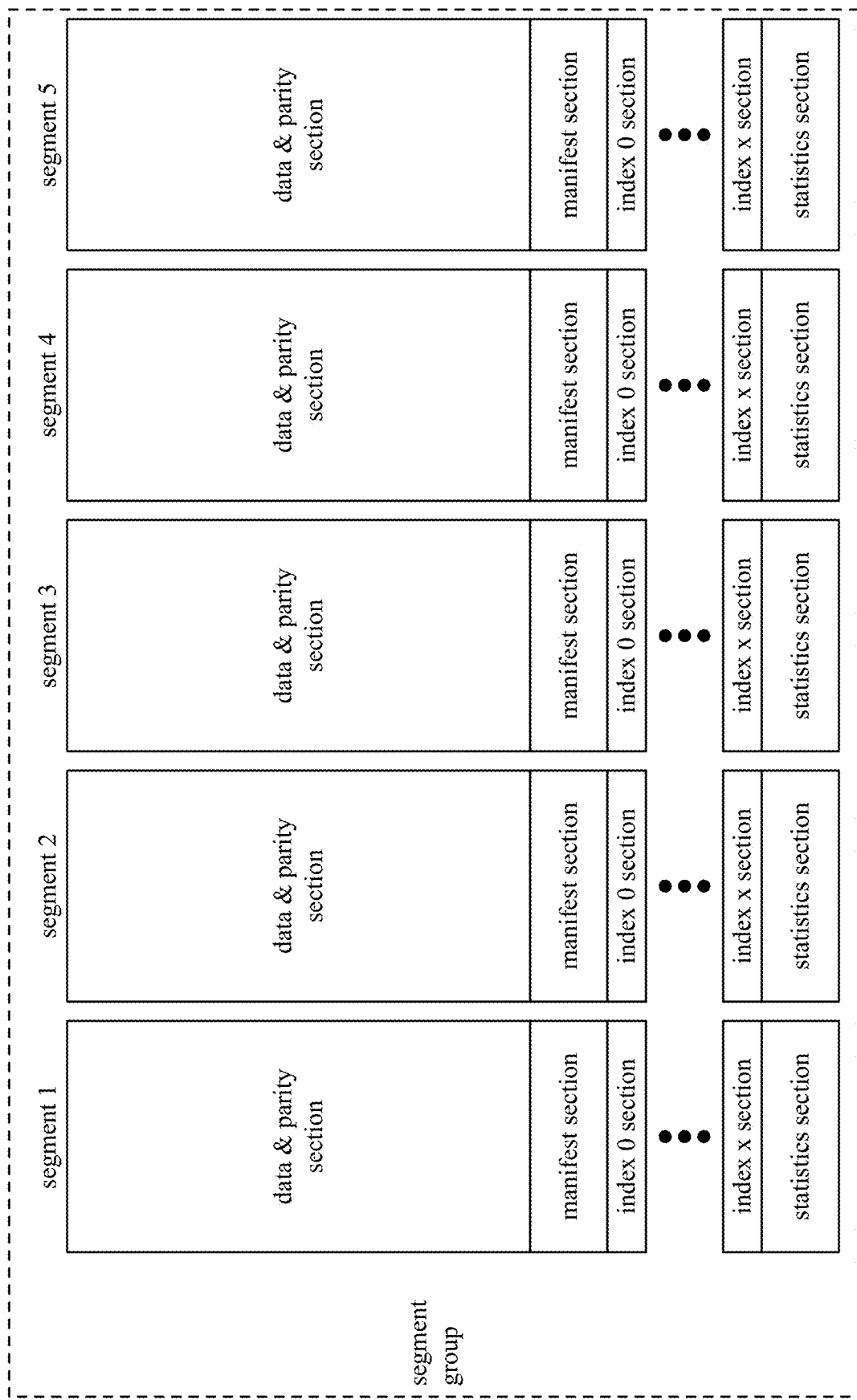

FIG. 23 illustrates the segment structures for each segment of a segment group having five segments. Each segment includes a data & parity section, a manifest section, one or more index sections, and a statistic section. Each segment is targeted for storage in a different computing device of a storage cluster. The number of segments in the segment group corresponds to the number of computing devices in a storage cluster. In this example, there are five computing devices in a storage cluster. Other examples include more or less than five computing devices in a storage cluster.

Figure 24:
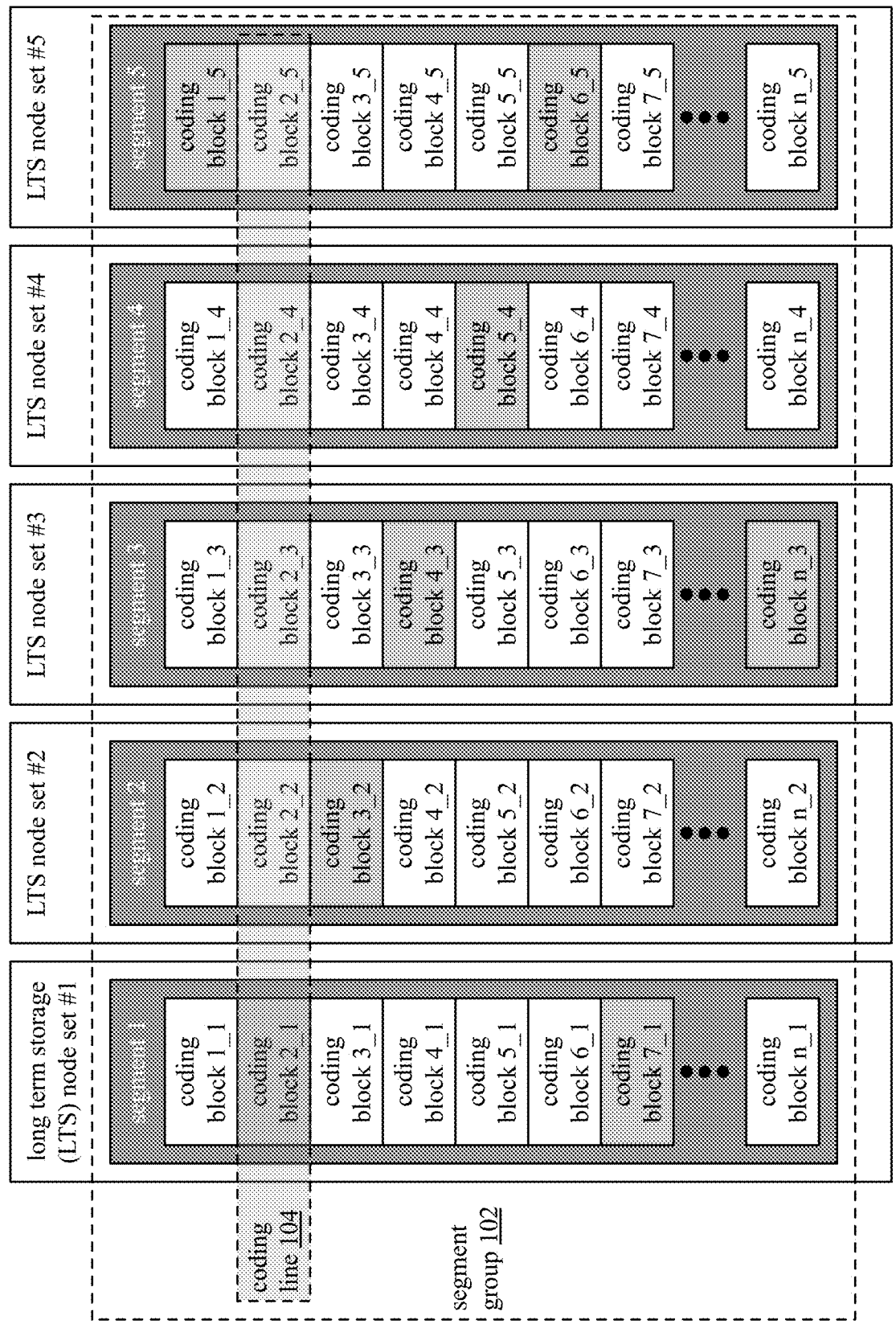

FIG. 24 illustrates an example of redundancy encoding using single parity encoding. The data of each segment of a second group 102 is divided into data blocks (e.g., 4 K bytes). The data blocks of the segments are logically aligned such that the first data blocks of the segments are aligned. For example, coding block 1_1 (the first number represents the code block number in the segment and the second number represents the segment number, thus 1_1 is the first code block of the first segment) is aligned with the first code block of the second segment (code block 12), the first code block of the third segment (code block 1_3), and the first code block of the fourth segment (code block 1_4). This forms a data portion of a coding line 104.

The four data coding blocks are exclusively ORed together to form a parity coding block, which is represented by the gray shaded block 1_5. The parity coding block is placed in segment 5 as the first coding block. As such, the first coding line includes four data coding blocks and one parity coding block. Note that the parity coding block is typically only used when a data code block is lost or has been corrupted. Thus, during normal operations, the four data coding blocks are used.

To balance the reading and writing of data across the segments of a segment group, the positioning of the four data coding blocks and the one parity coding block are distributed. For example, the position of the parity coding block from coding line to coding line is changed. In the present example, the parity coding block, from coding line to coding line, follows the modulo pattern of 5, 1, 2, 3, and 4. Other distribution patterns may be used. In some instances, the distribution does not need to be equal. Note that the redundancy encoding may be done by one or more computing devices 18 of the parallelized data input sub-system 11 and/or by one or more computing devices of the parallelized data store, retrieve, &/or process sub-system 12.

Figure 25:
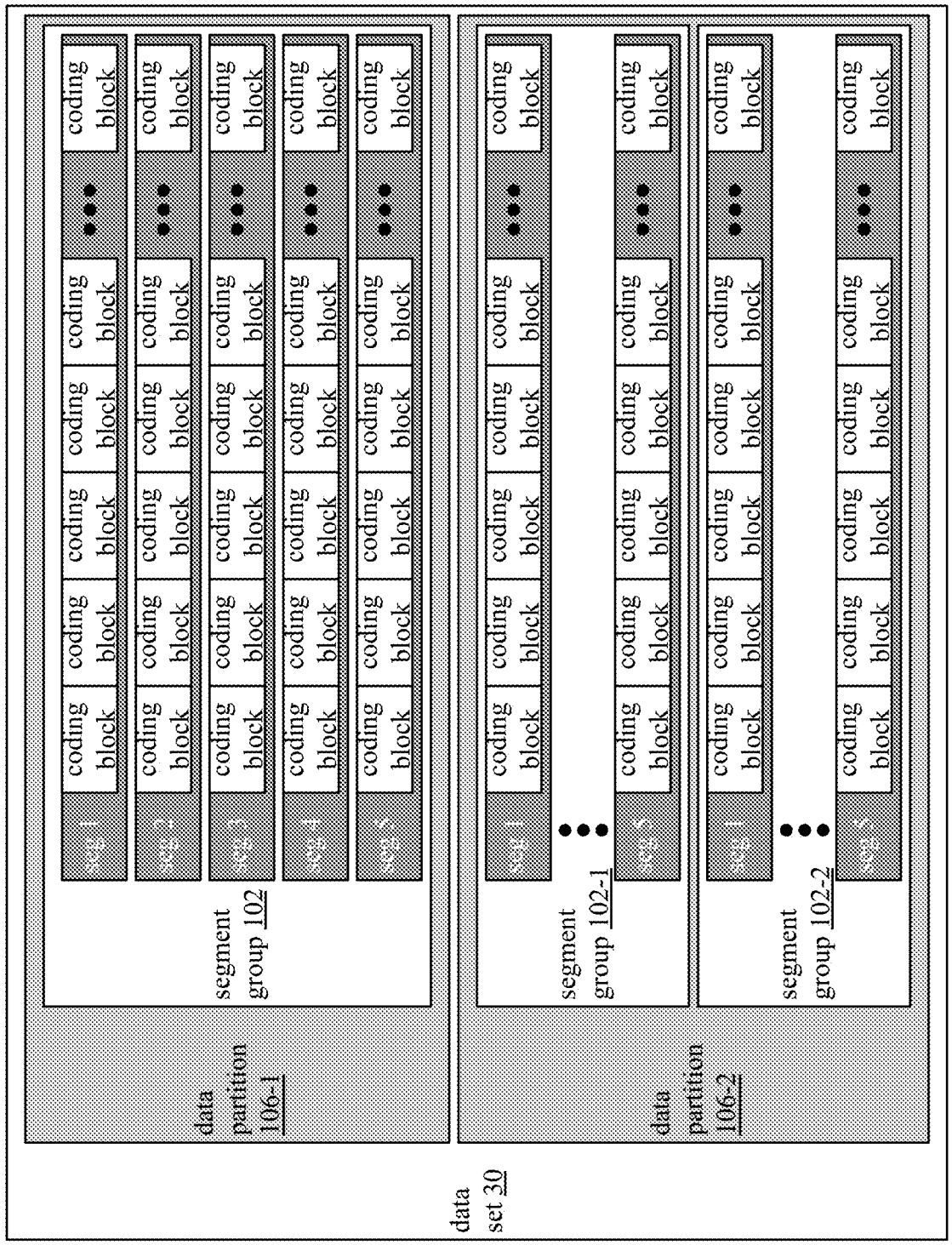

FIG. 25 illustrates an overlay of the dividing of a data set 30 (e.g., a table) into data partitions 106-1 and 106-2. Each partition is then divided into one or more segment groups 102. Each segment group 102 includes a number of segments. Each segment is further divided into coding blocks, which include data coding blocks and parity coding blocks.

Figure 26:
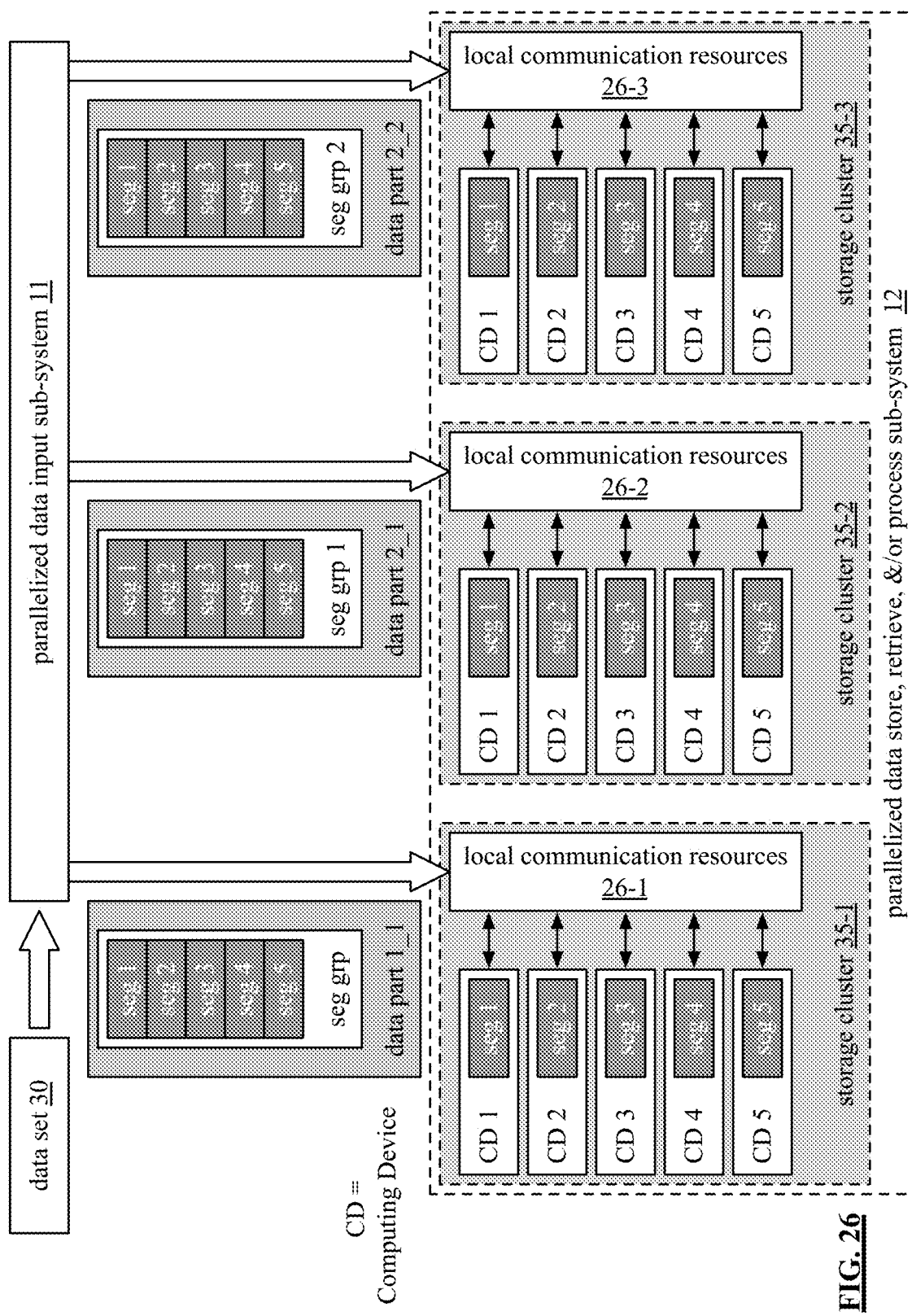
FIGS. 26-28 are schematic block diagrams of an example of storing a processed table or data set in the database system in accordance with the present invention.

FIG. 26 is a schematic block diagrams of an example of storing a processed table or data set 30 in the database system 10. In this example, the parallelized data input sub-system 11 sends, via local communication resources 26-1 through 26-3, segment groups of data partitions of the data set 30 (e.g., table) to storage clusters 35-1 through 35-3 of the parallelized data store, retrieve, &/or process sub-system 12. In this example, each storage cluster includes five computing devices, as such, a segment group includes five segments.

Each storage cluster has a primary computing device 18 for receiving incoming segment groups. The primary computing device 18 is randomly selected for each ingesting of data or is selected in a predetermined manner (e.g., a round robin fashion). The primary computing device 18 of each storage cluster 35 receives the segment group and then provides the segments to the computing devices 18 in its cluster 35; including itself. Alternatively, the parallelized data input-section 11 sends, via a local communication resource 26, each segment of a segment group to a particular computing device 18 within the storage clusters 35.

Figure 27:
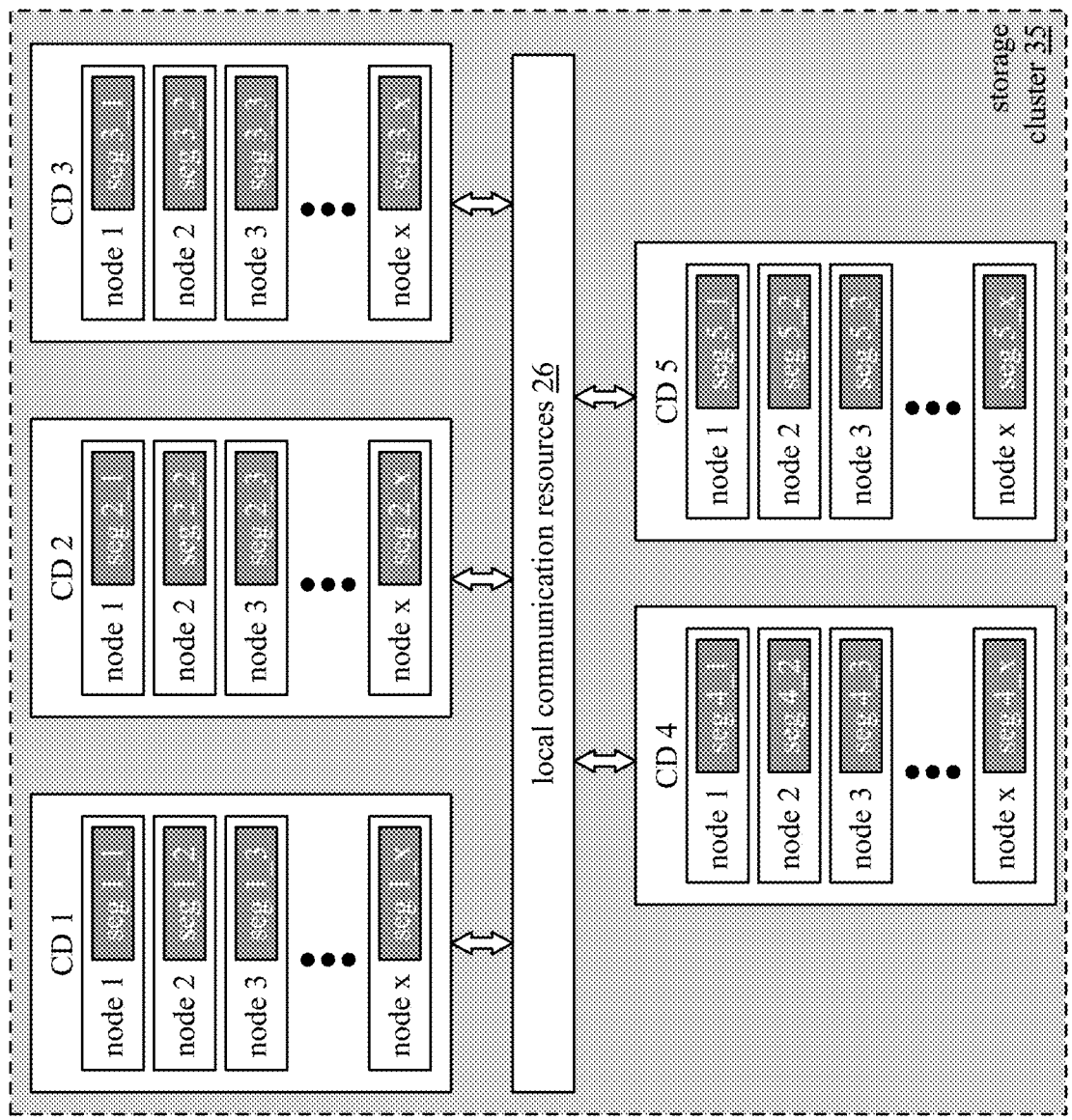

FIG. 27 illustrates a storage cluster 35 distributing storage of a segment group among its computing devices and the nodes within the computing device. Within each computing device, a node is selected as a primary node for dividing a segment into segment divisions and distributing the segment divisions to the nodes; including itself. For example, node 1 of computing device (CD) 1 receives segment 1. Having x number of nodes in the computing device 1, node 1 divides the segment into x segment divisions (e.g., seg 1_1 through seg 1_x, where the first number represents the segment number of the segment group and the second number represents the division number of the segment). Having divided the segment into divisions (which may include an equal amount of data per division, an equal number of coding blocks per division, an unequal amount of data per division, and/or an unequal number of coding blocks per division), node 1 sends the segment divisions to the respective nodes of the computing device.

Figure 28:
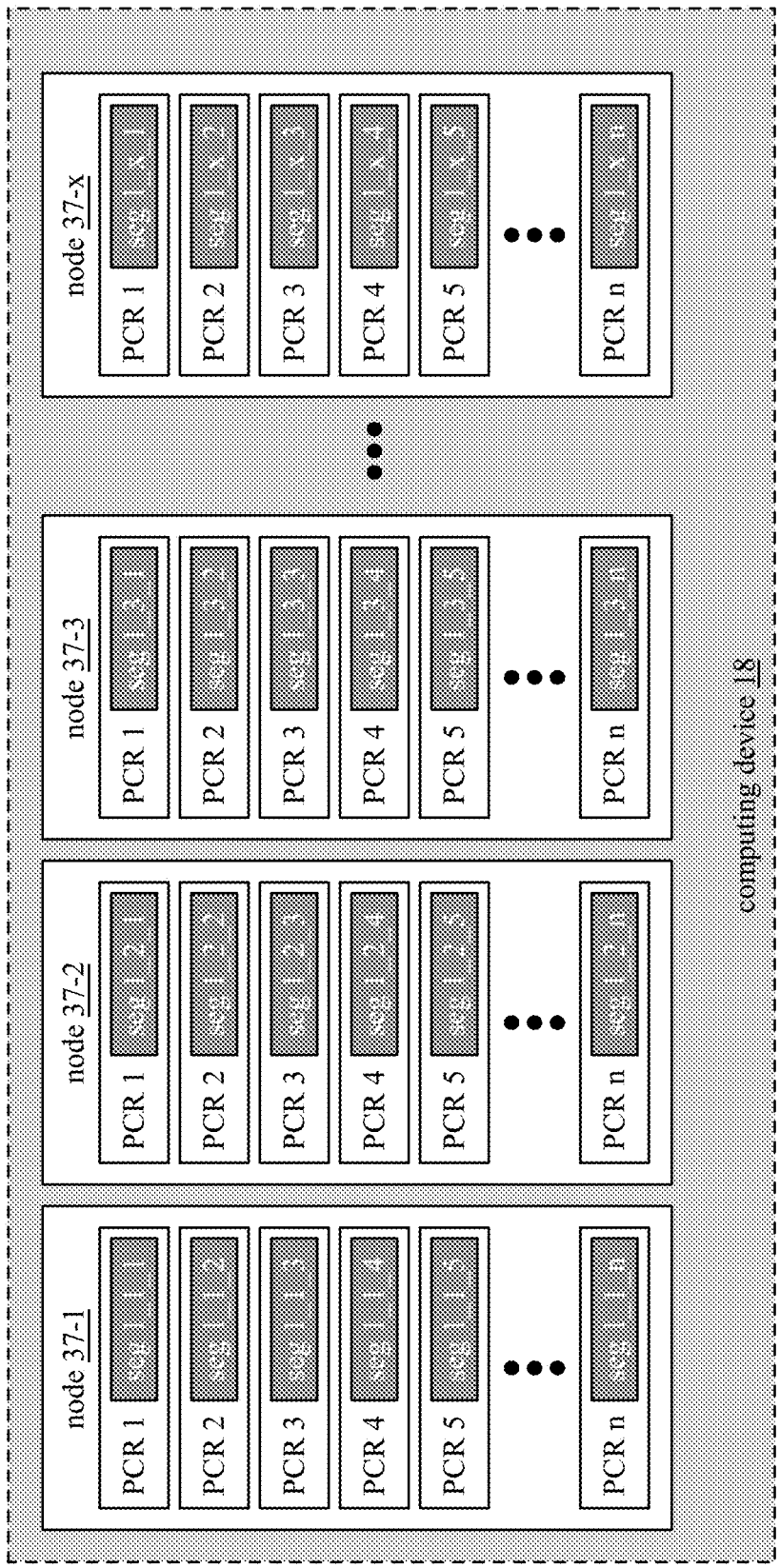

FIG. 28 illustrates notes 37-1 through 37-x of a computing device 18 distributing storage of a segment division among its processing core resources 48 (PCR). Within each node, a processing core resource (PCR) is selected as a primary PCR for dividing a segment division into segment sub-divisions and distributing the segment sub-divisions to the other PCRs of the node; including itself. For example, PCR 1 of node 1 of computing device 1 receives segment division 1_1. Having n number of PCRs in node 1, PCR 1 divides the segment division 1 into n segment sub-divisions (e.g., seg 1_1_1 through seg 1_1_n, where the first number represents the segment number of the segment group, the second number represents the division number of the segment, and the third number represents the sub-division number). Having divided the segment division into sub-divisions (which may include an equal amount of data per sub-division, an equal number of coding blocks per sub-division, an unequal amount of data per sub-division, and/or an unequal number of coding blocks per sub-division), PCR 1 sends the segment sub-divisions to the respective PCRs of node 1 of computing device 1.

Figure 29:
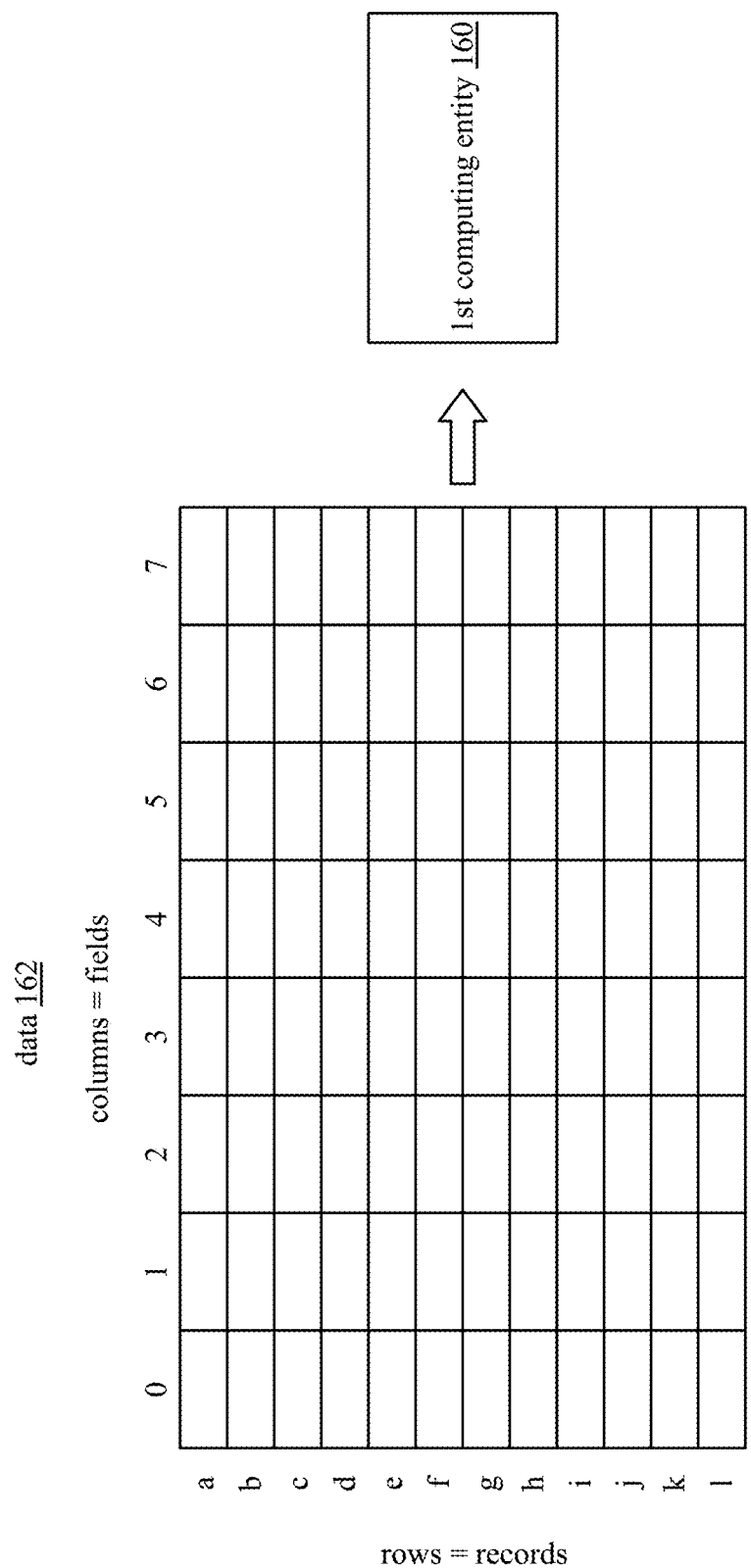
FIG. 29 is a schematic block diagram of an example of a first computing entity receiving data in accordance with the present invention.

FIG. 29 is a schematic block diagram of an example of a first computing entity 160 receiving data 162. The data 162 includes rows and columns. As an example, the rows correspond to data records and the column corresponds to fields of a data record. As a specific example, the data 162 is regarding employee records, where a row corresponds to a particular employee and the columns include employee ID, employee name, employment date, salary, home address, etc.

The first computing entity 160 includes one or more of: one or more computing devices of the parallelized data input sub-system 11 of the database system 10, one or more nodes of the one or more of the computing devices, and one or more processing core resources of the one or more nodes. The first computing entity 160 processes the data 162 for storage in a second computing entity 170 as discussed with reference to one or more of FIGS. 30-42. The second computing entity 170 includes one or more of: one or more computing devices of the parallelized data store, retrieve, &/or process sub-system 12 of the database system 10, one or more nodes of the one or more of the computing devices, and one or more processing core resources of the one or more nodes.

While the data 162 is shown with the rows in the horizontal direction and the columns in the vertical direction, the orientation and/or data structure of the data 162 may be different. For example, the rows are orientated in the vertical direction and the columns are orientated in the horizontal direction. As another example, each record is its own data object and the data objects of the data are linked together.

Figure 30:
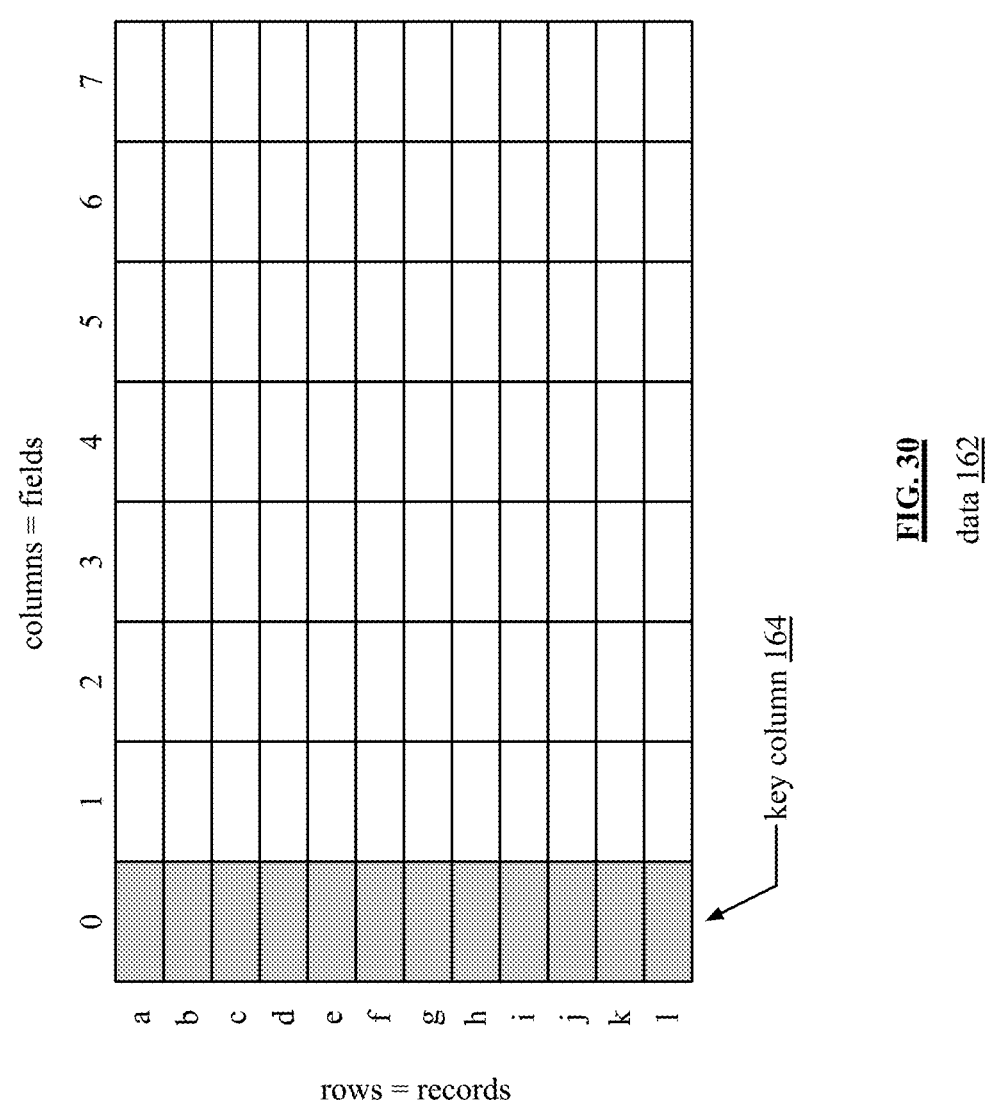

FIG. 30 is a schematic block diagram of an example of the first computing entity 160 identifying a key column 164 of the data 162 on a desired sort criteria for the data. The desired sort criteria are reflective of how the data is to be sorted for a known query or for a likely query. For example, if a query is regarding an annual report of any type (e.g., sales, new hires, etc.), sorting data based on dates would be desired. As a further example, the query is further requiring the annular report to be broken down by departments; thus, it would be further desired to sort the data based on department ID.

The first computing entity 160 can identify the key column in a variety of ways. For example, the first computing entity determines the desired sorting criteria by receiving them from a requesting computing device. The first computing entity receives the desired sort criteria along with the data 162 or receives them in a separate message. In this example, the desired sorting criteria identifies the one or more key columns.

In another example, the first computing entity interprets a type of data records to identify the one or more key columns. The desired sort criteria provide interpretation rules for different types of records. For example, employee records are often sorted based on employee ID, employee department, and/or employee salary. In this example, the first computing entity would select one or more key columns to corresponds to employee ID, employee department, and/or employee salary. In another example, financial data is often sorted by data, transaction amount, purchaser ID, and/or seller ID.

While this example shows the first computing entity selecting one key column, the first computing entity could select more than one key column based on the desired sort criteria. Note that the key column is one of the columns of the data 162. Further note that, in this example, the data 162 is unsorted (i.e., it is as it was received).

Figure 31:
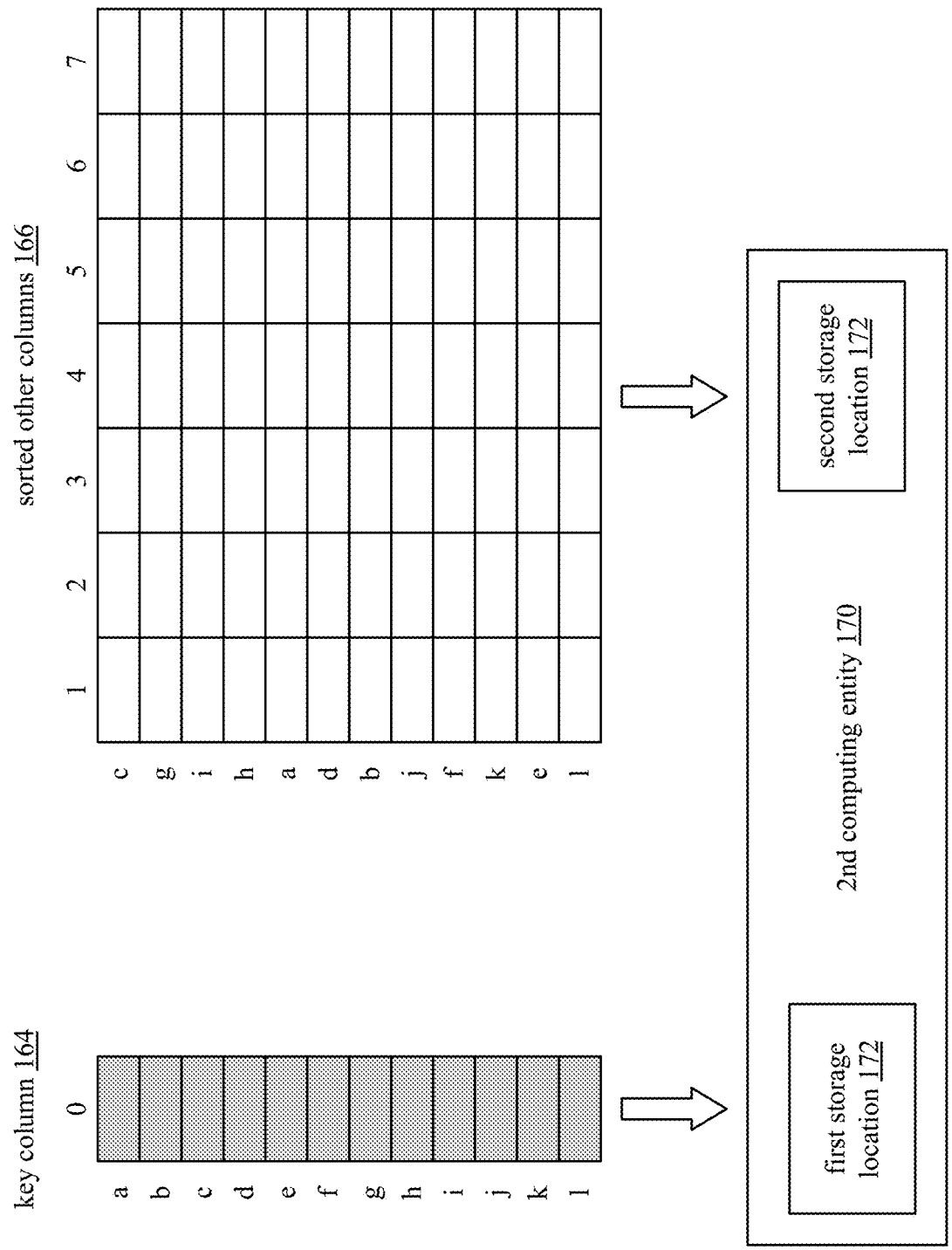
FIG. 31 is a schematic block diagram of an example of sorting columns and storing an unsorted key column and the sorted columns by a second computing entity in accordance with the present invention.

FIG. 31 is a schematic block diagram of an example of the first computing entity sorting columns and the second computing entity storing an unsorted key column and the sorted columns. In the unsorted data 162, it includes columns 0-7 and rows a-l. Column 0 has been selected as the key column. Based on the data in the fields of the key column 164, the other columns are sorted to produce sorted other columns 166.

As an example, the data 162 is regarding employee information where column 0 is for department ID, column 1 is for employee first name, column 2 is for employee last name, column 3 is for date of hire, column 4 is for salary, column 5 is for tax deductions, column 6 is for insurance program, and column 7 is for other withholdings. The data 162 was created in accordance with the date of hire. Thus, record "a" is for a first employee hired, record "b" is for a second employee hired, and so on. The data 162, is to be sorted based on the column 0, which is the department ID.

The first computing entity 160 sorts the other columns 1-7 based on the department ID of column 1. Assume that there are 3 different department IDs (1, 2, and 3). Further assume that employees "c", "g", "l", and "h" are in department 1; employees "a", "d", and "b" are in department 2, and employees "j", "f", "k", "e", and "l" are in department 3. Accordingly, the first computing entity sorts the other columns based on the key column to produce the sorted other columns 166 of "c", "g", "l", "h", "a", "d", "b", "j", "f", "k", "e", and "l".

The first computing entity 160 sends the unsorted key column 164 and the sorted other columns 166 to the second computing entity 170. The second computing entity 170 stores the unsorted key column 164 in a first storage location 172 and stores the sorted other columns 166 in a second storage location 174. In an embodiment and with reference to FIG. 22, the first storage location 172 corresponds to one or more of the index sections of a segment data structure and the second storage location 174 corresponds to the data & parity section of the segment data structure.

Figure 32:
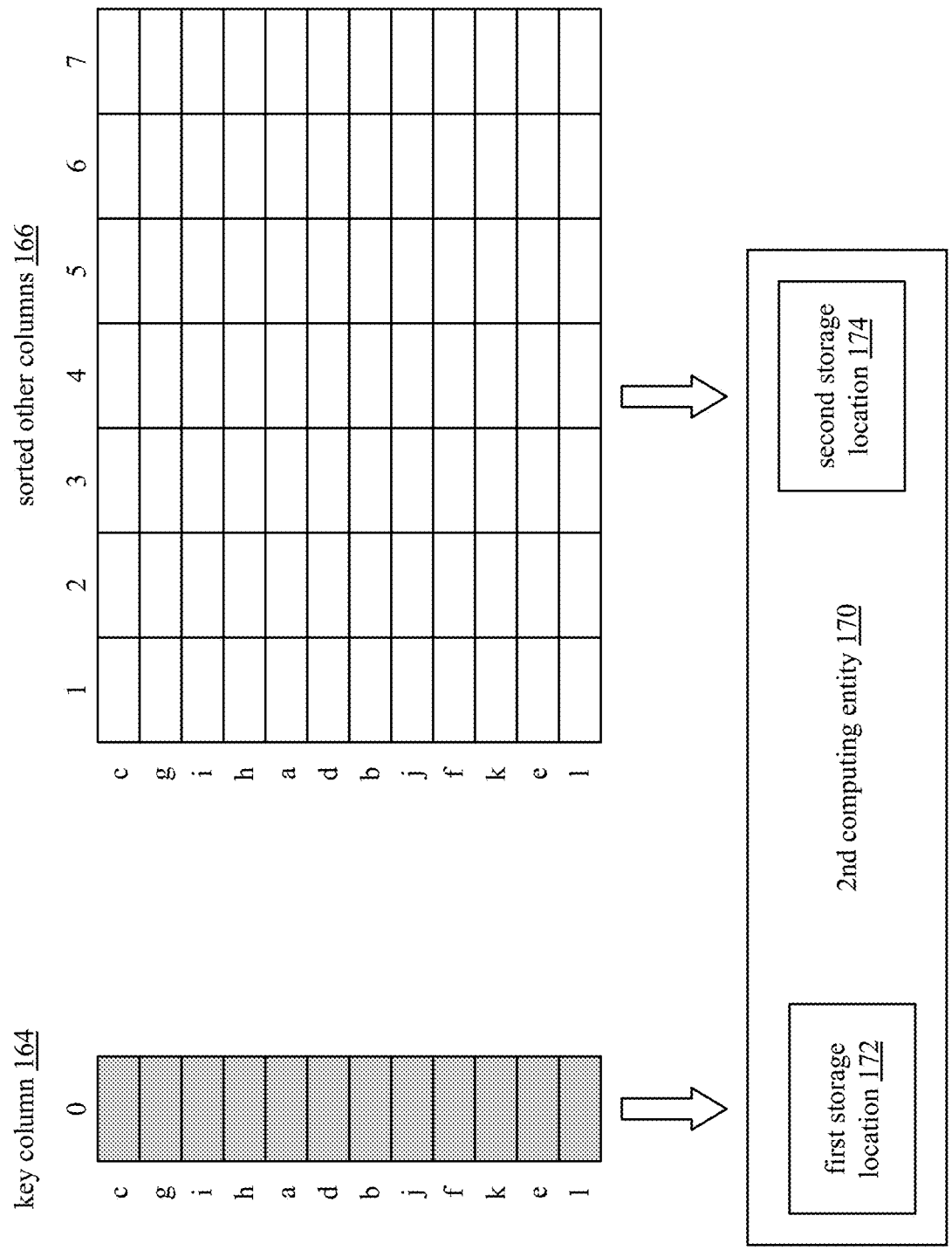
FIG. 32 is a schematic block diagram of an example of sorting columns and storing a sorted key column and the sorted columns by a second computing entity in accordance with the present invention.

FIG. 32 is a schematic block diagram of an example that is similar to the example of FIG. 31. In this example, however, the first computing entity 160 sorts the key column 164 based on its contents as well as sorting the other columns. The first computing entity sends the sorted key column 164 and the sorted other columns 166 to the second computing entity 170. The second computing entity 170 stores the sorted key column in the first storage location 172 and the sorted other columns 166 in the second storage location 174.

Figure 33:
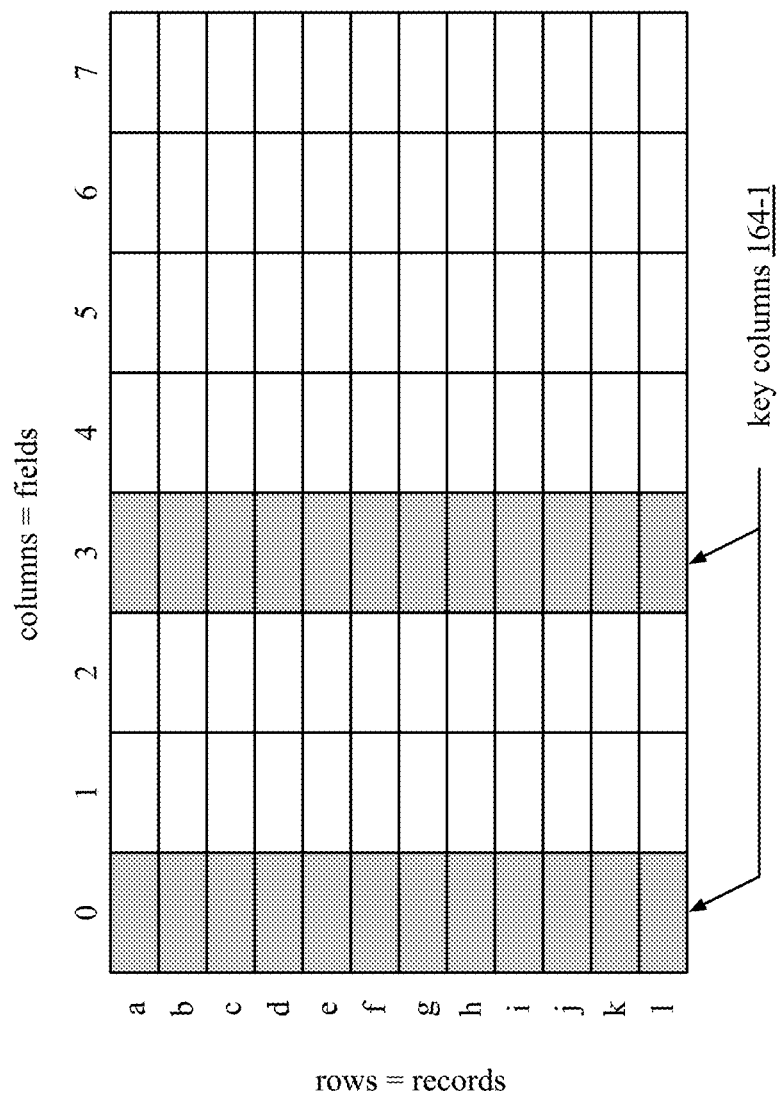
FIG. 33 is a schematic block diagram of an example of identifying a plurality of key columns in accordance with the present invention.

FIG. 33 is a schematic block diagram of an example of the first computing device identifying a plurality of key columns of the data 162. In this example, the data includes records "a"-"l" and columns 0-7. Columns 0 and 3 are selected as the key columns 164-1. The key columns are selected in a manner as discussed with reference to FIG. 30.

Figure 34:
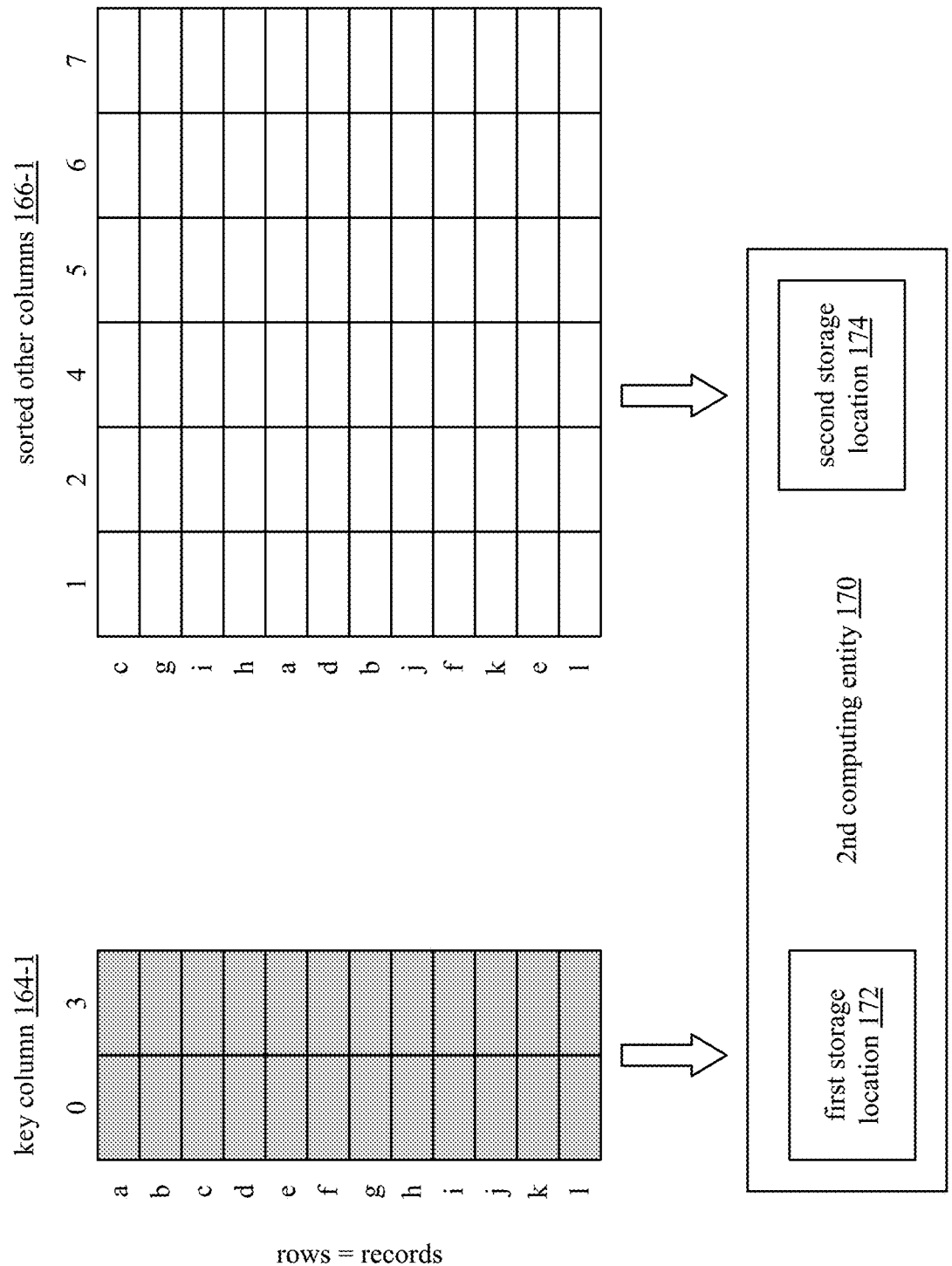
FIG. 34 is a schematic block diagram of an example of sorting columns and storing unsorted key column and the sorted columns by a second computing entity in accordance with the present invention.

FIG. 34 is a schematic block diagram of an example of the first computing entity 160 sorting the other columns and the second computing entity 170 storing unsorted key column 164-1 and the sorted other columns 166-1. This example expands on the example of FIG. 31 where the data 162 is regarding employee information. The data includes column 0 for department ID, column 1 for employee first name, column 2 for employee last name, column 3 for date of hire, column 4 for salary, column 5 for tax deductions, column 6 for insurance program, and column 7 for other withholdings.

Figure 35:
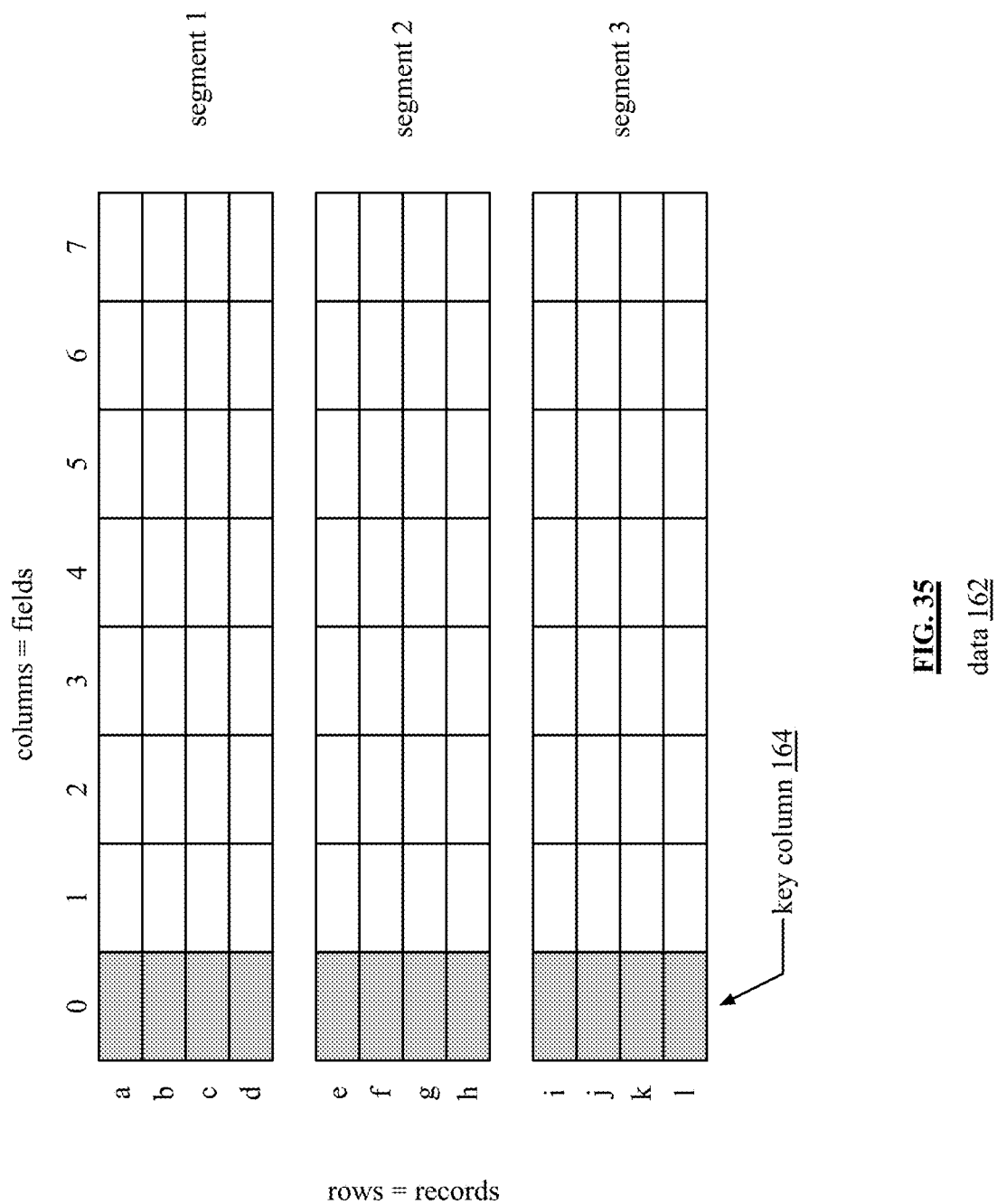
FIG. 35 is a schematic block diagram of an example of dividing data into segments in accordance with the present invention.

With columns 0 (department 1D) and column 3 (date of hire) as the key columns, the other columns are sorted by department ID and date of hire. As with the example of FIG. 31, assume that there are 3 different department IDs (1, 2, and 3). Further assume that employees "c", "g", "l", and "h" are in department 1; employees "a", "d", and "b" are in department 2, and employees "j", "f", "k", "e", and "l" are in department 3. Within department 1, "c" was hired before "g" who was hired before "l" who was hired before "h". Within department 2, "a" was hired before "d" who was hired before "b". Within department 3, "j" was hired before "f" who was hired before "k" who was hired before "e" who was hired before "l". The resulting sort of the other columns yields the sort order of "c", "g", "l", "h", "a", "d", "b", FIG. 35 is a schematic block diagram of an example of the first computing entity dividing data 162 into segments. In this example, the data 162 includes rows "a"-"l" and columns 0-7. The data 162 is segmented into three segments (1, 2, and 3). The first segment includes rows "a"-"d", the second segment includes rows "e"-"h", and the third segment includes rows "i"-"l". The first computing entity 160 selected column 0 as the key column. Note that the data 162 may corresponds to a data partition as discussed with reference to one or more FIGS. 15-21.

The first computing entity 160 may segment the data in a variety of ways and into any number of segments. For example, the first computing entity divides the data by a value such that each segment has that value of rows in it. As a specific example, the data includes 20 rows and the value is 5, then the first computing entity divides the data into 4 (e.g., 20/5) segments, each having 5 rows. As another example, the first computing entity has a value for the number of segments to create. As a specific example, the first computing entity is to create 3 segments from the data. When the data includes 12 rows, the first computing entity creates 3 segments, each having 4 rows. Note that, in a real-world situation, the data would include a substantial number of rows (e.g., greater than 1,000) and most likely more than eight columns.

Figure 36:
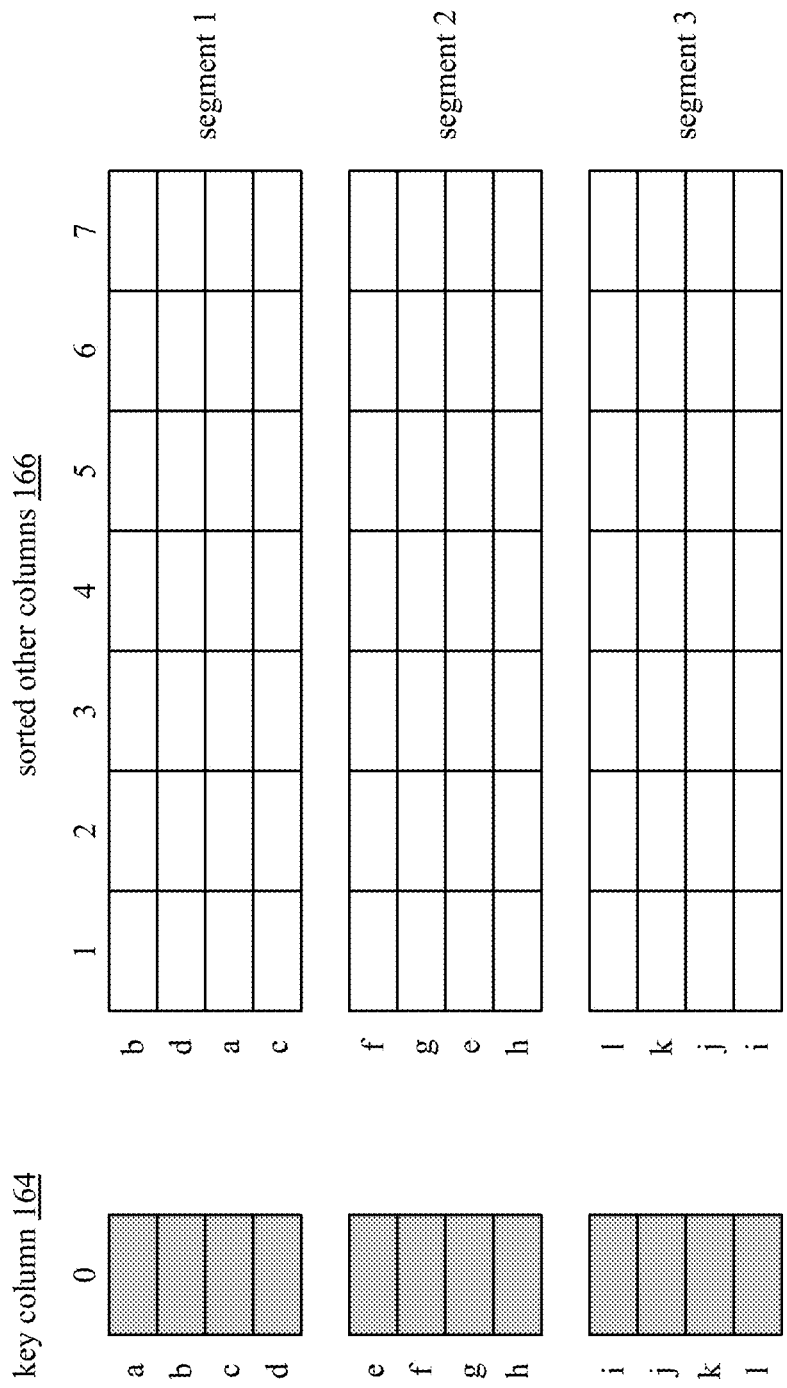
FIG. 36 is a schematic block diagram of an example of sorting columns of segments in accordance with the present invention.

FIG. 36 is a schematic block diagram of an example of the first computing entity 160 sorting the other columns of segments based on the key column. As a specific example, the first computing entity 160 sorts the other columns of segment 1 based on the data in column 0 of records "a"-"d" to produce sorted other columns 166 of segment 1. In particular, sorted other columns 166 of segment 1 are in the order of "b", "d", "a", and "c".

As another specific example, the first computing entity 160 sorts the other columns of segment 2 based on the data in column 0 of records "e"-"h" to produce sorted other columns 166 of segment 2. In particular, sorted other columns 166 of segment 2 are in the order of "f", "g", "e", and "h". As yet another specific example, the first computing entity 160 sorts the other columns of segment 3 based on the data in column 0 of records "i"-"l" to produce sorted other columns 166 of segment 3. In particular, sorted other columns 166 of segment 3 are in the order of "l", "k", "j", and "i".

The first computing entity 160 sends the sorted other columns of the first, second, and third segments to the second computing entity 170. The second computing entity 170 stores the first sorted segment in a first section of the second storage location 174, stores the second sorted segment in a second section of the second storage location 174, and stores the third sorted segment in a third section of the second storage location 174. As a specific example, the second computing entity includes three computing devices as shown in FIG. 37.

The first computing entity also sends the key column of segments 1, 2, and 3 to the second computing entity. In an embodiment, the first computing entity sends the key column of the segments in an unsorted manner. In another embodiment, the first computing entity sends the key column of the segments in a sorted manner.

Figure 37:
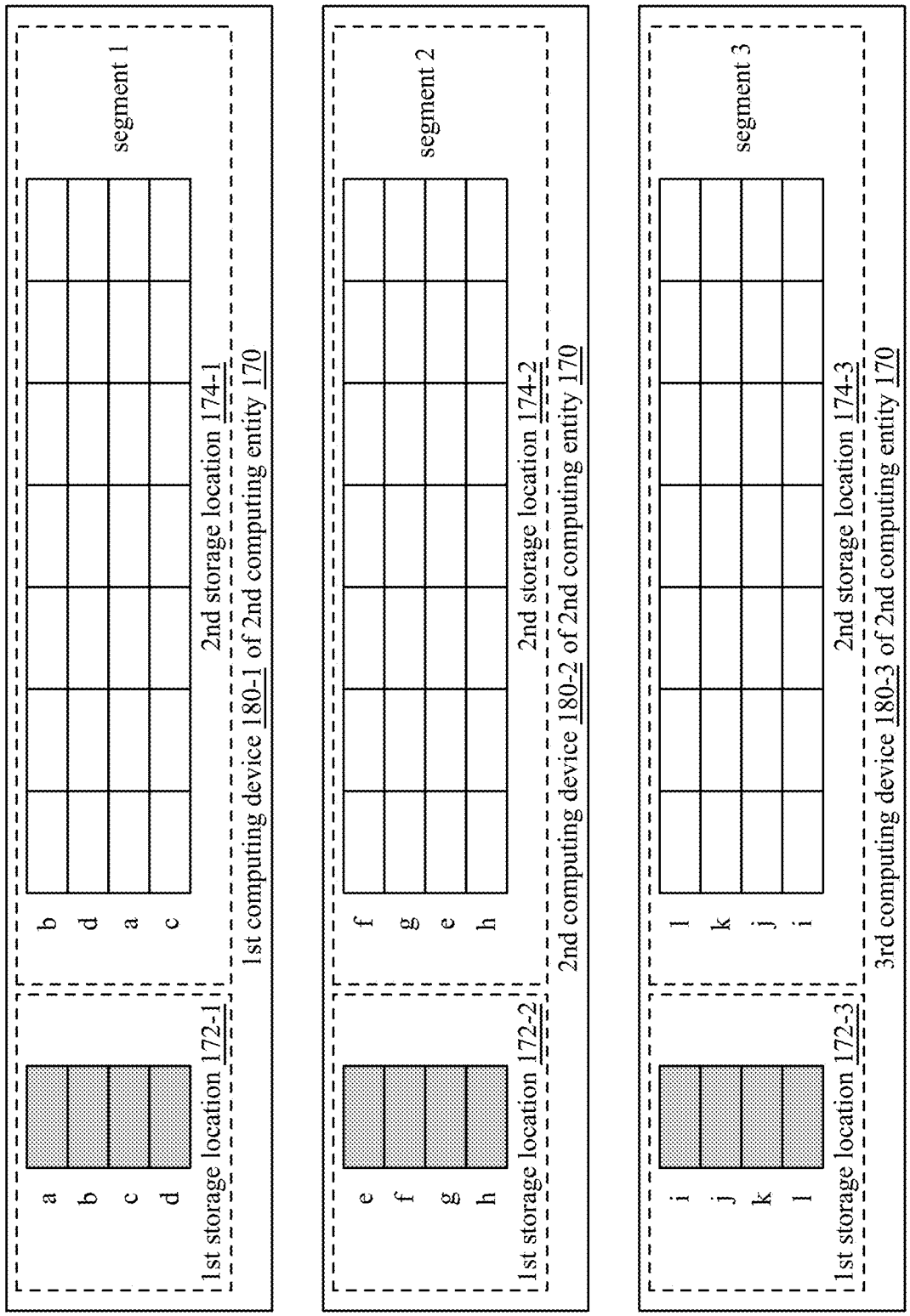
FIG. 37 is a schematic block diagram of an example of storing sorted columns and key columns of segments in accordance with the present invention.

FIG. 37 is a schematic block diagram of an example of the second computing entity storing sorted columns and key columns of segments. In this example, the second computing entity 170 includes three computing devices 180-1 through 180-3. Each of the computing devices 180 includes its own first storage location 172-1 through 172-3 and its own second storage location 174-1 through 174-3. The first computing device 180-1 stores the key column (sorted or unsorted) of segment 1 in its first storage location 172-1 and stores the sorted other columns of segment 1 in its second storage location 174-1.

Similarly, the second computing device 180-2 stores the key column (sorted or unsorted) of segment 2 in its first storage location 172-2 and stores the sorted other columns of segment 2 in its second storage location 174-2. Also, the third computing device 180-3 stores the key column (sorted or unsorted) of segment 3 in its first storage location 172-3 and stores the sorted other columns of segment 3 in its second storage location 174-3.

Figure 38:
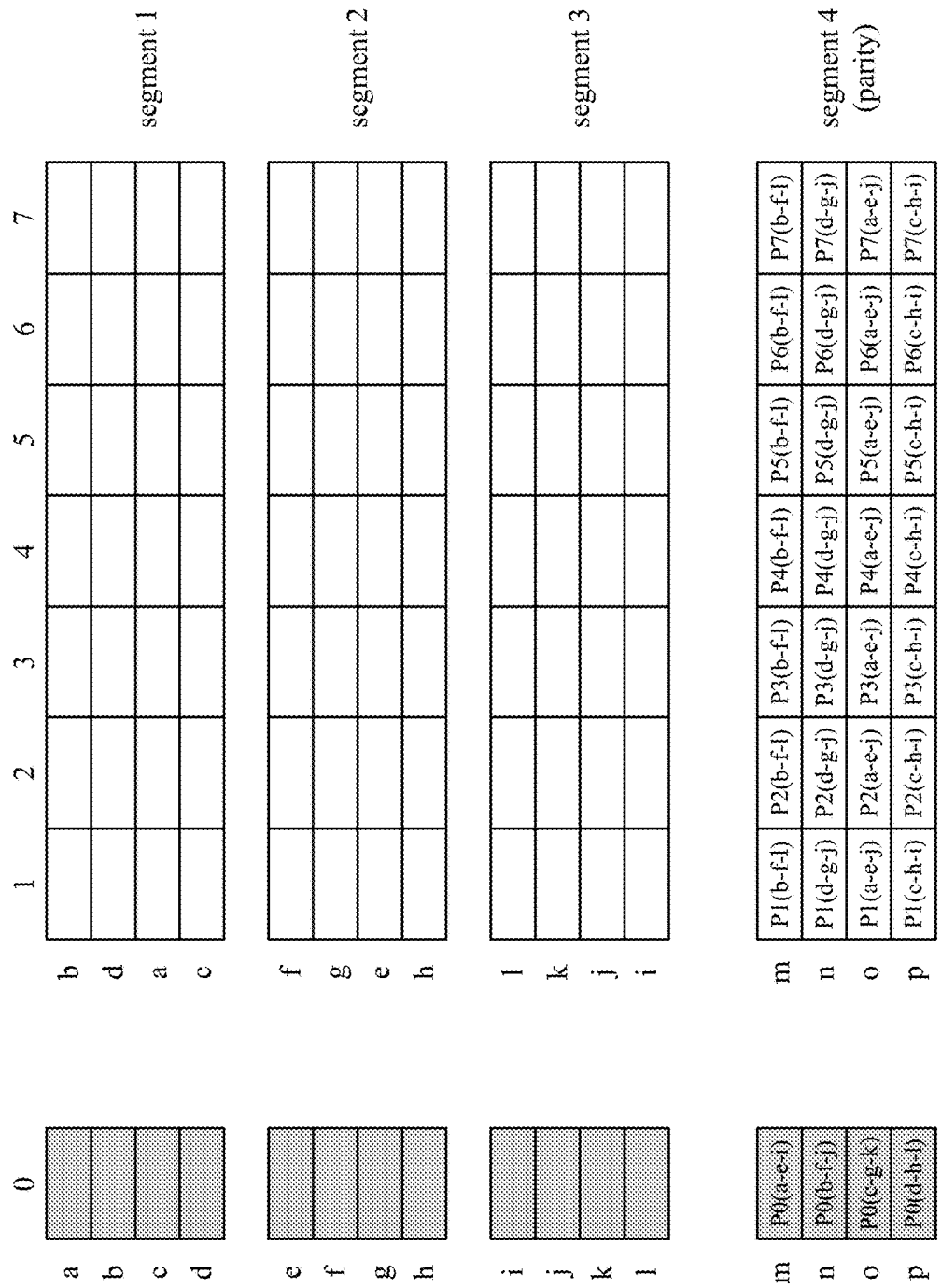
FIG. 38 is a schematic block diagram of an example of creating parity data from sorting columns of segments in accordance with the present invention.

FIG. 38 is a schematic block diagram of an example of the first computing entity creating parity data from sorting columns of segments. In this example, the first computing entity divides the data into a first number of segments (e.g., 3 in this example), where each segment includes its own sub-set of the records of the data. As shown, segment 1 includes rows a-d, which has the key column separate from the sorted other columns; segment 2 includes rows e-h, which has the key column separate from the sorted other columns; and segment 3 includes rows i-l, which has the key column separate from the sorted other columns. Note that there could be more than one key column, the key column may be sorted or unsorted, and the sorting of the other columns is done as previously discussed.

The first computing entity creates a fourth segment for this example that includes parity data. The first row ("m") of the fourth segment includes the parity data created from the first rows of the other segments. For example, field m,0 includes the parity data created from the data in fields (a,0), (e,0) and (i,0). As a specific example, the data of (a,0), (e,0) and (i,0) is exclusively ORed together to produce parity data of P0(*a-e-i*). Parity data for the other rows are created in a similar manner.

Figure 39:
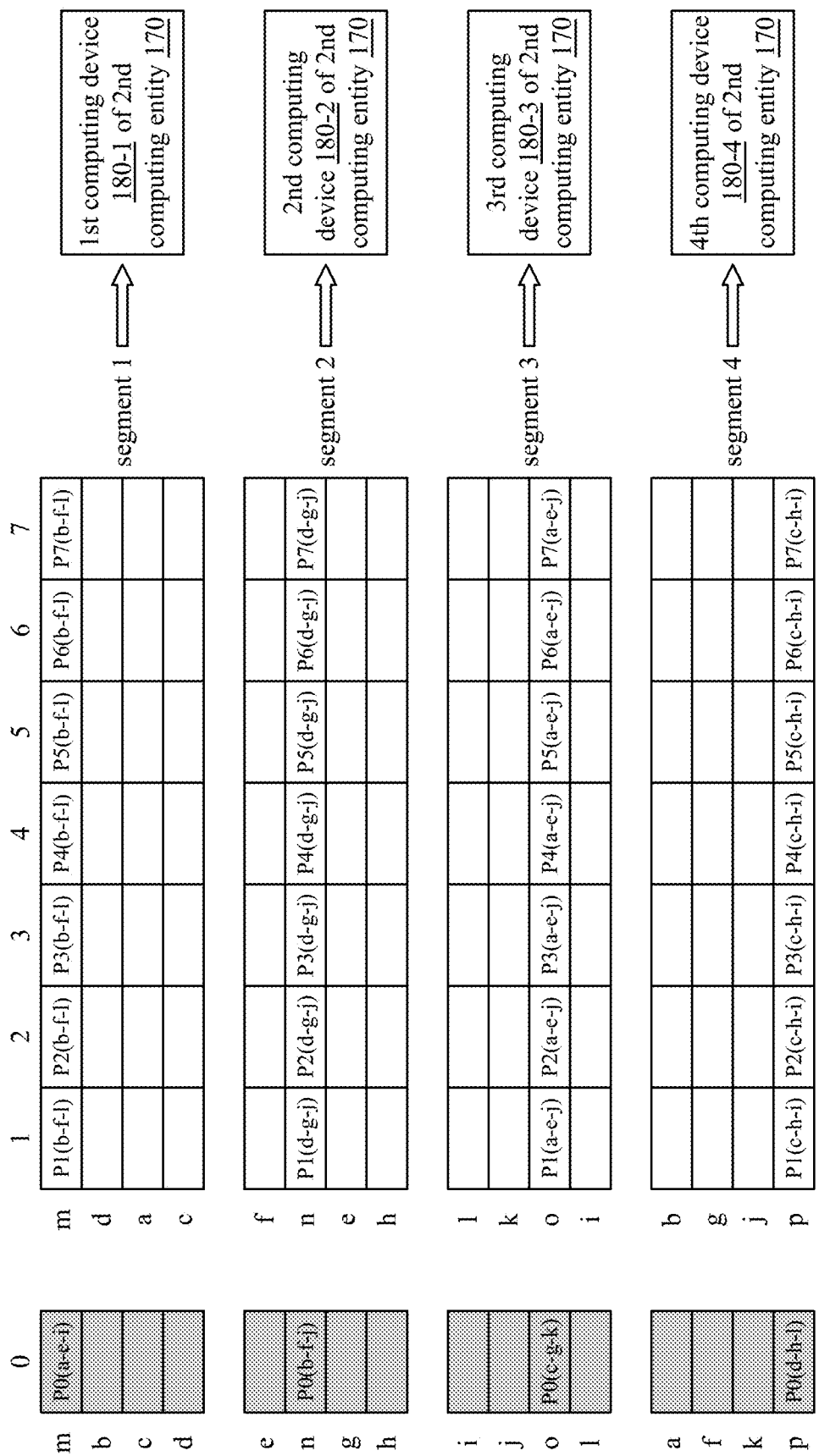
FIG. 39 is a schematic block diagram of an example of reorganizing sorted columns with the parity data and storing the reorganized columns in accordance with the present invention.

FIG. 39 is a schematic block diagram that continues the example of FIG. 38. In this figure, the first computing entity reorganizes the sorted columns and the key column with the parity data to produce four sorted data-parity segments. As a specific example, row "m" of the parity segment of FIG. 38 is moved to the first row of segment 1 and row "b" of segment 1 of FIG. 38 is moved to the first row of segment 4. The first sorted data-parity segment is sent to a first computing device 180-1 of the second computing entity 170 for storage. The first computing device 180-1 stores the key column of data-parity segment 1 in its first storage location 172 and stores the sorted other columns of data-arity segment 1 in its second storage location 174.

As another specific example, row "n" of the parity segment of FIG. 38 is moved to the second row of segment 2 and row "g" of segment 2 of FIG. 38 is moved to the second row of segment 4. The second sorted data-parity segment is sent to a second computing device 180-2 of the second computing entity 170 for storage. The second computing device 180-2 stores the key column of data-parity segment 2 in its first storage location 172 and stores the sorted other columns of data-parity segment 2 in its second storage location 174.

As a further specific example, row "o" of the parity segment of FIG. 38 is moved to the third row of segment 3 and row "j" of segment 3 of FIG. 38 is moved to the third row of segment 4. The third sorted data-parity segment is sent to a third computing device 180-3 of the second computing entity 170 for storage. The third computing device 180-3 stores the key column of data-parity segment 3 in its first storage location 172 and stores the sorted other columns of data-parity segment 3 in its second storage location 174.

In addition, the fourth sorted data-parity segment is sent to a fourth computing device 180-4 of the second computing entity 170 for storage. The fourth computing device 180-4 stores the key column of data-parity segment 4 in its first storage location 172 and stores the sorted other columns of data-parity segment 4 in its second storage location 174.

While FIGS. 38 and 39 show the generation of parity data and reorganization of the data as separates steps, they may be done concurrently as one step. For example, the first computing entity separates the data into four segments. Some of the rows of each segment is filled with sorted data and at least one other row is filled with parity data.

Figure 40:
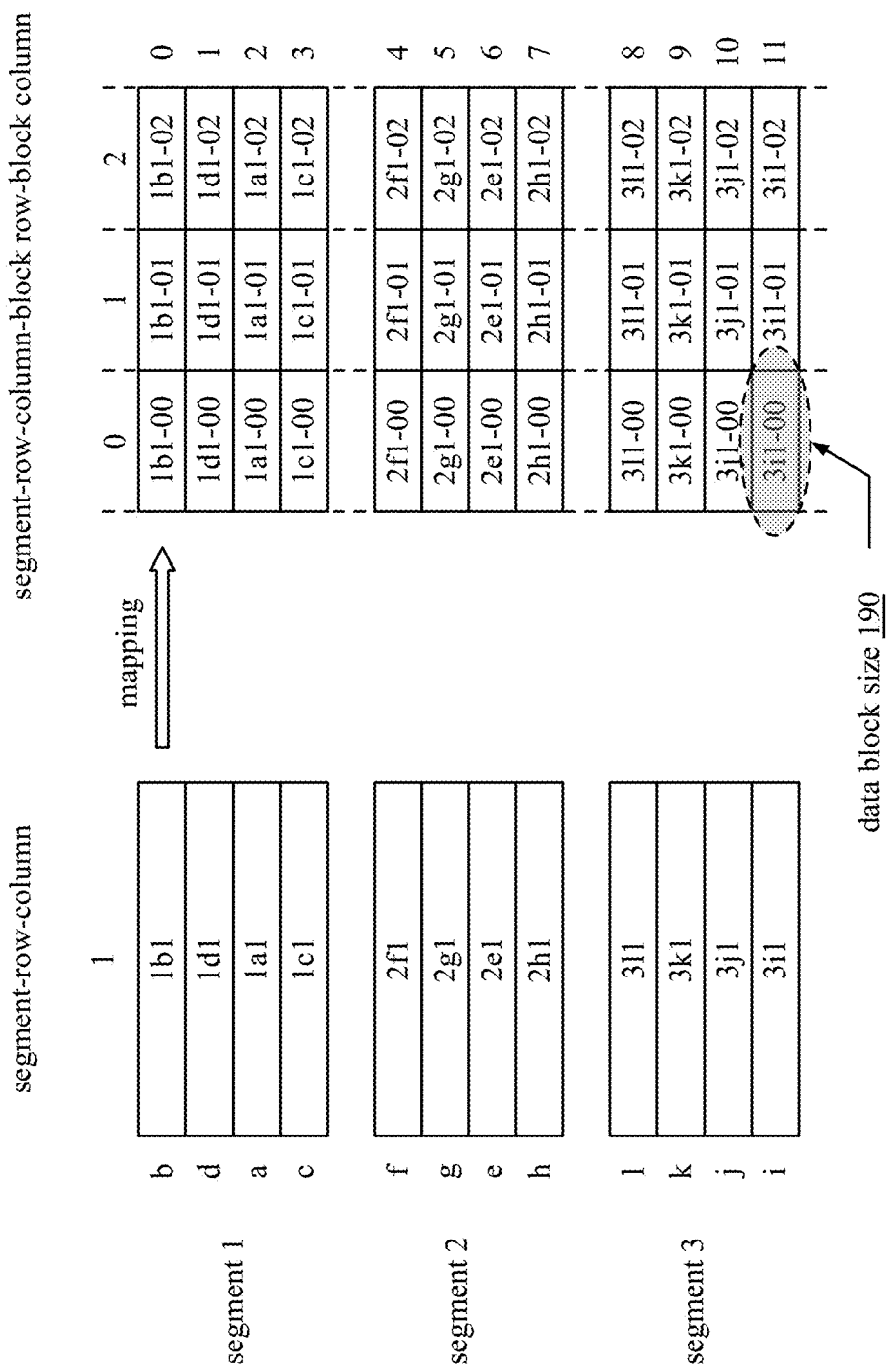
FIG. 40 is a schematic block diagram of an example of mapping a column of data to data blocks in accordance with the present invention.

FIG. 40 is a schematic block diagram of an example of the first computing entity mapping a column of data to data blocks. The data blocks correspond to addressable logical data blocks of the memory of the second computing entity. In an example, the data block 190 is of a fixed size (e.g., 4 KB to 32 KB or more). The data content of each field can be of a varying size; sometimes less than the fixed size of a data block and sometimes more. In addition, the data content size from column to column of data 162 will likely vary as well.

In this example, the size of the data content in the fields of column 1 of the data 162 is greater than the size of a data block. As such, the data content of a field maps to multiple data blocks. As a specific example, data content 1*b*1 of segment 1, row b, and column 1 is mapped to three data blocks (0,0; 0,1; and 0,2), where the first number is the data block row and the second number is the data block column. As such, a first portion 1*b*1-00 is mapped to data block 0,0; a second portion 1*b*1-01 is mapped to a second data block 01; and a third portion 1*b*1-02 is mapped to a third data block 02. Note that the data content of a field may not fully fill each of the mapped blocks. Further note that the data blocks may be organized in a variety of ways. For example, the data blocks are organized in one column with a plurality of rows.

The other columns of the data would be mapped to data blocks in a similar manner. Thus, the segments include data content mapped to data blocks. This facilitates reading, writing, and/or processing of segments.

FIG. 41 is a schematic block diagram of an example of the first computing entity creating parity data from sorting data of a column of multiple segments. This example corresponds to column 1 of the data 162 that has been sorted and mapped to data blocks. Segment 1 column 1 includes the sorted data content for the corresponding fields (e.g., 1*b*1, 1*d*1, 1*a*1, and 1*c*1) mapped to 12 data blocks (0,0; 0,1; 0,2; 1,0; 1,1; 1,2; 2,0; 2,1; 2,2; 3,0; 3,1; and 3,2). Segment 2 column 1 includes the sorted data content for the corresponding fields (e.g., 2*f*1, 2*g*1, 2*e*1, and 2*h*1) mapped to 12 data blocks (4,0; 4,1; 4,2; 5,0; 5,1; 5,2; 6,0; 6,1; 6,2; 7,0; 7,1; and 7,2). Segment 3 column 1 includes the sorted data content for the corresponding fields (e.g., 3l1, 3*k*1, 3*j*1, and 3*i*1) mapped to 12 data blocks (8,0; 8,1; 8,2; 9,0; 9,1; 9,2; 10,0; 10,1; 10,2; 11,0; 11,1; and 11,2).

The first computing entity also creates a fourth segment for parity data that is created from the data content of the data blocks. For example, data content 1*b*1-00, 2*f*1-00, and 3*i*1-00 are exclusive ORed together to produce parity data P00 (b-f-l). As another example, data content 1*b*1-01, 2*f*1-01, and 3*i*1-01 are exclusive ORed together to produce parity data P01 (b-f-l), and so on.

FIG. 42 is a schematic block diagram of an example of the first computing entity reorganizing sorted data blocks and the parity data of FIG. 41. As with the example of FIG. 39, a row of the parity data segment is exchange with a row from each of the other segments. While FIGS. 41 and 42 show the generation of parity data for data blocks and reorganization of the data blocks as separates steps, they may be done concurrently as one step.

Figure 43:
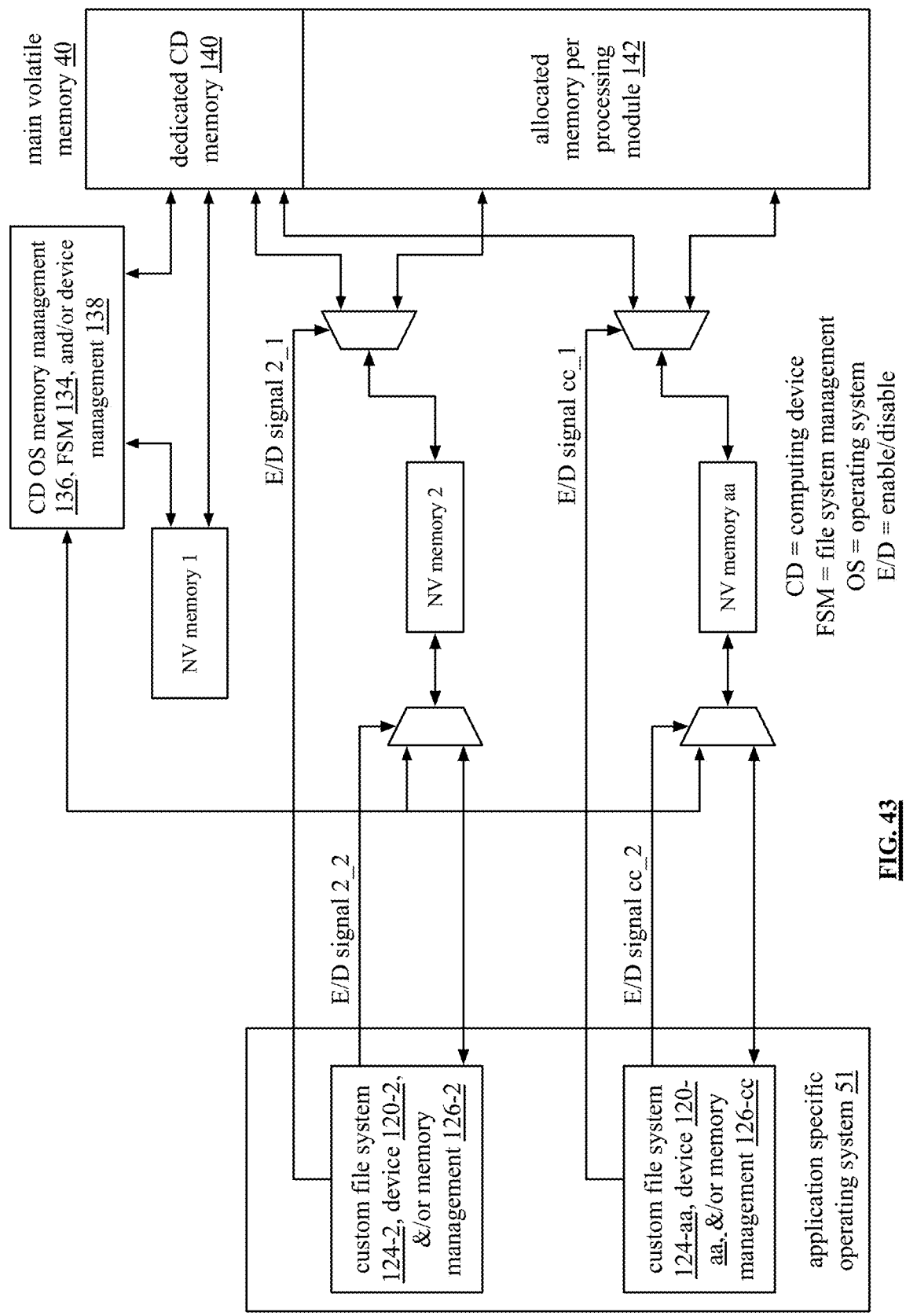
FIG. 43 is a schematic block diagram of an embodiment of a further portion of an application specific operating system functioning on a computing device in accordance with the present invention.

FIG. 43 is a schematic block diagram of an example of a computing device 18 having an application specific operating system 51 and a computing device operating system (CD OS) for its NV memories (1-*aa*) (e.g., e.g., each NV memory includes one or more NV memory devices coupled to a NV memory interface module that includes a driver) and the main volatile memory 40. In this example, the main volatile memory 40 is divided into two sections: a first section 140 that is dedicated for use in conjunction with the computing device operating system and a second section 142 that is dedicated for use in conjunction with the application specific operating system 51.

In this example, NV memory 1 and the dedicated CD memory 140 are operable in accordance with the CS OS file system management operation 134, the CD OS device management operation 138, and CD OS memory management operation 132 of the computing device OS. The remaining NV memories 2-*aa* are selectively operable in accordance with the CS OS or in accordance with the application specific operating system 51.

For instance, NV memory 2 is operable, for file system management, device management, and/or memory management, in accordance with the CS OS or the application specific OS 51. In particular, a custom file system 124-2, a device 120, and/or memory 126-2 management instruction sets for NV memory 2 generate an enable/disable signal to select which file system, device management, and/or memory management to use. For example, when the signal is enabled and via the multiplexer (which is a logical function), NV memory 2 and a portion of memory section 142 operate in accordance with the custom file system 124-2, device 120-2, and/or memory 126-2 management instruction set(s) of the application specific OS 51. When the signal is disabled, NV memory 2 operates in accordance with the CD OS file system 134, device 138, and/or memory 136 management instruction sets.

Each of the remaining NV memories (3-*aa*) have similar selectability as to which file system management instruction set to use, which device management instruction set to use, and/or which memory management instruction set to use. In this embodiment, each NV memory has its own custom file system, device, and/or memory management instruction set(s) 124-2 through 124-*aa*, 120-2 through 120-*aa*, and/or 126-2 through 126-*cc*.

Figure 44:
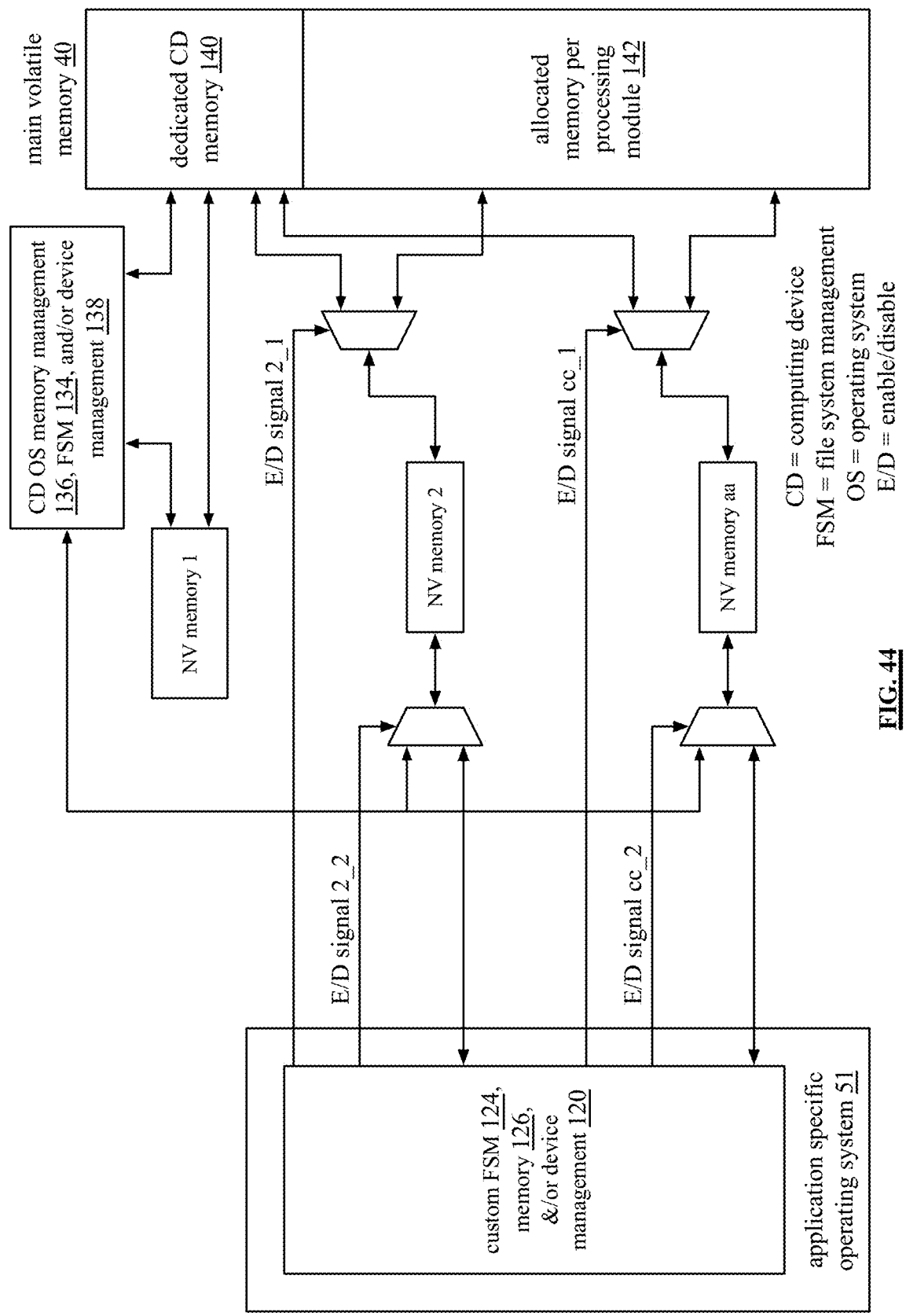
FIG. 44 is a schematic block diagram of another embodiment of a further portion of an application specific operating system functioning on a computing device in accordance with the present invention.

FIG. 44 is a schematic block diagram that is similar to FIG. 43 with the difference being that this figure includes a common custom file system, device, and/or memory management instruction sets 124, 120, and/or 126 of the application specific operating system 51. For example, the file system management instruction set 124 is common for NV memories 2-*aa*; yet, for each NV memory, the particular file system management instruction set to use (e.g., 124 or 134) is individually selectable. As another example, the memory management instruction set 126 is common for NV memories 2-*aa*; yet, for each NV memory, the particular memory management instruction set to use (e.g., 126 or 136) is individually selectable. As a further example, the device management instruction set 120 is common for NV memories 2-*aa*; yet, for each NV memory, the particular device management instruction set to use (e.g., 120 or 130) is individually selectable.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory device includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information. A computing entity includes and/or has access to a computer readable memory device for executing the operational instructions stored thereon.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method comprises:
   receiving, by a first computing entity of a database system, data that is organized in rows and columns, where the rows correspond to data records and the columns correspond to fields of the data records;
   determining, by the first computing entity, one or more key columns from the columns based on a desired sort criteria for the data;

sorting, by the first computing entity, other columns of the columns based on the one or more key columns to produce sorted other columns, wherein the other columns include the columns less the one or more key columns;

sending, by the first computing entity, the one or more key columns to a second computing entity of the database system for storage in a first storage location associated with the second computing entity; and sending, by the first computing entity, the sorted other columns to the second computing entity for storage in a second storage location associated with the second computing entity.

2. The method of claim 1 further comprises:

determining, by the first computing entity, the desired sorting criteria by receiving the desired sorting criteria, wherein the desired sorting criteria identifies the one or more key columns.

3. The method of claim 1 further comprises:

interpreting, by the first computing entity, a type of data records to identify the one or more key columns, wherein the desired sorting criteria includes interpretation rules for different types of records.

4. The method of claim 1 further comprises:

dividing, by the first computing entity, the data into a number of segments, wherein a first segment of the number of segments includes a first sub-set of the data records;

sorting, by the first computing entity, the number of segments in accordance with the one or more key columns to produce the number of sorted segments, wherein the number of sorted segments corresponds to the sorted other columns; and sending, by the first computing entity, the number of sorted segments to a number of second storage locations, wherein the number for the sorted segments is substantially equal to the number for the second storage locations and wherein the second storage location includes the number of second storage locations.

5. The method of claim 1 further comprises:

dividing, by the first computing entity, the data into a first number of segments, wherein a first segment of the number of segments includes a first sub-set of the data records;

sorting, by the first computing entity, the first number of segments in accordance with the one or more key columns to produce the first number of sorted segments, wherein the first number of sets of sorted segments corresponds to the sorted other columns;

generating, by the first computing entity, one or more sets of parity data from the first number of sorted segments;

generating, by the first computing entity, a second number of sorted data-parity segments based on the first number of sorted segments and the one or more sets of parity data, wherein the second number is greater than the first number; and sending, by the first computing entity, the second number of sorted data-parity segments to a second number of second storage locations, wherein the second number for the sorted data-parity segments equals the second number for the second storage locations and wherein the second storage location includes the second number of second storage locations.

6. The method of claim 1 further comprises:

dividing, by the first computing entity, the data into a plurality of data partitions, wherein a first data partition of the plurality of data partitions includes a first sub-set of the data records;

dividing, by the first computing entity, the first data partition into a number of segments, wherein a first segment of the number of segments includes a first micro-set of the first sub-set of the data records;

sorting, by the first computing entity, the number of segments in accordance with the one or more key columns to produce the number of sorted segments, wherein the number of sets of sorted segments corresponds to a first sub-set of the sorted other columns; and sending, by the first computing entity, the number of sorted segments to a number of second storage locations, wherein the number for the sorted segments is substantially equal to the number for the second storage locations and wherein the second storage location includes the number of second storage locations.

7. The method of claim 1 further comprises:

dividing, by the first computing entity, the data into a plurality of data partitions, wherein a first data partition of the plurality of data partitions includes a first sub-set of the data records;

dividing, by the first computing entity, the first data partition into a first number of segments, wherein a first segment of the first number of segments includes a first micro-set of the first sub-set of the data records;

sorting, by the first computing entity, the first number of segments in accordance with the one or more key columns to produce the first number of sorted segments, wherein the first number of sets of sorted segments corresponds to a first sub-set of the sorted other columns;

generating, by the first computing entity, one or more sets of parity data from the first number of sorted segments;

generating, by the first computing entity, a second number of sorted data-parity segments based on the first number of sorted segments and the one or more sets of parity data, wherein the second number is greater than the first number; and sending, by the first computing entity, the second number of sorted data-parity segments to a second number of second storage locations, wherein the second number for the sorted data-parity segments equals the second number for the second storage locations and wherein the second storage location includes the second number of second storage locations.

8. The method of claim 1 further comprises:

mapping, by the first computing entity, the other sorted columns to coding blocks of the second section, wherein a coding block of the coding blocks is of a fixed size and wherein a sorted column of the other sorted columns is of a variable size.

9. The method of claim 1 further comprises:

sorting, by the first computing entity, the one or more key columns based on the one or more key columns to produce one or more sorted key columns; and sending, by the first computing entity, the one or more sorted key columns as the one or more key columns to the second computing entity for storage in the first storage location.

10. The method of claim 1 further comprises:
the first storage location corresponding to an index section of a segment data structure; and
the second storage location corresponding to a data & parity section of the segment data structure.

11. The method of claim 1 further comprises:
the first computing entity including one or more of: one or more first computing devices of an input sub-system of the database system, one or more first nodes of the one or more first computing devices, and one or more first processing core resources of the one or more first nodes; and
the second computing entity including one or more of: one or more second computing devices of a data store, retrieve, and process sub-system of the database system, one or more second nodes of the one or more second computing devices, and one or more second processing core resources of the one or more second nodes.

12. A computer readable memory device comprises:
a first memory section that stores operational instructions that, when executed by a first computing entity of a database system, causes the first computing entity to:
receive data that is organized in rows and columns, where the rows correspond to data records and the columns correspond to fields of the data records;
a second memory section that stores operational instructions that, when executed by the first computing entity, causes the first computing entity to:
determine one or more key columns from the columns based on a desired sort criteria for the data;
a third memory section that stores operational instructions that, when executed by the first computing entity, causes the first computing entity to:
sort other columns of the columns based on the one or more key columns to produce sorted other columns, wherein the other columns include the columns less the one or more key columns;
a fourth memory section that stores operational instructions that, when executed by the first computing entity, causes the first computing entity to:
send the one or more key columns to a second computing entity of the database system for storage in a first storage location associated with the second computing entity; and
send the sorted other columns to the second computing entity for storage in a second storage location associated with the second computing entity.

13. The computer readable memory device of claim 12, wherein the first memory section further stores operational instructions that, when executed by the first computing entity, causes the first computing entity to:
determine the desired sorting criteria by receiving the desired sorting criteria, wherein the desired sorting criteria identifies the one or more key columns.

14. The computer readable memory device of claim 12, wherein the first memory section further stores operational instructions that, when executed by the first computing entity, causes the first computing entity to:
interpret a type of data records to identify the one or more key columns, wherein the desired sorting criteria includes interpretation rules for different types of records.

15. The computer readable memory device of claim 12 further comprises:
the first memory section further stores operational instructions that, when executed by the first computing entity, causes the first computing entity to:
divide the data into a number of segments, wherein a first segment of the number of segments includes a first sub-set of the data records;
the third memory section further stores operational instructions that, when executed by the first computing entity, causes the first computing entity to:
sort the number of segments in accordance with the one or more key columns to produce the number of sorted segments, wherein the number of sorted segments corresponds to the sorted other columns; and
the fourth memory section further stores operational instructions that, when executed by the first computing entity, causes the first computing entity to:
send the number of sorted segments to a number of second storage locations, wherein the number for the sorted segments is substantially equal to the number for the second storage locations and wherein the second storage location includes the number of second storage locations.

16. The computer readable memory device of claim 12 further comprises:
the first memory section further stores operational instructions that, when executed by the first computing entity, causes the first computing entity to:
divide the data into a first number of segments, wherein a first segment of the number of segments includes a first sub-set of the data records;
the third memory section further stores operational instructions that, when executed by the first computing entity, causes the first computing entity to:
sort the first number of segments in accordance with the one or more key columns to produce the first number of sorted segments, wherein the first number of sets of sorted segments corresponds to the sorted other columns;
generate one or more sets of parity data from the first number of sorted segments;
generate a second number of sorted data-parity segments based on the first number of sorted segments and the one or more sets of parity data, wherein the second number is greater than the first number; and
the fourth memory section further stores operational instructions that, when executed by the first computing entity, causes the first computing entity to:
send the second number of sorted data-parity segments to a second number of second storage locations, wherein the second number for the sorted data-parity segments equals the second number for the second storage locations and wherein the second storage location includes the second number of second storage locations.

17. The computer readable memory device of claim 12 further comprises:
the first memory section further stores operational instructions that, when executed by the first computing entity, causes the first computing entity to:
divide the data into a plurality of data partitions, wherein a first data partition of the plurality of data partitions includes a first sub-set of the data records;

divide the first data partition into a number of segments, wherein a first segment of the number of segments includes a first micro-set of the first sub-set of the data records;

the third memory section further stores operational instructions that, when executed by the first computing entity, causes the first computing entity to:

sort the number of segments in accordance with the one or more key columns to produce the number of sorted segments, wherein the number of sets of sorted segments corresponds to a first sub-set of the sorted other columns; and the fourth memory section further stores operational instructions that, when executed by the first computing entity, causes the first computing entity to:

send the number of sorted segments to a number of second storage locations, wherein the number for the sorted segments is substantially equal to the number for the second storage locations and wherein the second storage location includes the number of second storage locations.

18. The computer readable memory device of claim 12 further comprises:

the first memory section further stores operational instructions that, when executed by the first computing entity, causes the first computing entity to:

divide the data into a plurality of data partitions, wherein a first data partition of the plurality of data partitions includes a first sub-set of the data records;

divide the first data partition into a first number of segments, wherein a first segment of the first number of segments includes a first micro-set of the first sub-set of the data records;

the third memory section further stores operational instructions that, when executed by the first computing entity, causes the first computing entity to:

sort the first number of segments in accordance with the one or more key columns to produce the first number of sorted segments, wherein the first number of sets of sorted segments corresponds to a first sub-set of the sorted other columns;

generate one or more sets of parity data from the first number of sorted segments;

generate a second number of sorted data-parity segments based on the first number of sorted segments and the one or more sets of parity data, wherein the second number is greater than the first number; and the fourth memory section further stores operational instructions that, when executed by the first computing entity, causes the first computing entity to:

send the second number of sorted data-parity segments to a second number of second storage locations, wherein the second number for the sorted data-parity segments equals the second number for the second storage locations and wherein the second storage location includes the second number of second storage locations.

19. The computer readable memory device of claim 12, wherein the fourth memory section further stores operational instructions that, when executed by the first computing entity, causes the first computing entity to:

map the other sorted columns to coding blocks of the second section, wherein a coding block of the coding blocks is of a fixed size and wherein a sorted column of the other sorted columns is of a variable size.

20. The computer readable memory device of claim 12 further comprises:

the third memory section further stores operational instructions that, when executed by the first computing entity, causes the first computing entity to:

sort the one or more key columns based on the one or more key columns to produce one or more sorted key columns; and the fourth memory section further stores operational instructions that, when executed by the first computing entity, causes the first computing entity to:

send the one or more sorted key columns as the one or more key columns to the second computing entity for storage in the first storage location.

21. The computer readable memory device of claim 12 further comprises:

the first storage location corresponding to an index section of a segment data structure; and the second storage location corresponding to a data & parity section of the segment data structure.

22. The computer readable memory device of claim 12 further comprises:

the first computing entity including one or more of: one or more first computing devices of an input sub-system of the database system, one or more first nodes of the one or more first computing devices, and one or more first processing core resources of the one or more first nodes; and the second computing entity including one or more of: one or more second computing devices of a data store, retrieve, and process sub-system of the database system, one or more second nodes of the one or more second computing devices, and one or more second processing core resources of the one or more second nodes.

* * * * *